(12) United States Patent
Sakai et al.

(10) Patent No.: US 9,847,300 B2
(45) Date of Patent: Dec. 19, 2017

(54) METHOD OF MANUFACTURING SEMICONDUCTOR DEVICE

(71) Applicant: Renesas Electronics Corporation, Koutou-ku, Tokyo (JP)

(72) Inventors: Nobutaka Sakai, Kameda-gun (JP); Mamoru Otake, Kameda-gun (JP); Koji Saito, Kameda-gun (JP); Tomishi Takahashi, Kameda-gun (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 15/144,917

(22) Filed: May 3, 2016

(65) Prior Publication Data

US 2016/0254228 A1    Sep. 1, 2016

Related U.S. Application Data

(62) Division of application No. 13/939,938, filed on Jul. 11, 2013, now Pat. No. 9,362,183.

(30) Foreign Application Priority Data

Jul. 13, 2012    (JP) .................. 2012-157598

(51) Int. Cl.
*H01L 21/66*    (2006.01)
*H01L 23/544*    (2006.01)
(Continued)

(52) U.S. Cl.
CPC ........ *H01L 23/544* (2013.01); *H01L 21/4825* (2013.01); *H01L 21/561* (2013.01);
(Continued)

(58) Field of Classification Search
CPC ... H01L 22/10; H01L 21/4825; H01L 21/561; H01L 21/78; H01L 24/97; H01L 21/6836; H01L 22/20; H01L 23/544
See application file for complete search history.

(56) References Cited

U.S. PATENT DOCUMENTS 4,683,644 A    8/1987  Tange et al.
4,930,086 A    5/1990  Fukasawa
(Continued)

FOREIGN PATENT DOCUMENTS

JP    04-102364 A    4/1992
JP    2005-129553 A    5/2005
JP    2011-066340 A    3/2011

*Primary Examiner* — Syed Gheyas
(74) *Attorney, Agent, or Firm* — Foley & Lardner LLP

(57) ABSTRACT

Product management and/or prompt defect analysis of a semiconductor device may be carried out without reducing the throughput in assembly and testing. Unique identification information is attached to a plurality of substrates (lead frames) used in manufacturing a semiconductor device (QFP) and to a transport unit for transporting a plurality of substrates, respectively. Identification information (rack ID) of the transport unit and identification information (substrate ID) of the substrate stored into the transport unit are associated with each other. The substrate is taken out from the transport unit set to a loader unit of each manufacturing apparatus and supplied to a processing unit, of the apparatus and in storing the substrate, the processing of which is complete, into a transport unit of an unloader unit of the apparatus, an association between identification information of the transport unit and the identification information of the substrate is checked.

5 Claims, 57 Drawing Sheets

(51) Int. Cl.
*H01L 21/683* (2006.01)
*H01L 23/00* (2006.01)
*H01L 21/48* (2006.01)
*H01L 21/56* (2006.01)
*H01L 21/78* (2006.01)

(52) U.S. Cl.
CPC .......... *H01L 21/6836* (2013.01); *H01L 21/78* (2013.01); *H01L 22/10* (2013.01); *H01L 22/20* (2013.01); *H01L 24/97* (2013.01); *H01L 2221/68327* (2013.01); *H01L 2223/54406* (2013.01); *H01L 2223/54413* (2013.01); *H01L 2223/54426* (2013.01); *H01L 2223/54433* (2013.01); *H01L 2223/54486* (2013.01); *H01L 2223/54493* (2013.01); *H01L 2224/05554* (2013.01); *H01L 2224/32245* (2013.01); *H01L 2224/45144* (2013.01); *H01L 2224/48091* (2013.01); *H01L 2224/48247* (2013.01); *H01L 2224/49171* (2013.01); *H01L 2224/83192* (2013.01); *H01L 2224/859* (2013.01); *H01L 2224/92247* (2013.01); *H01L 2924/12042* (2013.01); *H01L 2924/181* (2013.01)

(56) References Cited

U.S. PATENT DOCUMENTS

| | | | | |
|---|---|---|---|---|
| 5,448,488 | A * | 9/1995 | Oshima | G05B 19/41865 438/800 |
| 6,049,624 | A * | 4/2000 | Wilson | G05B 19/4183 257/E23.179 |
| 6,208,947 | B1 * | 3/2001 | Beffa | G01R 31/2894 438/14 |
| 6,427,092 | B1 * | 7/2002 | Jones | G01R 31/31718 209/573 |
| 6,792,365 | B2 * | 9/2004 | Raitter | H01L 21/67294 257/E23.179 |
| 7,155,300 | B2 * | 12/2006 | Akram | G06F 11/006 438/14 |
| 7,698,015 | B1 * | 4/2010 | Chang | H01L 21/67276 438/106 |
| 7,840,803 | B2 * | 11/2010 | Clarke | G06F 21/31 257/E23.179 |
| 2011/0071662 | A1 | 3/2011 | Yokosawa | |
| 2011/0172941 | A1 * | 7/2011 | Sakaguchi | H01L 22/20 702/83 |

* cited by examiner

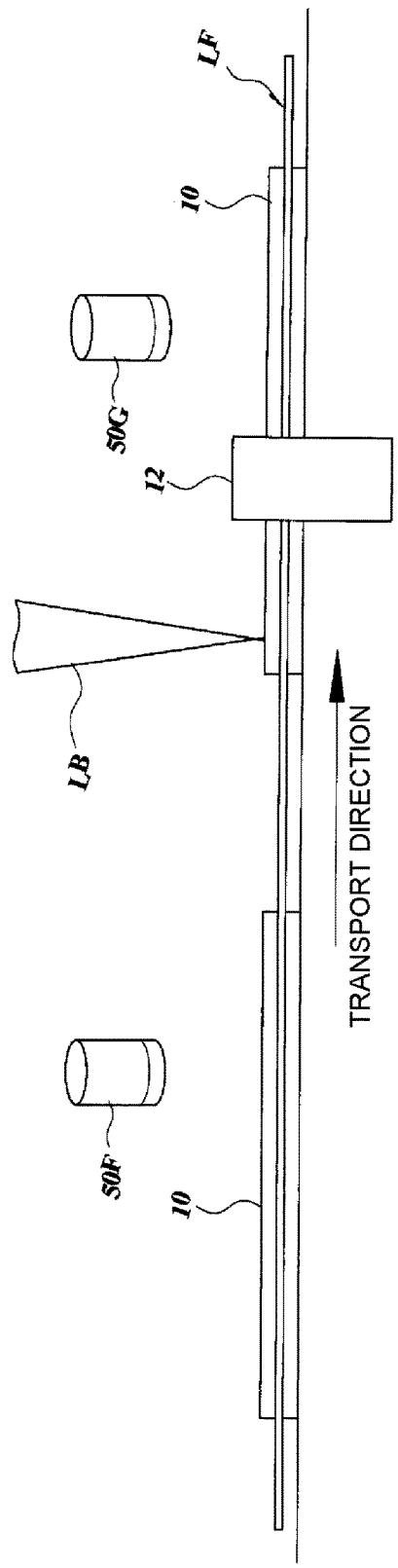
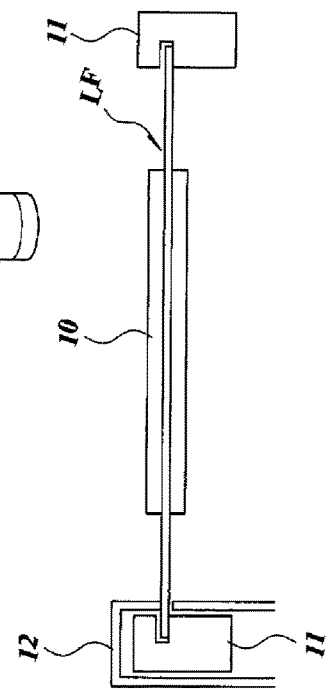

FIG. 30A

PRODUCTION LOT ALLOCATION TABLE
· ALLOCATION RELATIONSHIP BETWEEN PRODUCT AND PRODUCTION LOT

| PRODUCT NAME | PRODUCTION LOT |
|---|---|
| RE0001 | KAKUSAN001 |
| RE0001 | KAKUSAN002 |
| RE0001 | KAKUSAN003 |
| RE0010 | KAKUSAN004 |
| RE0010 | KAKUSAN005 |
| ····· | ····· |

FIG. 30B

SUBSTRATE ID (LEAD FRAME) MANAGEMENT TABLE
· CORRESPONDENCE TABLE OF SUBSTRATES AVAILABLE FOR PRODUCT

| PRODUCTION LOT | SUBSTRATE ID |
|---|---|
| KAKUSAN001 | K0001 |
| KAKUSAN001 | K0002 |
| KAKUSAN001 | K0003 |
| KAKUSAN001 | K0004 |
| KAKUSAN001 | K0005 |
| ····· | ····· |
| ····· | ····· |
| KAKUSAN001 | K0099 |
| KAKUSAN001 | K0100 |
| ····· | ····· |

FIG. 31A

CHIP ID MAP TABLE:
RELATIONSHIP BETWEEN CHIP ID AND WAFER MAP

| CHIP ID | PRODUCTION LOT | WAFER NUMBER | POSITION X | POSITION Y | QUALITY |
|---|---|---|---|---|---|
| K001X01Y01 | KASUSAN001 | 001 | 1 | 1 | A |
| K001X01Y02 | KASUSAN001 | 001 | 1 | 2 | B |
| K001X01Y03 | KASUSAN001 | 001 | 1 | 3 | X |
| K001X02Y01 | KASUSAN001 | 001 | 2 | 1 | X |
| K001X02Y02 | KASUSAN001 | 001 | 2 | 2 | A |
| K001X02Y03 | KASUSAN001 | 001 | 2 | 3 | A |
| K001X02Y04 | KASUSAN001 | 001 | 2 | 4 | A |
| K001X02Y05 | KASUSAN001 | 001 | 2 | 5 | X |
| K001X03Y01 | KASUSAN001 | 001 | 3 | 1 | B |
| ..... | ..... | ..... | ..... | ..... | ..... |
| ..... | ..... | 002 | ..... | ..... | ..... |

FIG. 31B

PROCESSING STEP MANAGEMENT TABLE
· TABLE OF PRODUCT NAME AND PROCESSING CONTENTS
  (PRODUCTION DEVICE, WORKING CONDITION)

| PRODUCTION LOT | PRODUCTION STEP | PROCESSING CONTENTS | PRODUCTION DEVICE | WORKING CONDITION (RECIPE) |
|---|---|---|---|---|
| KAKUSAN001 | S0001 | SUBSTRATE ID MARKING | ST001008 | Re001810 |
| KAKUSAN001 | S0002 | DIE BONDING | ST002004 | Re002027 |
| KAKUSAN001 | S0003 | WIRE BONDING | ST003005 | Re003031 |
| KAKUSAN001 | S0004 | RESIN SEALING | ST004001 | Re004044 |
| KAKUSAN001 | S0005 | TIE BAR-CUTTING | ST005006 | Re005059 |
| KAKUSAN001 | S0006 | ID MARKING, LASER MARKING | ST006003 | Re006068 |
| KAKUSAN001 | S0007 | SOLDER PLATING | ST007002 | Re007074 |
| KAKUSAN001 | S0008 | LEAD FRAME CUTTING / FORMING | ST008001 | Re008083 |
| KAKUSAN001 | S0009 | TEST | ST009003 | Re009293 |
| KAKUSAN001 | S0010 | VISUAL INSPECTION | ST010007 | Re011105 |
| ..... | ..... | ..... | ..... | ..... |

FIG. 32

WORKING HISTORY DB
· WORKING HISTORY FOR EACH CHIP ID

| CHIP ID | SUBSTRATE ID | MATERIAL ID | WORKING STATION | WORKING RECIPE | LOCATION | WORKING HOUR | WORK RESULT | |
|---|---|---|---|---|---|---|---|---|
| ** | K0001 | ** | ST001008 | Re001810 | | ..... | ○ | ⎫ A<br>⎬ SUBSTRATE<br>⎭ ID MARKING |
| ** | K0002 | ** | ST001008 | Re001810 | | ..... | ○ | |
| ** | K0001 | ** | ST001008 | Re001810 | | ..... | ○ | |
| ** | K0002 | ** | ST001008 | Re001810 | | ..... | ○ | |
| ** | K0002 | ** | ST001008 | Re001810 | | ..... | ○ | |
| ..... | ..... | ..... | ..... | ..... | ..... | ..... | ..... | |
| K001X01Y01 | K0001 | ZI00132 | ST002004 | Re002027 | 1 | ..... | ○ | ⎫ B<br>⎬ DIE BONDING<br>⎭ |
| K001X01Y02 | K0001 | ZI00132 | ST002004 | Re002027 | 2 | ..... | ○ | |
| K001X02Y02 | K0002 | ZI00132 | ST002004 | Re002027 | 1 | ..... | ○ | |
| ..... | ..... | ..... | ..... | ..... | ..... | ..... | ..... | |
| K001X01Y01 | K0001 | ZI01823 | ST003005 | Re003031 | 1 | ..... | ..... | ⎫ C<br>⎬ WIRE<br>⎭ BONDING |
| K001X01Y02 | K0001 | ZI01823 | ST003005 | Re003031 | 2 | ..... | ..... | |
| ..... | ..... | ..... | ..... | ..... | ..... | ..... | ..... | |
| K001X01Y01 | K0001 | ZI05052 | ST004001 | Re004044 | 1 | ..... | ..... | |
| K001X01Y02 | K0001 | ZI05052 | ST004001 | Re004044 | 2 | ..... | ..... | |
| K001X02Y02 | K0002 | ZI05052 | ST004001 | Re004044 | 1 | ..... | ..... | |
| ..... | ..... | ..... | ..... | ..... | ..... | ..... | ..... | |

FIG. 33

RACK MANAGEMENT TABLE
· WORKING STATE OF SUBSTRATE STORED IN RACK

| RACK ID | SUBSTRATE ID | PROCESSING (IN-PROCESS) STEP | NEXT RACK ID | |
|---|---|---|---|---|
| R0001 | EMPTY | S0002 | | |
| R0001 | EMPTY | S0002 | | A |
| R0001 | EMPTY | S0002 | | |

↓

| R0001 | K0001 | S0002 | | |
|---|---|---|---|---|
| R0001 | K0002 | S0002 | | B |
| R0001 | K0003 | S0002 | | |

↓

| R0001 | K0001 | S0002 | | |
|---|---|---|---|---|
| R0001 | K0002 | S0002 | | |
| R0001 | K0003 | S0002 | | |
| R0003 | EMPTY | S0002 | | C |
| R0003 | EMPTY | S0002 | | |
| R0003 | EMPTY | S0002 | | |

↓

| R0001 | K0001 | S0003 | R0002 | |
|---|---|---|---|---|
| R0001 | K0002 | S0003 | R0002 | |
| R0001 | K0003 | S0003 | R0002 | |
| R0002 | EMPTY | S0003 | | D |
| R0002 | EMPTY | S0003 | | |
| R0002 | EMPTY | S0003 | | |

↓

| R0001 | EMPTY | | | |
|---|---|---|---|---|
| R0001 | EMPTY | | | |
| R0001 | EMPTY | | | |
| R0002 | K0001 | S0003 | | |
| R0002 | K0002 | S0003 | | |
| R0002 | K0003 | S0003 | | |
| R0003 | K0004 | S0003 | R0004 | E |
| R0003 | K0005 | S0003 | R0004 | |
| R0003 | K0006 | S0003 | R0004 | |
| R0004 | EMPTY | S0003 | | |
| R0004 | EMPTY | S0003 | | |
| R0004 | EMPTY | S0003 | | |

METHOD OF MANUFACTURING SEMICONDUCTOR DEVICE

CROSS-REFERENCE TO RELATED APPLICATION

This application is a divisional of U.S. application Ser. No. 13/939,938, filed on Jul. 11, 2013, which claims benefit of priority from the prior Japanese Application No. 2012-157598 filed on Jul. 13, 2012; the entire contents of all of which are incorporated herein by reference.

BACKGROUND

The present invention relates to methods of manufacturing a semiconductor device, and in particular relates to a semiconductor manufacturing technology capable of promptly determining the cause of a defect occurred in the manufacturing process of a semiconductor device.

Semiconductor manufacturers display product information, such as a product type name, a customer logo mark, and a production code, on the surface of a semiconductor device (semiconductor package) so as to carry out the product management and/or defect analysis of the semiconductor device.

Japanese Patent Laid-Open No. 2011-66340 discloses a technique for storing a manufacturing condition in each manufacturing process of a semiconductor package and identification number of the semiconductor device in association with each other into a main server of a production line, and also marking a two-dimensional code (two-dimensional barcode) corresponding to the above-described identification number on the surface of the semiconductor package. According to this technique, for example, when a defect occurred in a semiconductor package, it becomes possible to perform defect analysis of the semiconductor package by reading the two-dimensional code marked on the semiconductor package to identify the identification number and tracing the manufacturing condition of the semiconductor package stored in the main server.

SUMMARY

Here, the manufacturing process of a semiconductor device is roughly divided into a wafer process and an assembly and testing process (assembly process or packaging process) that is carried out after the wafer process.

In detail, the wafer process is the process for forming an integrated circuit on the major surface (integrated circuit forming surface) of a semiconductor wafer formed by single crystal silicon and the like by a combination of a photolithography technology, a CVD technique, a sputtering technique, an etching technique, and the like.

On the other hand, the assembly and testing process includes: a process (die-bonding process) of mounting a semiconductor chip obtained from the semiconductor wafer, the wafer process of which is complete, on a substrate (a lead frame, a wiring substrate, or the like); a process (bonding process) of electrically coupling the semiconductor chip mounted on the substrate to an external terminal of the substrate via a conductive component (a wire, a protruding electrode, or the like); a process of sealing the semiconductor chip with a sealing body (resin, ceramic, or the like); and the like.

The present inventors have been studying transporting a plurality of substrates between the respective processes in the assembly and testing process with the substrates being stored in a transporting unit (an assembly rack, an assembly lot, a stacker, or the like). In order to do this, when a defect is found in a finished semiconductor device, i.e., when defect analysis is carried out, defect analysis (cause investigation), including the analysis on the information related to the transport unit in use, needs to be able to be carried out.

The other purposes and the new feature of the present invention will become clear from the description of the present specification and the accompanying drawings.

The following explains briefly the outline of a typical invention among the inventions disclosed in the present application.

A method of manufacturing a semiconductor device in an embodiment of the present application includes the steps of:

(a) providing a first rack in which a plurality of first substrates are stored, the first rack having first rack identification information, the first rack substrates each having individual first substrate identification information to differentiate them from each other and associated with the first rack identification information;

(b) setting the first rack in a loader unit of a first assembly and testing process apparatus, reading rack identification information of the first rack, and thereby obtaining first substrate identification information of each of the first substrates stored in the first rack;

(c) reading rack identification information of a second rack set to an unloader unit of the first assembly and testing process apparatus, and registering the second rack with a higher-level system as a rack for storing the first substrates;

(d) after step (c), taking out a first first-substrate in the first rack and supplying the same to a processing unit of the first assembly and testing process apparatus; and (e) after step (d), performing first processing on the first first-substrate, wherein while carrying out step (e), reading first substrate identification information of a second first-substrate taken out from the first rack, and checking the same against first substrate identification information of the second first-substrate that has been registered in advance with the higher-level system;

(f) after step (e), taking out the first first-substrate from the processing unit and supplying the same to the second rack set in the unloader unit of the first assembly and testing process apparatus, wherein substrate identification information of the first first-substrate taken out from the processing unit is read and information regarding the first first-substrate is thereby obtained, and storing the first first-substrate into the second rack if the first first-substrate is the first among the first rack substrates; and (g) after discharging all the first substrates from the first rack, setting a third rack containing a plurality of third substrates in the loader unit of the first assembly and testing process apparatus.

According to the embodiment, even when a plurality of first substrates stored in the first rack and a plurality of third substrates stored in the third rack are consecutively supplied to the processing unit of the first assembly and testing process apparatus, it is possible to prevent a problem that the third substrate to be collected into other rack mixes into the second rack.

Thus, the product management and/or prompt defect analysis of the semiconductor device can be carried out without reducing the throughput of the assembly and testing process processing.

BRIEF DESCRIPTION OF THE DRAWINGS

FIGS. 21A and 21B are conceptual diagrams showing a method of marking a two-dimensional code on the surface of the sealing body, in which FIG. 21A is a side view seen from a direction parallel to a transport direction of the lead frame, and FIG. 21B is a side view seen from a direction perpendicular to the transport direction of the lead frame;

FIGS. 30A and 30B are charts showing the outline of management items of a data table or a database prepared in the main server, in which FIG. 30A is a correspondence table between the name of a product to manufacture and the manufacturing lot of a semiconductor wafer, and FIG. 30B is a correspondence table between the manufacturing lot of a semiconductor wafer to manufacture and a substrate that can be used therefor;

FIG. 31A is a correspondence table among the identification information (chip ID) of each semiconductor chip, the manufacturing lot of a semiconductor wafer, identification information (wafer number) of the semiconductor wafer, a position coordinate in the semiconductor wafer, and quality information;

FIG. 31B is a correspondence table among a series of steps of a manufacturing process, a manufacturing apparatus, and a manufacturing (work) condition;

FIG. 32 is a correspondence table (database) for managing a manufacturing history of each semiconductor chip;

FIG. 33 is a correspondence table (management table) for managing the storage (in-process) situation of the substrates to be stored into a transport unit (here, an assembly rack);

DETAILED DESCRIPTION

Figure 1:
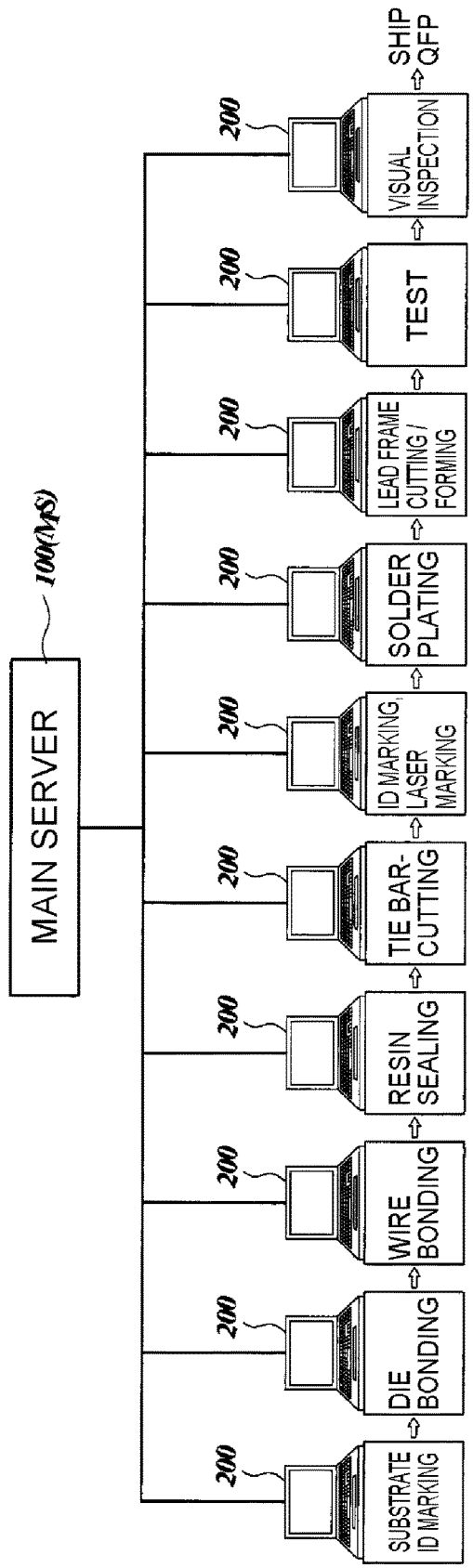
FIG. 1 is a whole flow chart showing a QFP manufacturing process that is an embodiment.

Hereinafter, embodiments will be described in detail with reference to the accompanying drawings. In all the drawings for explaining the embodiments, the same symbol is assigned to the component having the same function, and the repeated explanation thereof is omitted. In the following embodiments, the explanation of the same or similar portion is not repeated unless otherwise particularly necessary. In the drawing for explaining the embodiments, hatching may be attached even if it is a plan view to make it easy to see the configuration, or hatching may be omitted even in a cross sectional view.

First Embodiment

Figure 2:
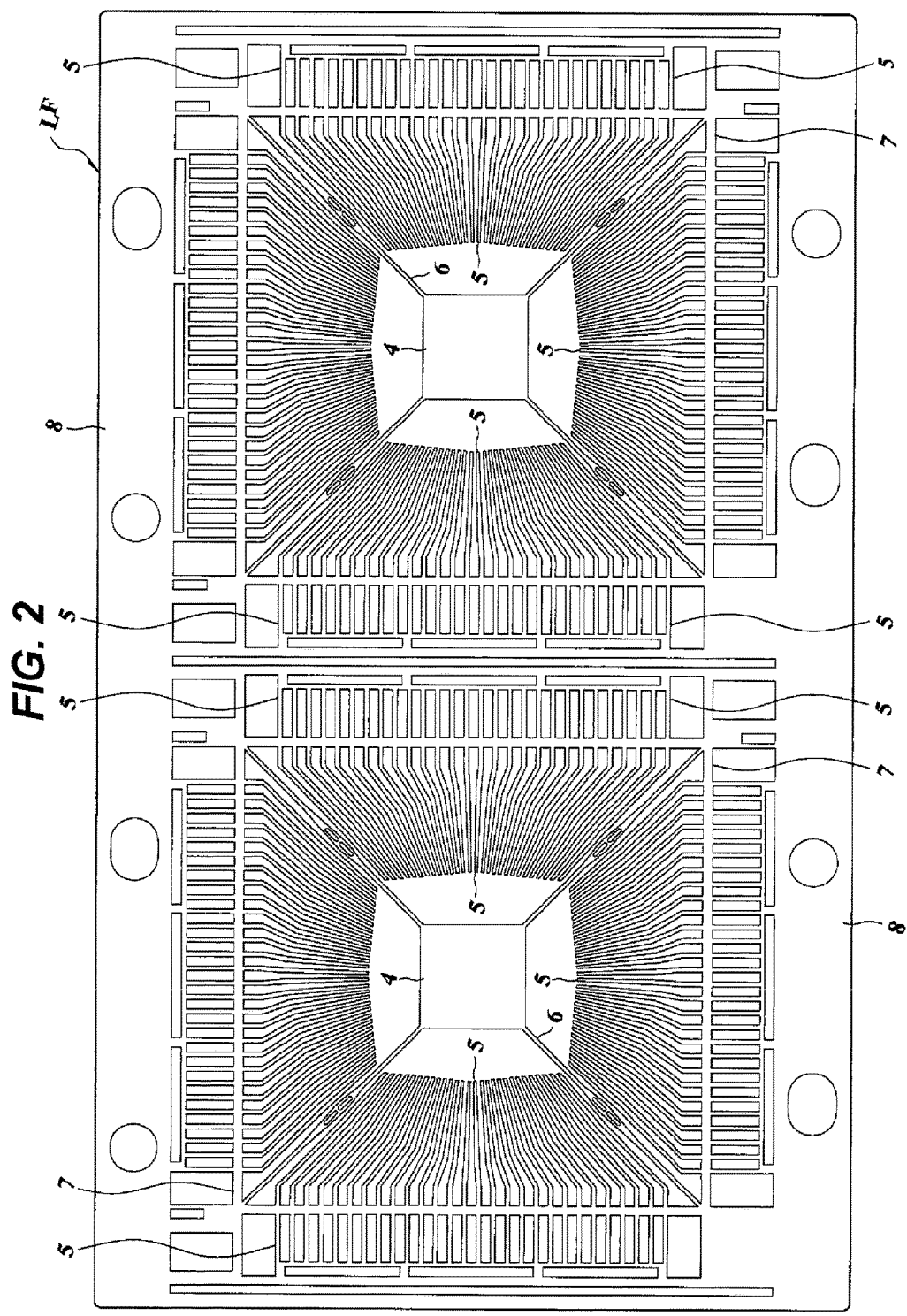
FIG. 2 is a whole plan view of a lead frame used in manufacturing a QFP.
Figure 3:
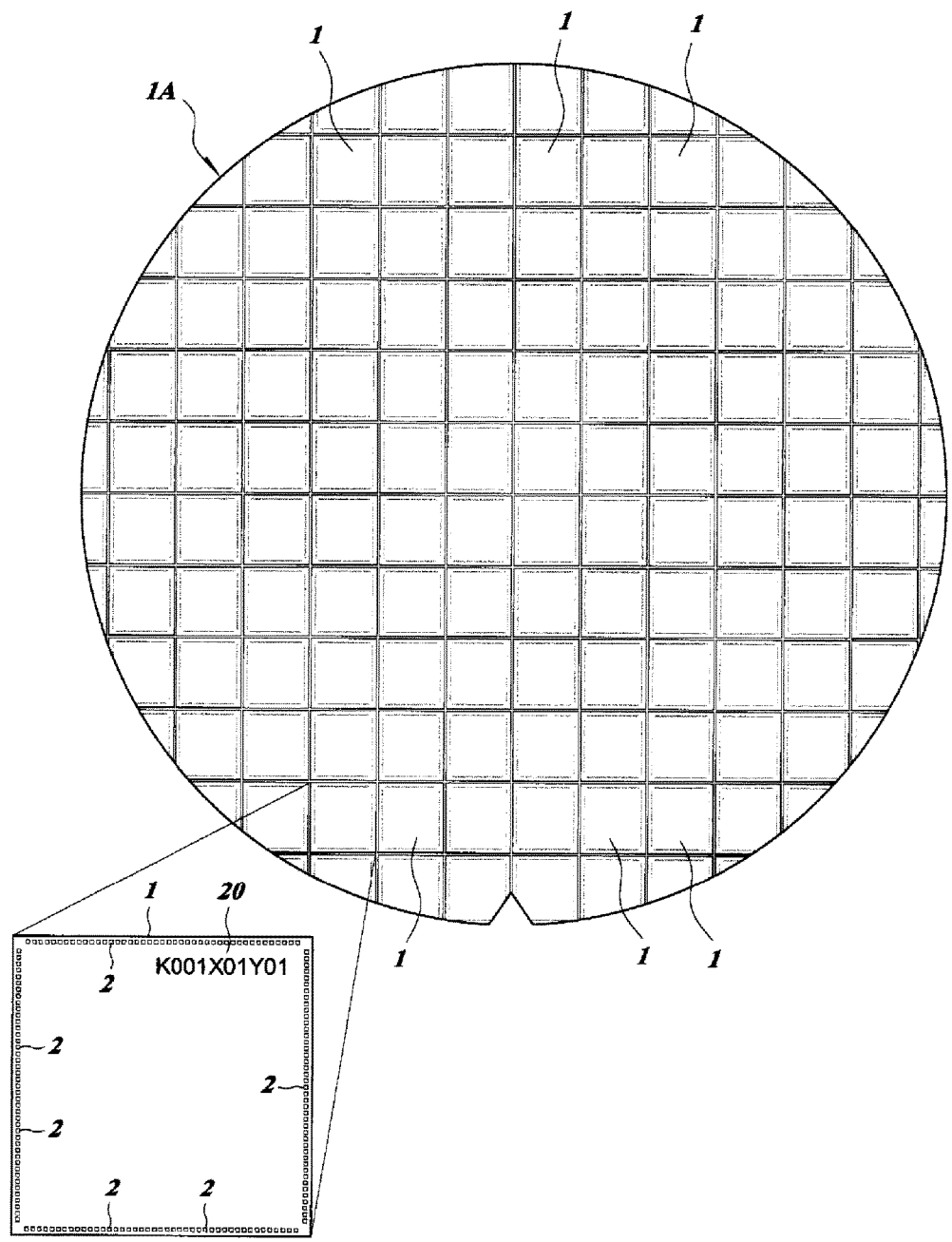
FIG. 3 is a whole plan view of a semiconductor wafer used in manufacturing the QFP.
Figure 25:
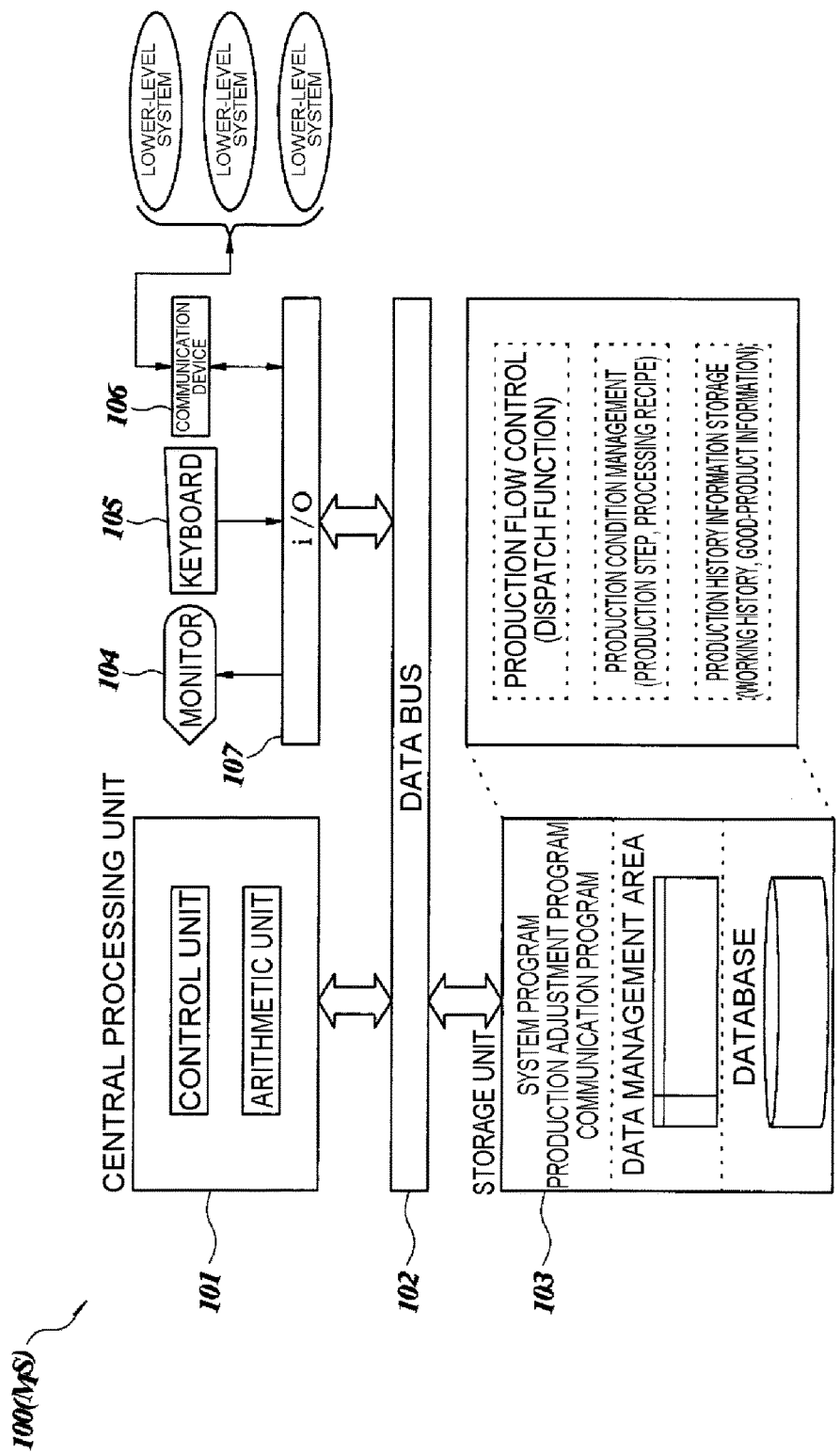
FIG. 25 is a schematic configuration diagram of a main server supervising each manufacturing apparatus shown in FIG. 1.
Figure 26:
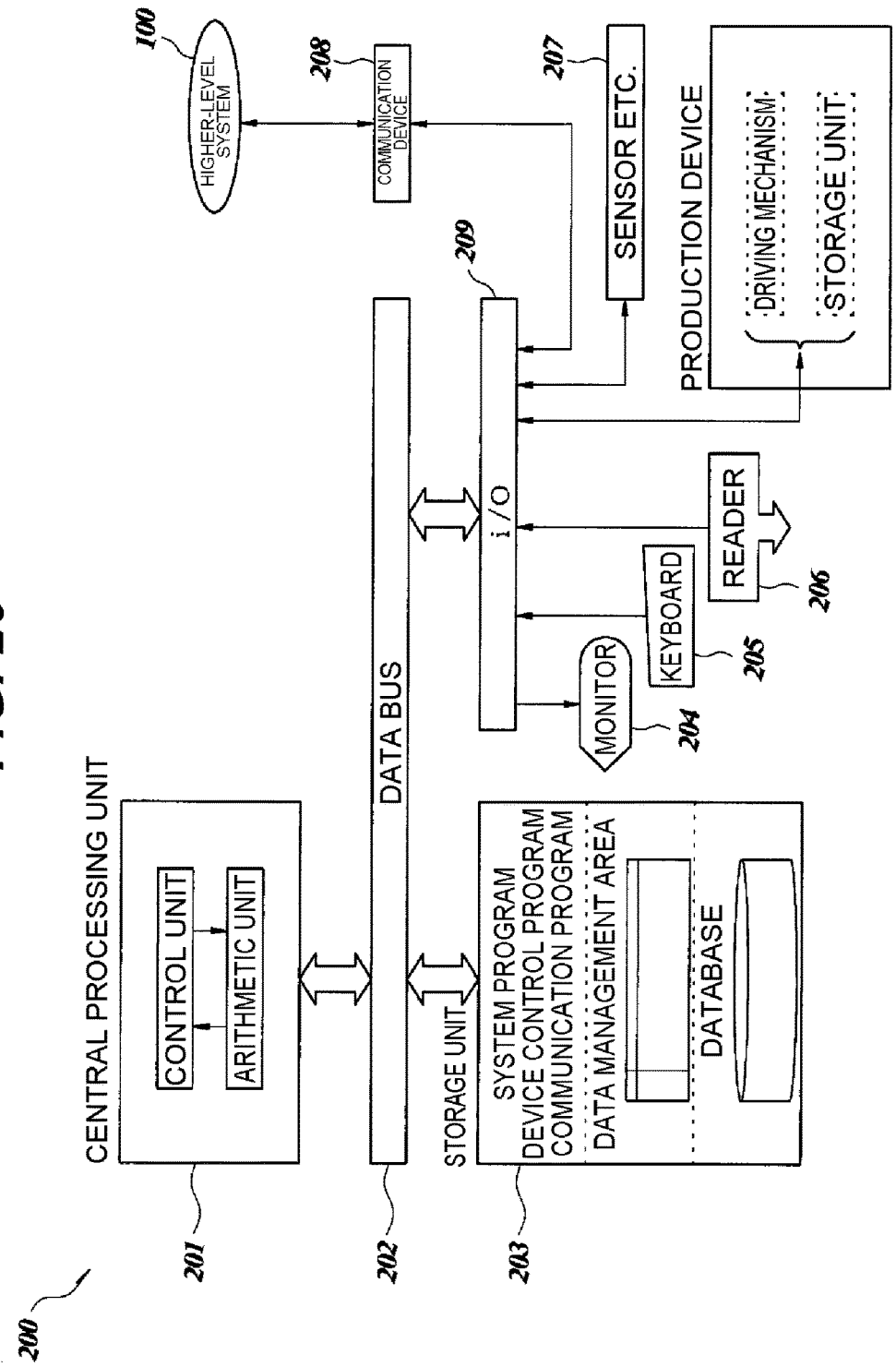
FIG. 26 is a schematic configuration diagram of a management server of the manufacturing apparatus, the management server receiving an instruction from the main server and individually controlling each manufacturing apparatus.

The present First Embodiment is applied to the manufacturing of a QFP (Quad Flat Package) that is one type of a surface-mounted semiconductor device (semiconductor package). FIG. 1 is a whole flow chart showing the manufacturing process of this QFP. FIG. 2 is a plan view of a lead frame as a substrate (chip mounting component) used in manufacturing the QFP. FIG. 3 is a plan view of a semiconductor wafer used in manufacturing the QFP. FIG. 25 is a schematic configuration diagram of a main server supervising each manufacturing apparatus shown in FIG. 1. FIG. 26 is a schematic configuration diagram of a management server of the manufacturing apparatus, the management server receiving an instruction from the main server and individually controlling each manufacturing apparatus.

<Main Server>

First, a main server 100 (main server MS) of the present First Embodiment is described.

The main server 100, as shown in FIG. 1, in constructing a manufacturing system by linking each manufacturing apparatus (a substrate ID marking apparatus, a die bonding apparatus, and the like), controls the manufacturing apparatus used in each manufacturing process and the production sequence (input timing) in each manufacturing apparatus in the unit of production (in the unit of an assembly lot, a manufacturing lot, a diffusion lot) so as to be able to obtain the optimum production efficiency in the unit of production taking into consideration a target (customer delivery date) until a product is completed, the preparation (arrangement) situation of the materials to use, and the like. That is, the main server 100 of the present First Embodiment has a dispatch function (production scheduling function).

Moreover, the main server 100 of the present First Embodiment, as shown in FIG. 25, includes a central processing unit 101 having: an arithmetic unit carrying out various kinds of arithmetic processing; and a control unit which decodes a control instruction and transfers the result to the arithmetic unit and/or which controls the operation timing and the like of each manufacturing apparatus. Moreover, the main server 100 also includes a storage unit 103 having: each program (a system program, a production control program, a communications program, and the like) for production control; a data management area (data table) for managing (grasping) and storing the operation (progress) status of each manufacturing apparatus as shown in FIG. 30A to FIG. 33; and a database for storing a production history, the storage unit 103 being linked to the central processing unit 101 via a data bus 102. Note that, a storage unit 103 is constituted by a combination of the respective recording media, such as a semiconductor memory and a hard disk drive unit.

Furthermore, the main server 100 of the present First Embodiment also includes a monitor 104 for displaying the status of the main server 100, a keyboard 105 for inputting data as required, a communication unit 106 for communicating with a large number of subsystems (management servers 200 of the manufacturing apparatus shown in FIG. 1), an interface unit (i/O) 107 for coupling these to the data bus 102, and the like.

<Management Server>

Next, a management server 200 of the present First Embodiment is described. First, the management server 200 is prepared (installed) for each manufacturing apparatus. The basic configuration of the management server 200 is the same as that of the main server 100. That is, the management server 200, as shown in FIG. 26, includes a central processing unit 201 having: an arithmetic unit carrying out various kinds of arithmetic processing; and a control unit which decodes a control instruction and transfers the result to the arithmetic unit and/or which controls the operation timing and the like of each manufacturing apparatus. Moreover, the management server 200 includes a storage unit 203 having: various programs for production control; a data management area (data table) for managing (grasping) and storing the operation (progress) status of each manufacturing apparatus; and a database for storing a production history, the storage unit 203 being linked to the central processing unit 201 via a data bus 202.

Furthermore, the management server 200 also includes a monitor 204 for displaying the status of the management server 200, a keyboard 205 for inputting data as required, a reader 206 for reading identification information (two-dimensional code) assigned to each substrate, a component, and the like, sensor etc. (a positional information sensor, an ID reader, an image recognition unit, and the like) 207 for grasping the operation (progress) status of the manufacturing apparatus, a communication unit 208 for communicating with the higher-level system (main server 100), and an interface unit (i/O) 209 for coupling these to the data bus 202.

Note that, from the management server 200, the data (an operation instruction, an operating condition, and the like) transmitted to a manufacturing apparatus linked to the management server 200 is transferred to a driving mechanism of the manufacturing apparatus via the interface unit 209. Moreover, the above-described transmitted data is transferred also to a storage unit in the manufacturing apparatus, and is stored therein.

<Lead Frame>

A lead frame LF Shown in FIG. 2 is formed by copper (Cu) or a copper (Cu) alloy, and constituted by a plurality of device regions (regions to serve as semiconductor devices) and an outer frame portion 8 positioned around the device regions. Each device region of the lead frame LF includes a chip mounting region (a die pad, a chip mounting portion) 4 that is a portion for mounting a semiconductor chip, a plurality of leads (external terminals) 5 formed around the chip mounting region 4, a plurality of suspension leads 6 integrally formed with the chip mounting region 4, and a tie bar 7 integrally formed with the respective leads 5 and suspension leads 6. The respective leads 5, suspension leads 6, and tie bar 7 are supported by the outer frame portion 8, and the chip mounting region 4 is supported by the outer frame portion 8 via the suspension lead 6.

Note that, the actual lead frame includes a number of chip mounting regions 4, but here for ease of viewability, the lead frame is described using a lead frame LF including two chip mounting regions 4. That is, the lead frame LF shown in FIG. 2 is capable of mounting two semiconductor chips, and two QFPs are obtained from this lead frame LF. In the present First Embodiment, the lead frame is described using a lead frame LF formed by copper (Cu) or a copper (Cu) alloy, but a lead frame formed by an iron (Fe) alloy, for example such as a 42 alloy, may be used.

<Semiconductor Wafer>

A semiconductor wafer 1A shown in FIG. 3 is the one after the wafer process and the subsequent singulation processes are completed, in which the semiconductor wafer 1A is divided into a plurality of semiconductor chips 1. Note that, the singulation process of the present First Embodiment is a dicing process of cutting a semiconductor wafer using a dicing blade, for example.

The wafer process of a semiconductor device includes: a plurality of processes of forming an integrated circuit in each semiconductor chip 1 (a semiconductor chip before singulation) of the semiconductor wafer 1A by a combination of a photolithographic technique, a CVD technique, a sputtering technique, an etching technique, and the like; and an electrical characteristic inspection process of causing a probe needle to contact the surface of a bonding pad 2 formed in a major surface (a surface in which an integrated circuit is formed) of each semiconductor chip 1 and determining a non-defective or defective element constituting the integrated circuit and/or a conductive or non-conductive wiring coupling the elements.

The singulation process is a process of attaching a dicing tape on the rear surface (the surface opposite to the major surface) of the semiconductor wafer 1A, the electrical characteristic inspection process of which is complete, cutting the semiconductor wafer 1A in this state and thereby obtaining a plurality of semiconductor chips 1. The semiconductor chips 1 singulated from the semiconductor wafer 1A are transported to the assembly and testing process (manufacturing process of the QFP) while being held by the above-described dicing tape.

To each of the semiconductor chips 1 singulated from the semiconductor wafer 1A, in the wafer process, there is assigned unique information, in other words a chip ID (chip identification information) 20 linked to each individual information, the chip ID including: a manufacturing lot number of the semiconductor wafer 1A; a semiconductor wafer number; a position of the relevant semiconductor chip 1 in the semiconductor wafer 1A; and the information indicating whether the semiconductor chip 1 is nondefective or defective. Then, once the semiconductor wafer 1A (the singulated semiconductor chips 1) shown in FIG. 3 is transported to the assembly and testing process, the chip ID 20 of each semiconductor chip 1 is registered with the main server 100 (main server MS).

That is, as shown in FIG. 31A, the result of the inspection of quality carried out in the electrical characteristic inspection process is associated (linked) with the chip ID (chip identification information, identification information, identification code), the manufacturing lot number of a semiconductor wafer, the wafer number in a manufacturing lot, and the positional information in the semiconductor wafer, and is stored in the main server MS.

Accordingly, by referring to the main server MS, the information indicating at which manufacturing lot each semiconductor chip 1 was manufactured, and at which position in which semiconductor wafer 1A the each semiconductor chip 1 was located can be obtained easily.

Next, the QFP manufacturing method of the present First Embodiment is described in the order of processes while referring to the whole flow shown in FIG. 1 and FIGS. 4 to 24. Note that, as described above, for the storage unit 103 of the main server MS, in order to sequentially advance the manufacturing and processing along a manufacturing flow, for example, as shown in FIG. 31B, a processing step management table is prepared in advance for managing the data regarding the manufacturing process for each manufacturing lot along the manufacturing flow, the manufacturing apparatus used in each manufacturing process, and a working condition (recipe) of the manufacturing apparatus. Moreover, for the management data of the processing step management table, in order to always maintain the optimum production efficiency, scheduling is repeated by the main server MS according to the priority over other products in terms of manufacturing or according to the occupied state (degree of progress) of an individual manufacturing apparatus. Therefore, the storage content is flexible.

<ID Marking Process>

Figure 4:
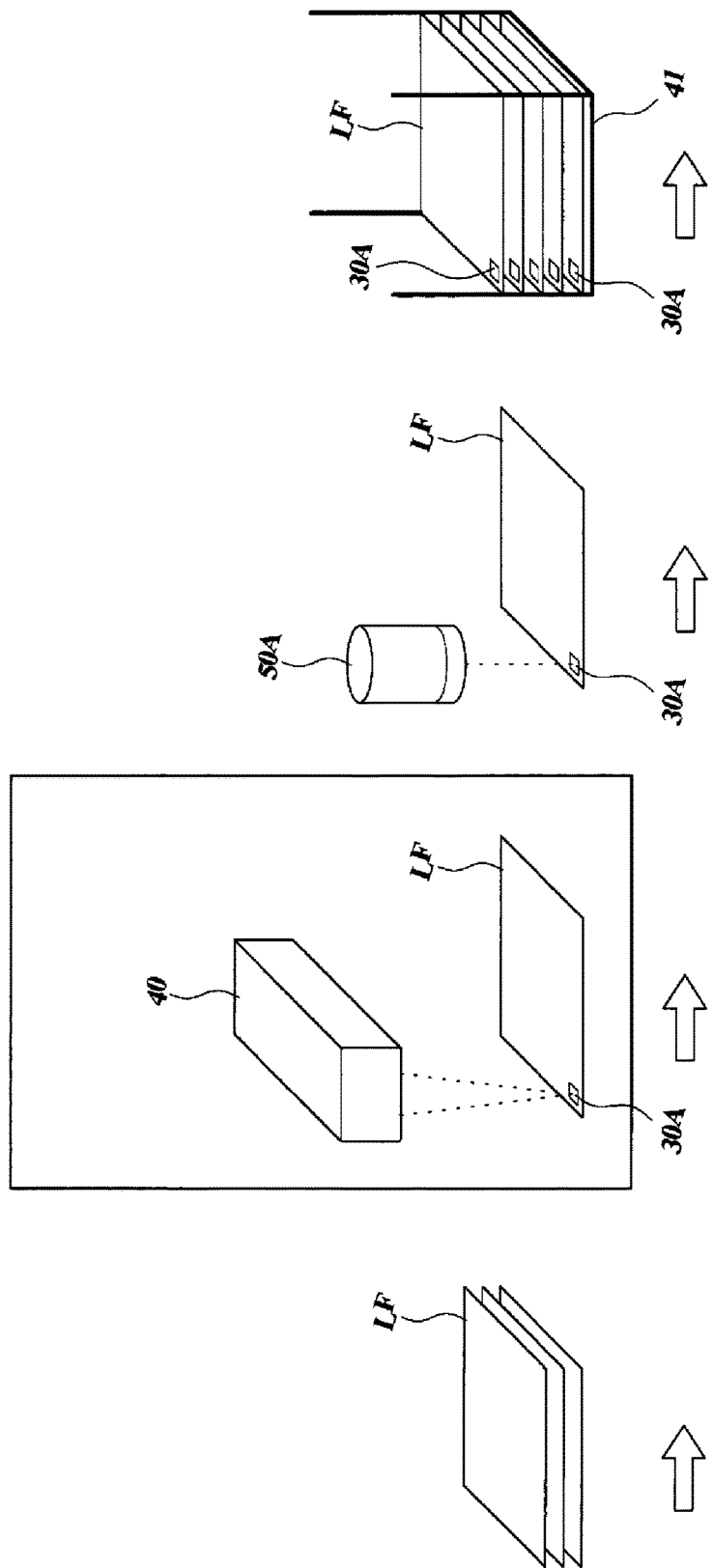
FIG. 4 is a conceptual diagram of an ID marking process.
Figure 5:
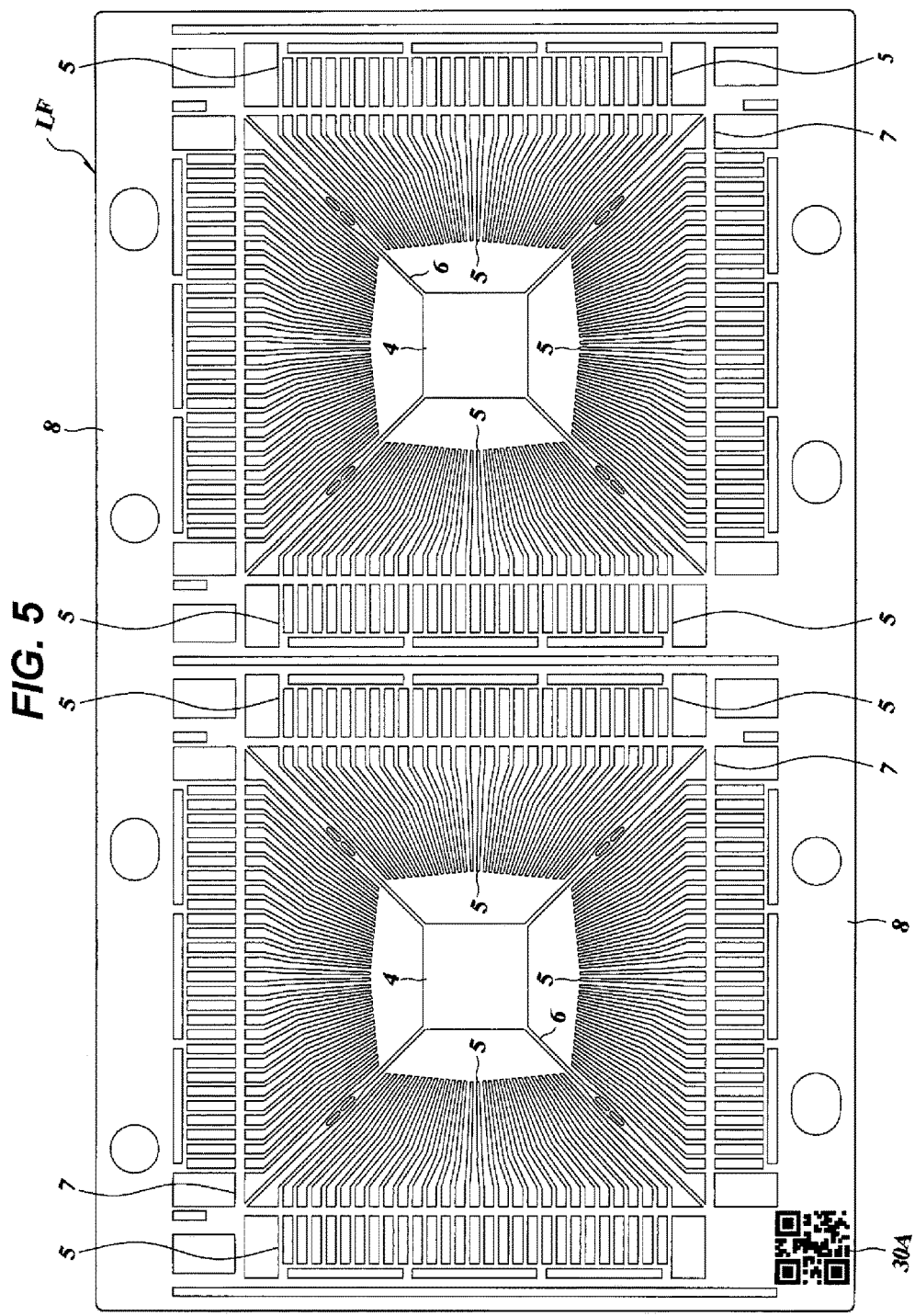
FIG. 5 is a whole plan view of a lead frame in which a two-dimensional code is marked on the surface of an outer frame portion.

First, as shown in FIG. 4 (the conceptual diagram of the ID marking process) and FIG. 5, a predetermined number of lead frames LF shown in FIG. 2 are prepared, and a unique substrate ID (first substrate identification information, identification code) for identifying the relevant lead frame LF is assigned to the surface of each lead frame LF. The substrate ID (first substrate identification information) of the present First Embodiment is formed (marked), for example, by irradiating the surface of the lead frame LF with a laser beam from a marking apparatus 40.

As shown in FIG. 5, the above-described substrate ID is marked on the surface (the top surface or the major surface) of the outer frame portion 8 located outward of the device region in the form of a two-dimensional code 30A, in each lead frame LF. That is, if the number of prepared lead frames LF is 100, a different substrate ID (e.g., K0001, K0002, K0003, . . . , K0100) is marked to each of these lead frames LF in the form of the two-dimensional code 30A.

The two-dimensional code 30A is a code in a display format having information in two directions (e.g., a horizontal direction and a vertical direction) in contrast to a one-dimensional code (barcode) having information only in one direction (e.g., horizontal direction). Moreover, in terms of an aggregate formed by a combination of white points and black points, the configuration thereof is similar to that of the one-dimensional code, but in the two-dimensional code 30A, furthermore, an intermediate color (e.g., gray point) of these colors and the like are also used. That is, because the shape is selectively used also according to the density of a color, more information can be handled than the information in the one-dimensional code. Moreover, because the two-dimensional code 30A can reduce the display area as compared with one-dimensional code, it can be marked even on the surface of the lead frame LF, the width of the outer frame portion 8 of which is narrow.

Figure 56:
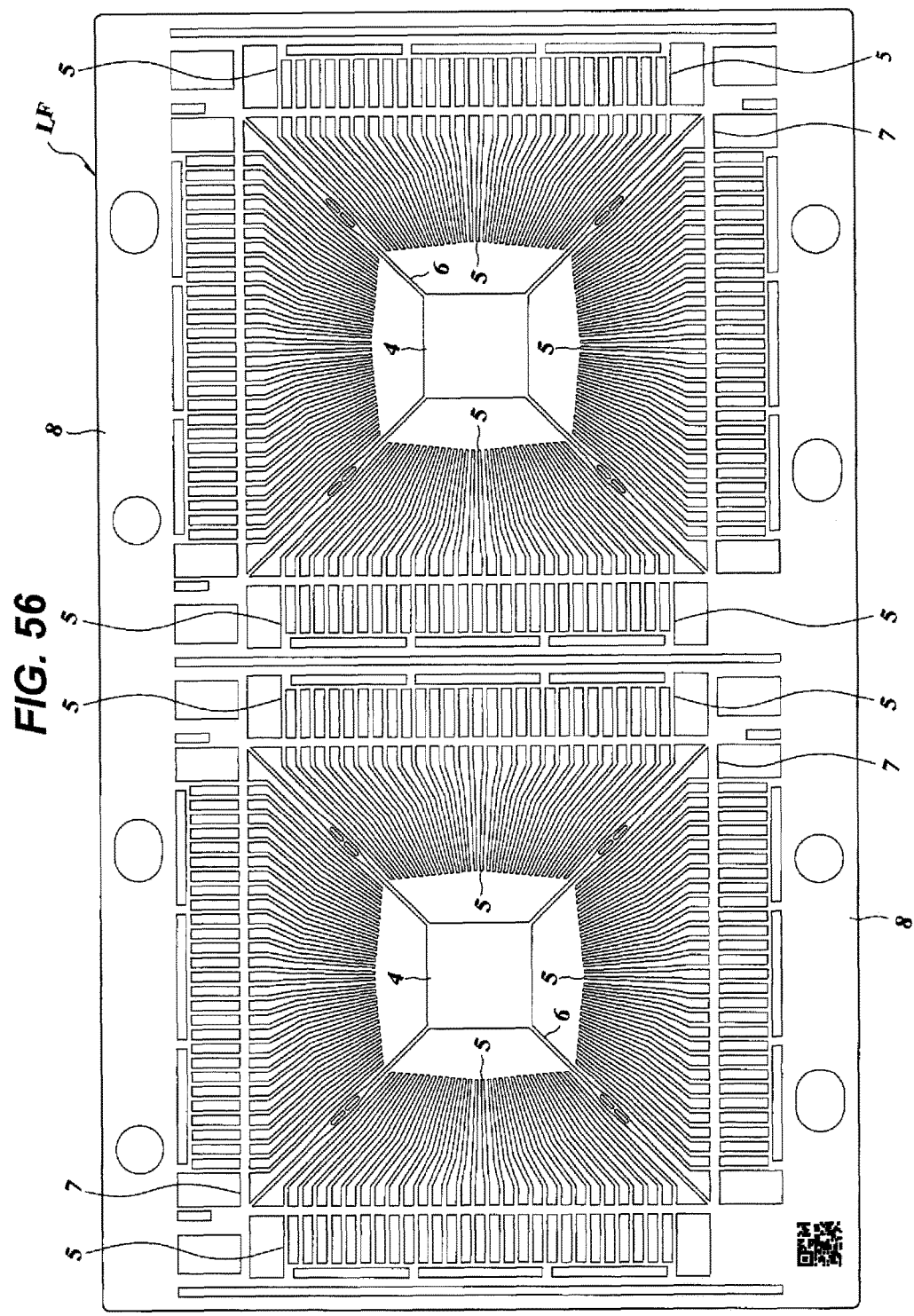
FIG. 56 is a plan view showing a variation of the code shown in FIG. 5.

Note that, in the present embodiment, as shown in FIG. 5, a two-dimensional code having a cutout symbol arranged in three corner portions is described, but not limited thereto, and a two-dimensional code with one cutout symbol may be employed as shown in FIG. 56. Thus, the outer size of a code to mark can be further reduced.

Figure 6:
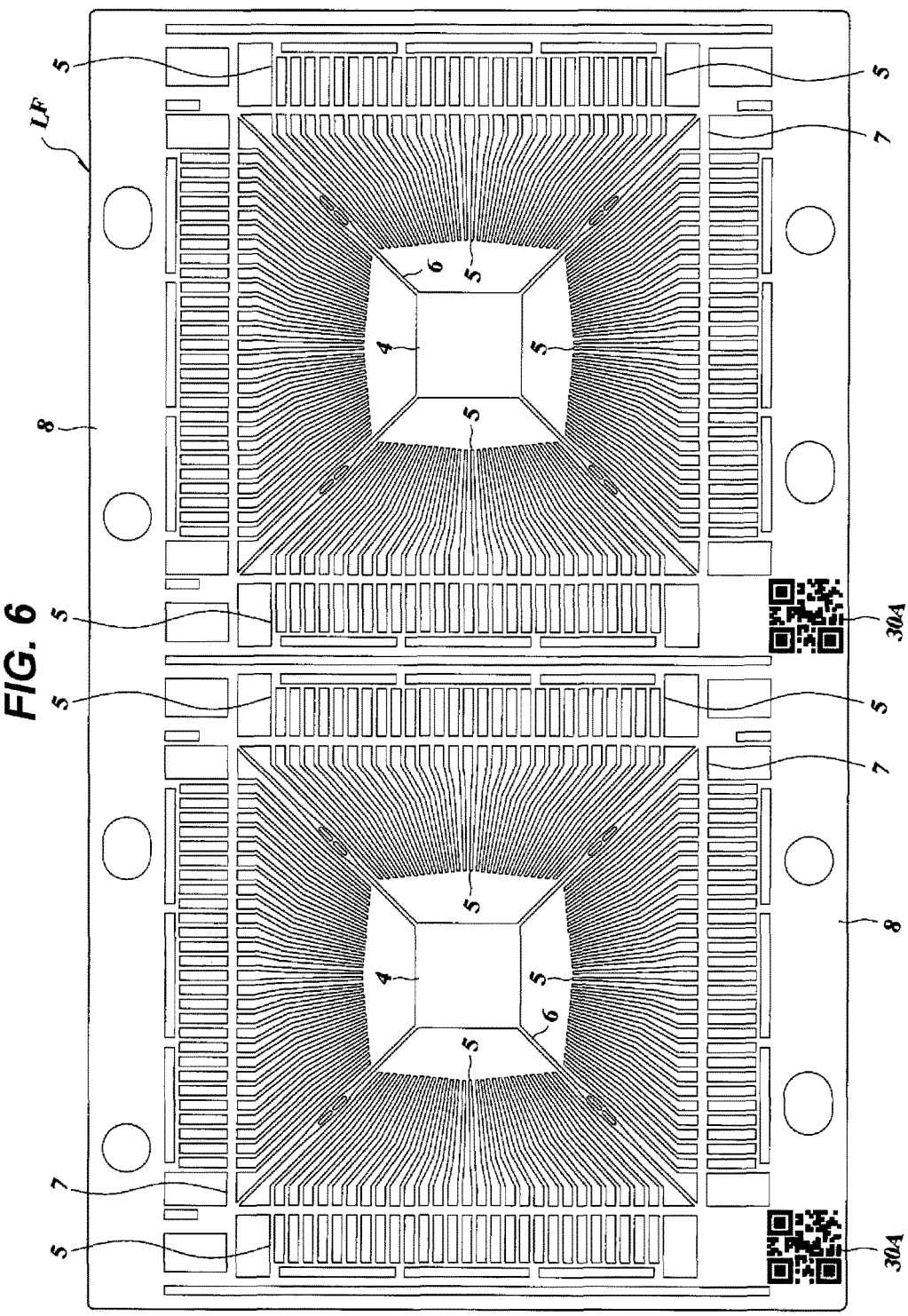
FIG. 6 is a whole plan view of a lead frame showing another example of a two-dimensional code marking method.
Figure 57:
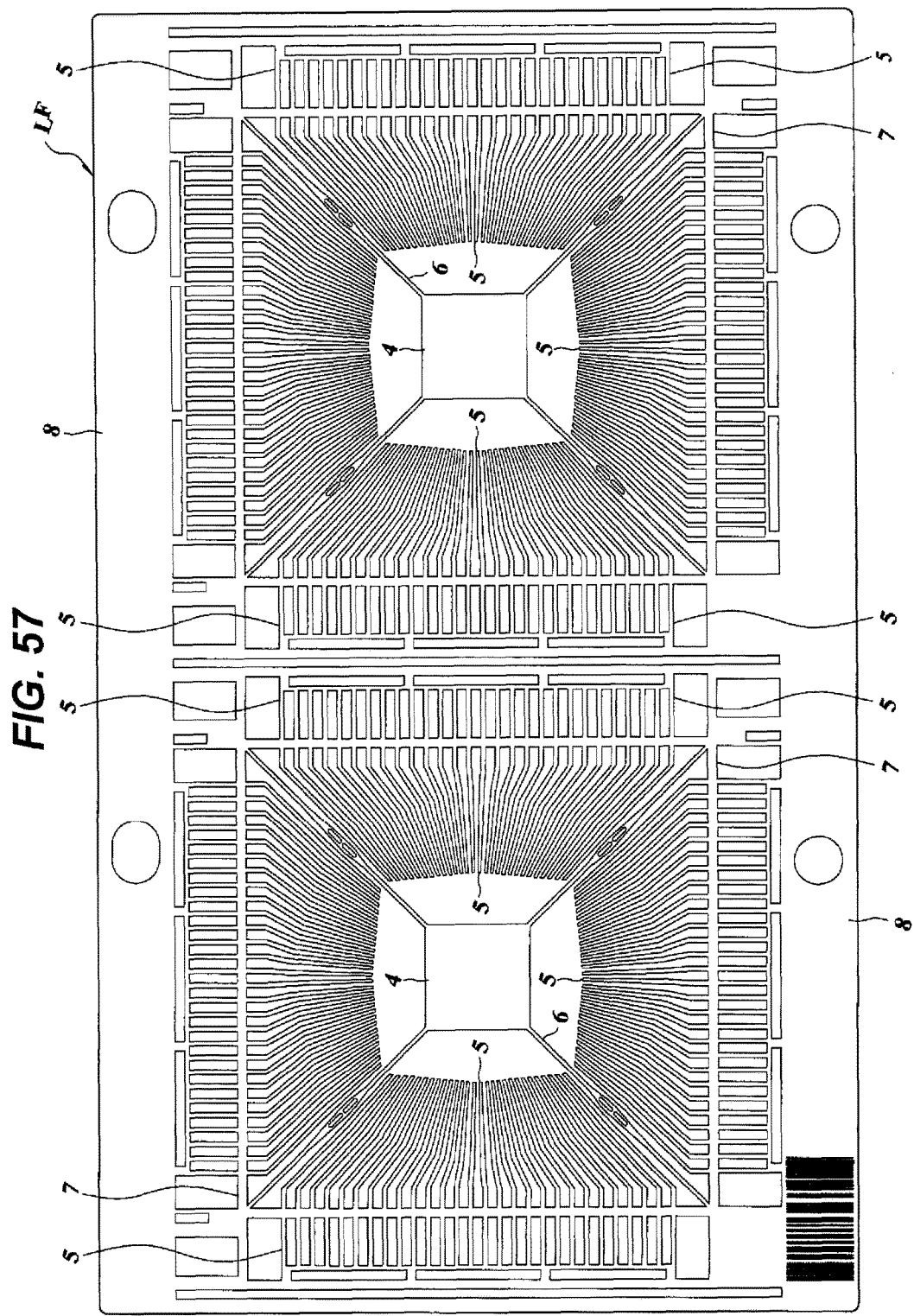
FIG. 57 is a plan view showing a variation of the code shown in FIG. 5.
Figure 58:
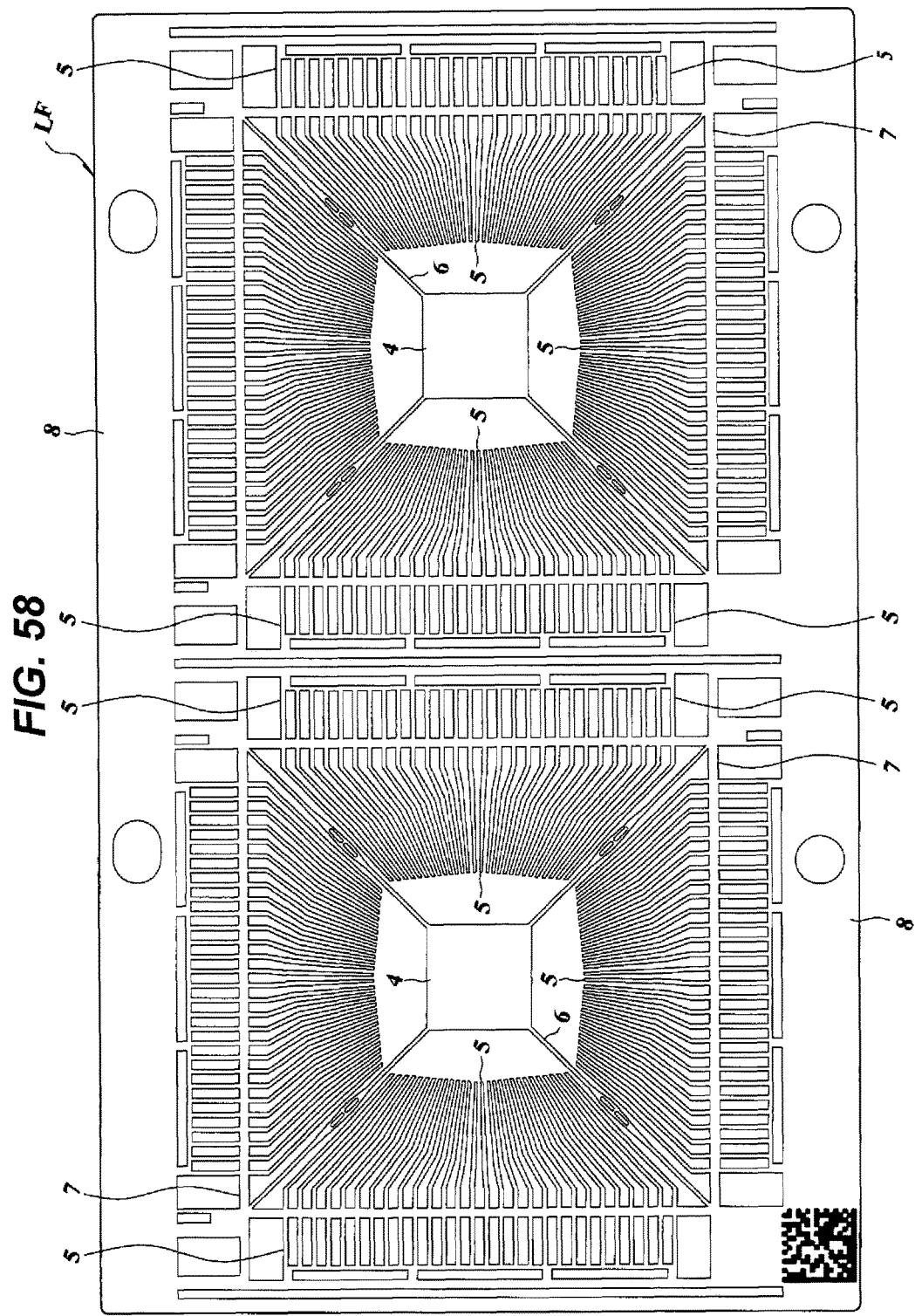
FIG. 58 is a plan view showing a variation of the code shown in FIG. 5.

Other than this, when the area of the outer frame portion 8 of the lead frame LF is sufficiently large, not limited to the above-described two-dimensional code 30A, the substrate ID may be marked on the form of one-dimensional code as shown in FIG. 57. Moreover, when even with the same two-dimensional code, as shown in FIG. 58, an L-shaped alignment pattern (corresponding to the left side and the lower side of a code in FIG. 58) and a dotted-line shaped timing cell (corresponding to the right side and the upper side of the code in FIG. 58) may be arranged, and the substrate ID may be marked on the form of a code having a pattern corresponding to data arranged in the timing cell. Furthermore, in marking the two-dimensional code 30A on the surface of the lead frame LF, in order to prevent the two-dimensional code 30A from being damaged in the subsequent manufacturing process and being unable to be read, the same two-dimensional code 30A may be marked to a plurality of places of the outer frame portion 8 of the lead frame LF as shown in FIG. 6.

After the two-dimensional code 30A is marked to the lead frame LF, the two-dimensional code 30A of each lead frame LF is read by an ID reader 50A, such as a camera or reader installed in the marking apparatus 40, as shown in FIG. 4. Then, the lead frame LF, the substrate ID of which is verified to be marked to the degree that it is legible from the relevant two-dimensional code 30A, is piled into a stacker 41. Furthermore, as shown in FIG. 30B, after being associated (linked) with the manufacturing lot of a semiconductor wafer, the substrate ID is registered with (recorded on) the storage unit 103 of the main server MS as a list of substrate IDs.

Note that, in the main server MS, a product name shown in FIG. 30A as well as the manufacturing lot of a semiconductor wafer allocated to the assembly are managed. For this reason, these registered data are managed by the main server MS as a combination (group) of substrates (lead frames LF) required for a product (manufacturing lot) whose production starts.

Moreover, when the substrate (lead frame LF) has a defective device region, the information regarding this defective portion can be also registered in advance with the main server MS. Furthermore, identification code or identification information is also assigned in advance to the stacker 41 shown in FIG. 4, so that the substrate (lead frame LF) can be also associated (linked) with the stacker 41 to use, and the information regarding the stacker 41 into which the substrate (lead frame LF) is stored can be also managed.

Then, once the registration work of the substrate (lead frame LF) is completed, the substrate (lead frame LF) having identification information assigned thereto is transported to the die bonding process, which is the first process of the assembly and testing process, together with the semiconductor wafer 1A (a plurality of singulated semiconductor chips 1) shown in FIG. 3.

<Die Bonding Process>

Figure 7:
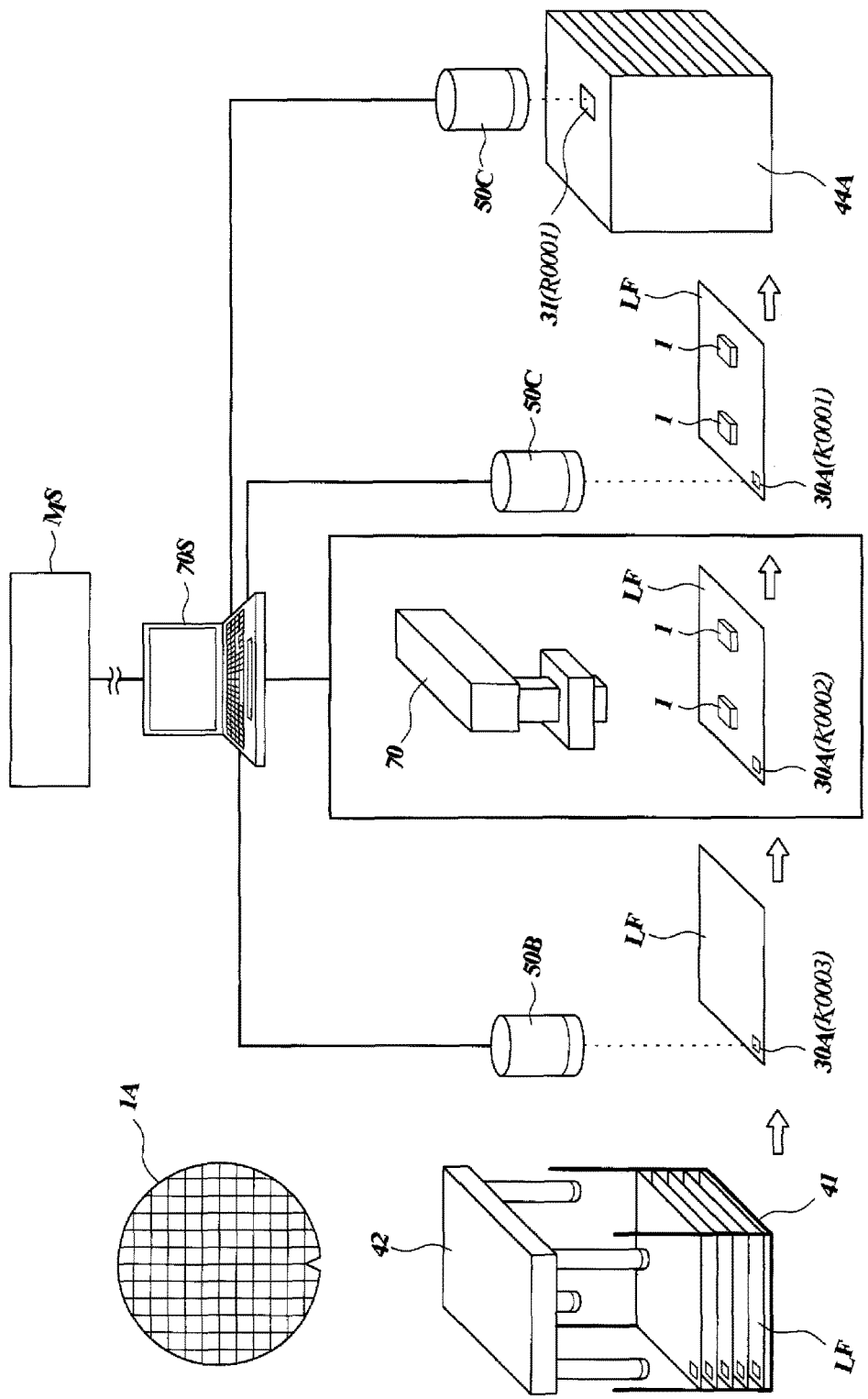
FIG. 7 is a conceptual diagram of a die bonding process.
Figure 27:
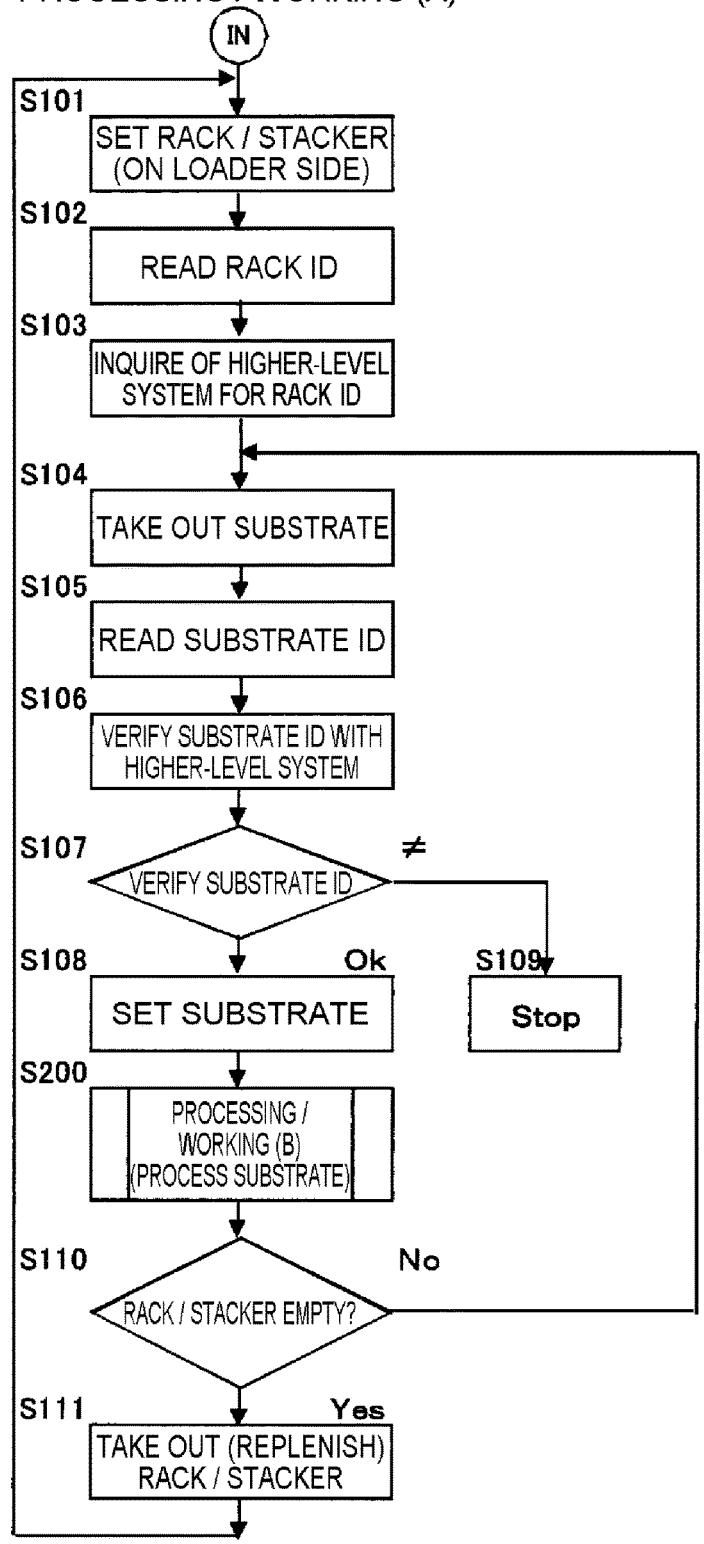
FIG. 27 is a flow chart illustrating a rough operation of the manufacturing apparatus on a loader side.
Figure 28:
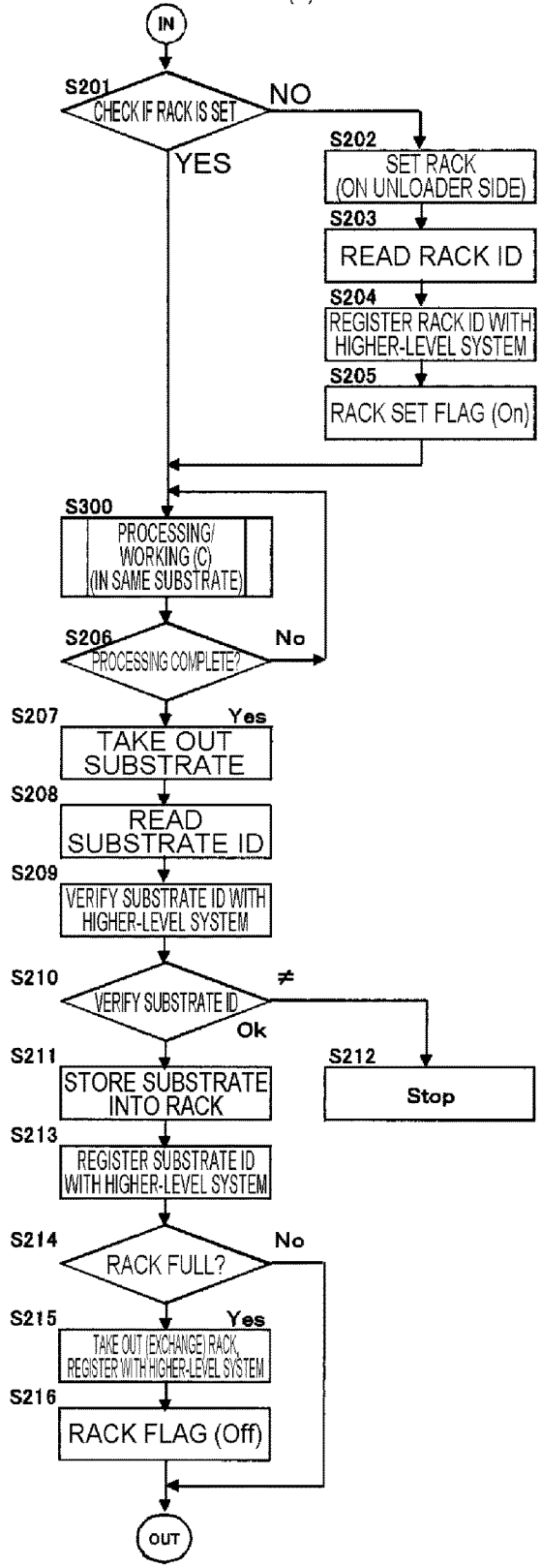
FIG. 28 is a flow chart illustrating a rough operation of the manufacturing apparatus on an unloader side.
Figure 29:
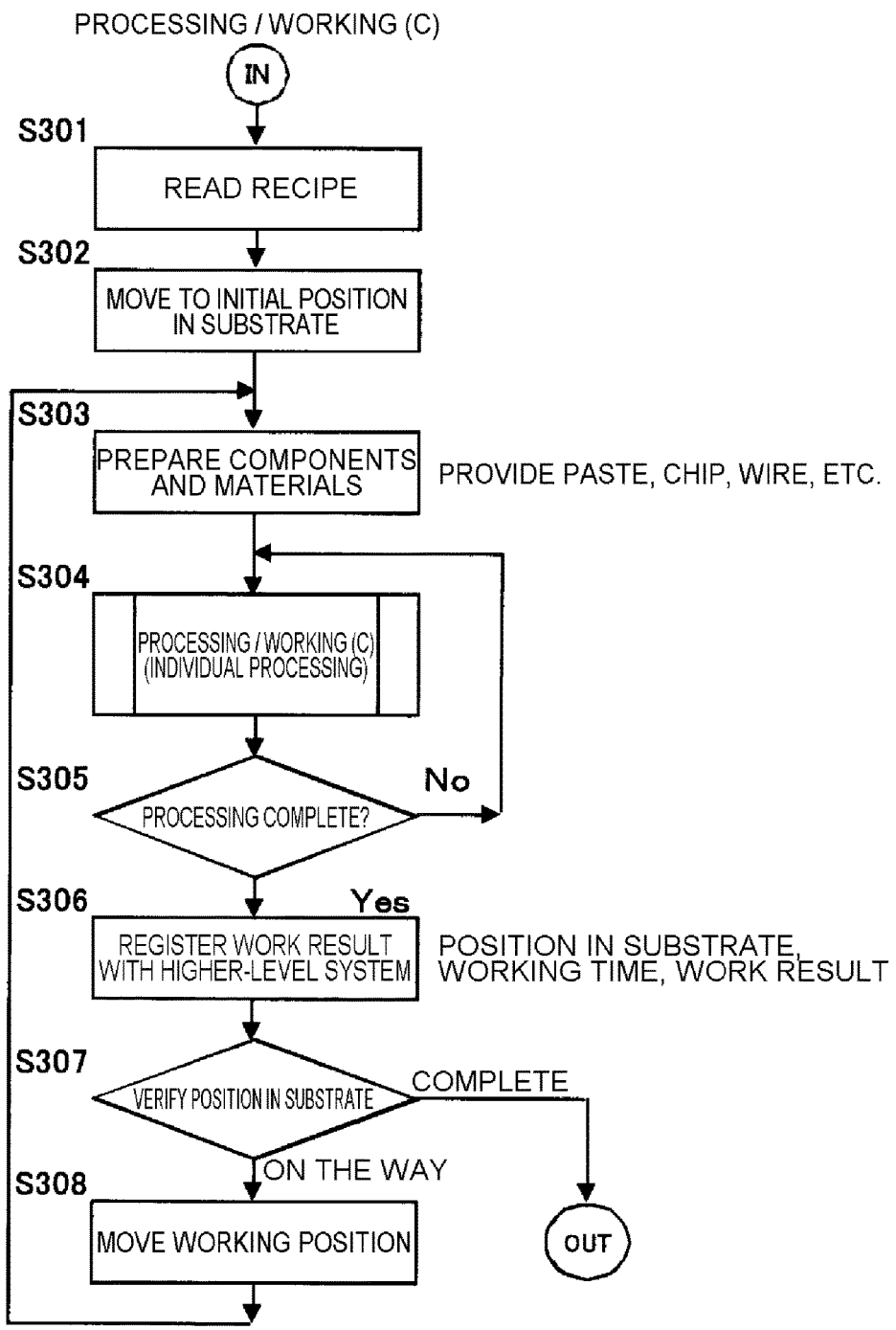
FIG. 29 is a flow chart illustrating a rough operation of the working/processing in the same substrate.
Figure 34:
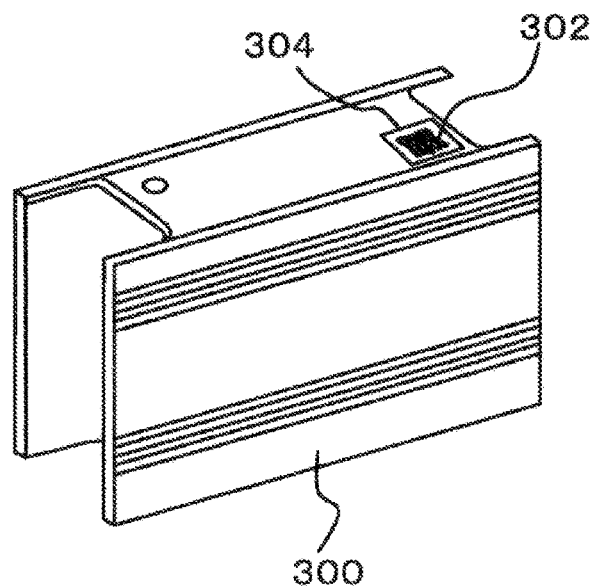
FIG. 34 is a perspective view of the assembly rack.
Figure 35:
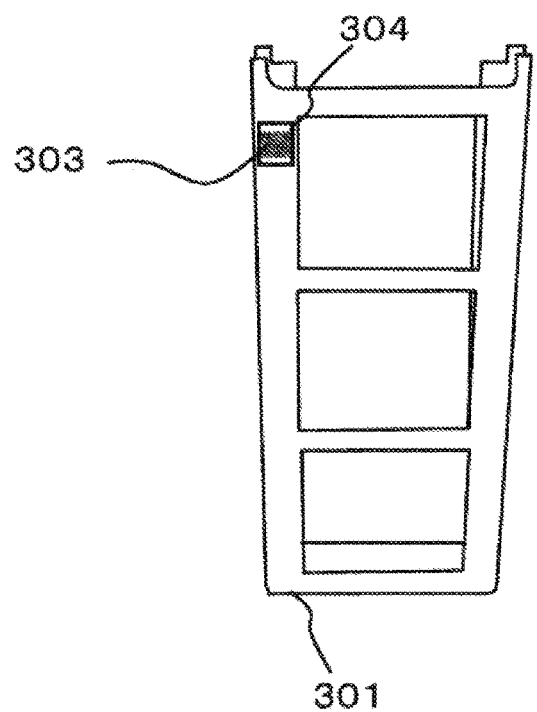
FIG. 35 is a perspective view of an integrated rack.

Next, the die bonding process (chip mounting process) of the present First Embodiment is described. FIG. 7 is a conceptual diagram of the die bonding process. FIG. 27 is a flow chart illustrating a rough operation of a manufacturing apparatus including a management server on the loader side. FIG. 28 is a flow chart illustrating a rough operation of the manufacturing apparatus including a management server on the unloader side. FIG. 29 is a flow chart illustrating a rough operation of the working/processing in the same substrate, in the manufacturing apparatus including a management server.

As shown in FIG. 7, in a loader unit of a die bonding apparatus 70 (between the loader unit and a processing unit, i.e., on a transporting route from the loader unit to the processing unit), there is installed (arranged) an ID reader 50B coupled to a server (management server 70S) managing the die bonding process. Moreover, in an unloader unit of the die bonding apparatus 70 (between the processing unit and the unloader unit, i.e., on a transporting route from the processing unit to the unloader unit), there is installed (arranged) an ID reader 50C coupled to the management server 70S.

First, the stacker 41 having a plurality of lead frames LF stored (piled) therein is set to the loader unit of the die bonding apparatus 70 (Step S101). Then, the lead frame LF is taken out from the stacker 41 one by one with a suction hand 42 (Step S104). Here, in the present First Embodiment, because a case is described as an example, where the ID of the stacker 41 to use is not managed, Step S102 and Step S103 shown in FIG. 27 can be omitted.

Subsequently, the two-dimensional code 30A of the lead frame LF discharged from the stacker 41 is read by the ID reader 50B of the above-described loader unit, and the read substrate ID (K0001, K0002, . . . ) is transferred to the management server 70S (Step S105). Then, by referring to the read substrate ID, it is determined whether or not the lead frame LF is valid as the substrate (lead frame LF) that has been supplied for manufacturing of a product (a manufacturing lot) manufactured in this step (Step S106). That is, the data (correspondence table) shown in FIG. 30A and FIG. 30B recorded in advance in the main server MS is compared with the read substrate ID to determine whether or not the substrate is the one to be applied to a product name (a manufacturing lot) with a production instruction (Step S107).

Subsequently, the lead frame LF determined as a corresponding product in the above-described step is supplied (transported) to the processing unit (region between the loader unit and the unloader unit) of the die bonding apparatus 70, and is set to the inside of the processing unit (Step S108). Note that, in the above-described step, when the substrate is determined as a different substrate (non-corresponding product), the supply (discharge, transport) of the substrate is stopped (Step S109).

Next, once the lead frame LF is supplied to the processing unit of the die bonding apparatus 70, Step S200 shown in FIG. 28 is carried out. Note that the timing of verifying whether or not a rack has been set (S201) may be before the lead frame LF is supplied to the processing unit or may be at the same timing as when the lead frame LF is supplied. However, in the present First Embodiment, a case is described where the determination is made after the lead frame LF is supplied.

First, it is verified whether or not a transport unit is already set to the unloader unit of the die bonding apparatus 70. Then, when a rack 44A is not set yet, a transport unit is set to the unloader unit (Step S202). Here, the transport unit is a tool for storing a plurality of substrates (here, lead frames LF), a certain process (here, die bonding process) of which is complete, and collectively transporting the same to the next process (here, the wire bonding process that is the next process). Here, at the initial setting, the inside of a rack is empty (no lead frame LF is yet stored). A specific example of the transport unit (tool) in the present First Embodiment is a rack (assembly rack).

Moreover, on the surface (top surface) of the rack 44A a unique rack ID (rack identification information) for distinguishing the rack 44A from other racks is marked on the form of a two-dimensional code 31. Here, the rack ID specific to the rack 44A is assumed to be R0001.

Once the rack 44A is set to the unloader unit of the die bonding apparatus 70, the two-dimensional code 31 is read by the ID reader 50C of the unloader unit (Step S203). Then, the rack ID (R0001) is transferred to the main server 100 via the management server 70S, and is registered as an empty rack on the unloader side (Step S204). In the following, for simplicity of description, the number of lead frames LF stored in one rack shall be three. That is, three lead frames LF having different substrate IDs (K0001, K0002, K0003) respectively assigned thereto shall be stored into the rack 44A.

FIG. 33 shows an example of a rack management table provided in the storage unit 103 of the main server MS. As shown in a column A of FIG. 33, in the rack management table when the rack 44A has been set, the rack ID (R0001) and the information indicating the fact that the rack ID (R0001) is empty are recorded. Then, once the first lead frame LF is supplied to the processing unit of the die bonding apparatus 70, the die bonding is carried out (Step S300). That is, the working condition of the die bonding apparatus 70 is verified (Step S301) and this working condition is prepared inside the storage unit in the die bonding apparatus 70. Then, a position to be worked is set to the initial position in the same substrate (lead frame LF) (Step S302).

Figure 8:
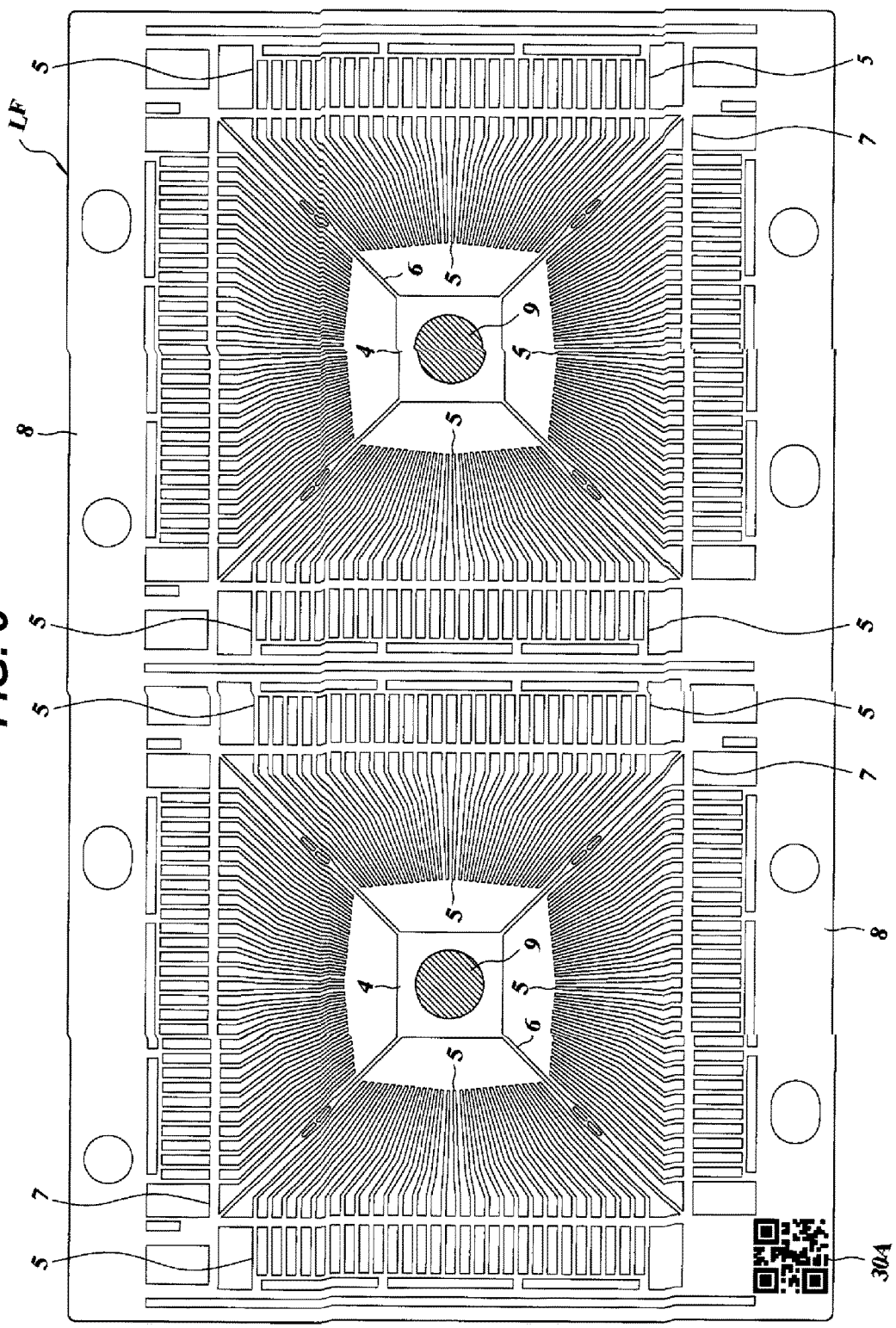
FIG. 8 is a whole plan view of a lead frame showing a state where adhesive is supplied on the surface of a chip mounting region.

Subsequently, a material to use (here, adhesive 9) is prepared (Step S303), and as shown in FIG. 8, the adhesive 9 is supplied to the surface of each chip mounting region 4 of the lead frame LF. Then, when the supplied lead frame LF has a defective device region, and furthermore the information regarding the defective device region was also registered with the main server MS in the previous process (ID marking process), only a nondefective device region can be selected and the adhesive 9 can be supplied thereto. For this reason, the amount of material (here, adhesive 9) used can be reduced and thus the manufacturing cost can be reduced.

Figure 9:
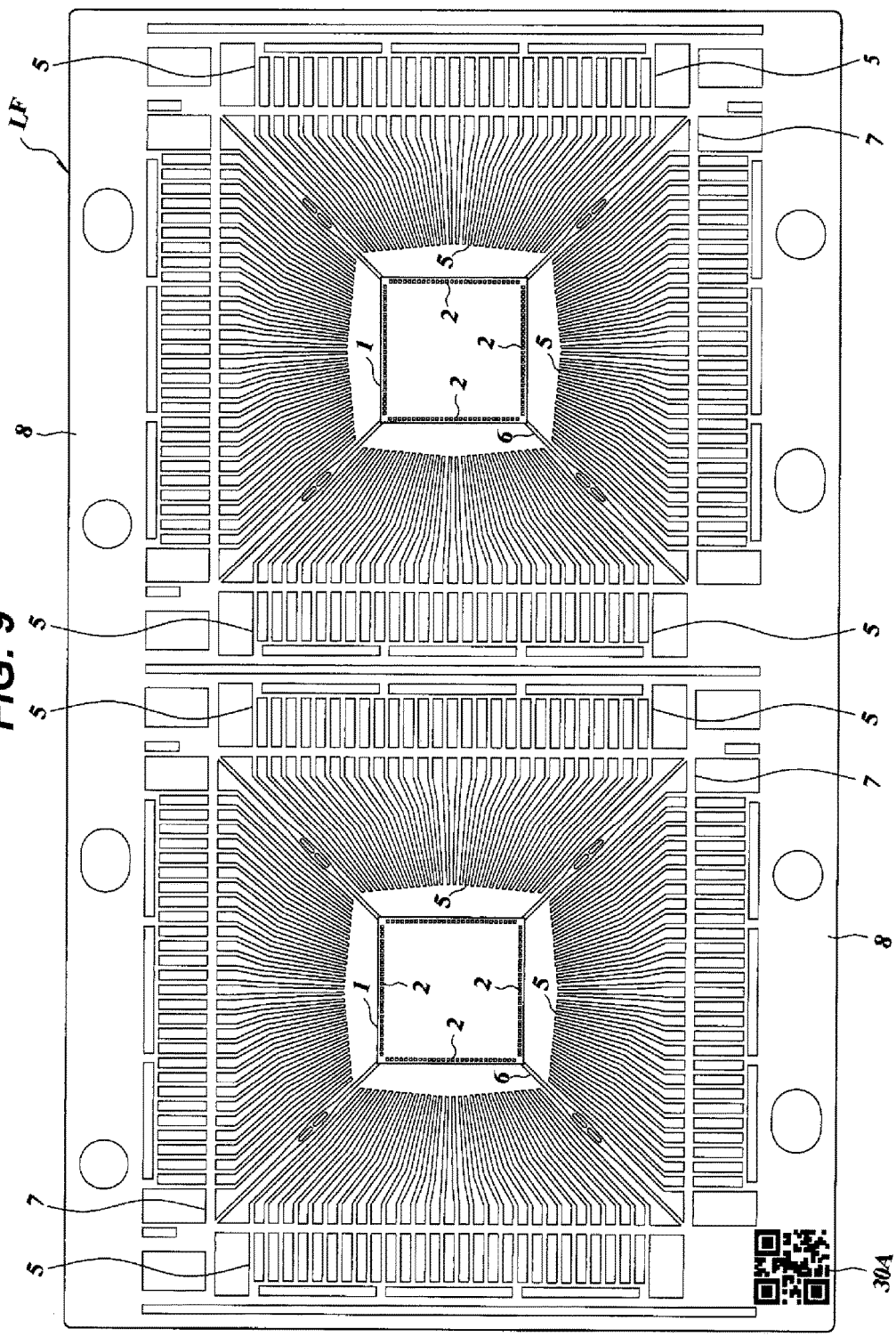
FIG. 9 is a whole plan view of a lead frame showing a state where a semiconductor chip is arranged on the surface of the chip mounting region.

Next, a singulated semiconductor chip 1 is picked up one by one from the semiconductor wafer 1A, and is arranged over the chip mounting region (die pad part) 4 of the lead frame LF as shown in FIG. 9 (Step S304). Note that, also here, as with the above-described case, when the information regarding the defective device region was also registered with the main server MS in the previous process (ID marking process), only a nondefective device region can be selected and the semiconductor chip 1 can be arranged therein, and therefore the manufacturing yield can be improved.

Next, once the completion of the die-bonding work of the semiconductor chip 1 is verified, the work result is registered with the main server MS via the management server 70S. The registration state of a working history DB registered with the main server MS at this point is shown in a column B of FIG. 32. That is, it is recorded that a chip with the chip ID "K001X01Y01" has been arranged at a position of Location "1" in the lead frame LF with the substrate ID "K0001" based on a working recipe (Re002027) by the die bonding apparatus (ST002004).

Subsequently, the position where the semiconductor chip has been arranged in the lead frame LF is verified (Step S307). Then, once it is determined that the semiconductor chip 1 can be further arranged (that there is a device region where a semiconductor chip is not yet arranged) in the same lead frame LF, the position to be worked is moved to the next position to be worked (to Location "2") in the lead frame LF (Step S308), and then the work (operation) is repeated from Step S303 shown in FIG. 29.

On the other hand, in the above-described Step S307, once it is determined that all the works (here, die bonding) with respect to the same lead frame LF are finished, the lead frame LF is stored into a single-wafer type bake furnace (not shown) in the device, and heat curing of the adhesive 9 is carried out in a high temperature atmosphere. In this manner, the die bonding process of mounting the semiconductor chip 1 on the chip mounting region 4 of the lead frame LF via the adhesive 9 is completed.

Note that, when the semiconductor chip 1 is mounted on the chip mounting region 4 of the lead frame LF, the chip ID of the semiconductor chip 1 registered in advance with the main server MS as shown in FIG. 31A is referred to, and it is verified whether or not the semiconductor chip 1 has been determined as a nondefective by the electrical characteristic inspection in the wafer process. Then, if the semiconductor chip 1 has been determined as a defective product, the semiconductor chip 1 is not mounted on the chip mounting region 4 of the lead frame LF.

Next, upon completion of the flow (Step S300) shown in FIG. 29, the processing of Step S206 and the subsequent steps shown in FIG. 28 are continuously carried out. That is, once it is verified that the die-bonding work is completed (Step S300), the first lead frame LF, the above-described die bonding of which is complete, is transported from the processing unit of the die bonding apparatus 70 to the unloader unit (Step S207).

Subsequently, the two-dimensional code 30A of the lead frame LF is read by the ID reader 50C of the unloader unit (Step S208). Then, the main server MS is inquired via the management server 70S about the substrate ID (K0001) (Step S209). Then, as a result of the inquiry, if this substrate ID (K0001) is verified to match the substrate ID (K0001) read by the ID reader 50B of the loader unit, the management server 70S permits this lead frame LF to be stored into the rack 44A (Step S210).

Note that, as a result of the inquiry in the above-described Step S209, if this substrate ID (K0001) is determined not to match the substrate ID read by the ID reader 50B of the loader unit, it is determined as an abnormal circumstance and the work is discontinued (Step S212). That is, the die-bonding work is discontinued and the content of the error is displayed on the monitor unit 204.

The lead frame LF, the die bonding process of which is complete, is stored into the rack 44A (Step S211), and the result of the storage of this lead frame LF is registered with the main server MS via the management server 70S (Step S213). Subsequently, it is determined whether or not the rack 44A is full (Step S214), and if it is verified that the rack 44A has not been fully filled, in other words if it is determined that this rack 44A still can store the lead frame LF, the processing of Step S110 and the subsequent steps shown in FIG. 27 are carried out.

Note that, if it is determined that the rack 44A is full, i.e., that all the number of substrates to be stored into this rack 44A have been stored, the number being registered in advance with the server, the rack 44A is taken out from the unloader side and this result (status) is recorded on the main server MS via the management server 70S (Step S215).

If the first lead frame LF, the die-bonding of which is complete, is transported from the processing unit to the unloader unit, and it is determined in the above-described Step S214 that the rack 44A is not full, then first, the storage status of the stacker 41 on the loader side is checked (Step S110), and if it is determined that there is any remaining lead frame LF in this stacker 41, Step S104 and the subsequent steps shown in FIG. 27 are carried out again. That is, the second lead frame LF is supplied to the processing unit. Then, the die bonding shown in FIG. 8 and FIG. 9 is carried out with respect to the second lead frame LF.

Subsequently, the second lead frame LF, the die bonding of which is complete, is transported to the unloader unit, and the two-dimensional code 30A thereof is read by the ID reader 50C. Then, if this substrate ID (K0002) is verified to match the substrate ID (K0002) read by the ID reader 50B of the loader unit, the management server 70S permits this lead frame LF to be stored into the rack 44A.

Moreover, once the second lead frame LF is transported from the processing unit to the unloader unit, the above-described verification work is carried out and then in exchange therefor, the third lead frame LF is supplied to the processing unit, and the die bonding shown in FIG. 8 and FIG. 9 is carried out with respect to the third lead frame LF. Subsequently, the third lead frame LF, the die bonding of which is complete, is stored into the rack 44A through the same processing as that of the first and second lead frames LF.

After all the three lead frames LF, the die bonding of which is complete, are stored into the rack 44A in this manner, the rack 44A is taken out (Step S215) and the information indicative of this fact is transferred to the main server MS through the management server 70S. Subsequently, the main server MS registers the rack ID (R0001) of the rack 44A obtained in advance and the substrate IDs (K0001, K0002, K0003) of the three lead frames LF stored in this rack 44A in association with each other.

That is, as shown in the column B of FIG. 33, the information indicative of the fact that the three lead frames LF with the substrate IDs of K0001, K0002, and K0003 have been stored into the rack 44A with the rack ID of R0001 is registered with the main server MS. Subsequently, this rack 44A is transported to the wire bonding process that is the next process.

Although illustration is omitted, once the above-described rack 44A having the three lead frames LF stored therein is transported to the next process, a new rack 44C is set to the unloader unit of the die bonding apparatus 70. Then, the two-dimensional code 31 of this rack 44C is read by the ID reader 50C of the unloader unit, and this rack ID is transferred to the management server 70S. This rack 44C is a rack, into which other three lead frames LF taken out from the stacker 41 of the loader unit following the above-described three lead frames LF with the substrate IDs (K0001, K0002, K0003) assigned thereto are to be stored. The rack ID of this rack 44C is R0003, and the substrate IDs of the three lead frames LF stored thereinto are scheduled to be K0004, K0005, and K0006.

The registration state of the rack management table at this point is shown in a column C of FIG. 33. That is, the following pieces of information are managed: the rack 44A (R0001) and the rack 44C (R0003) are in the die bonding process (S0002); there are the lead frames LF (K0001, K0002, K0003) in the rack 44A (R0001); and the rack 44C (R0003) is empty.

Note that, a series of these die-bonding works are continued until the transport unit (stacker 41) is verified to be empty in Step S110 in FIG. 27, and if the stacker 41 is determined to be empty, the taking-out work (exchange of the stacker 41) in the next step S111 is carried out. That is, the replenishment of the lead frame LF with respect to the loader unit is carried out.

Although not illustrated, in this exchange work, when the production of the same type name as the previous type name is suspended, the substrate (lead frame LF), the work in process of which is complete, is stored into the transport unit (rack 44A) on the unloader side, and this transport unit is transported to the next process. Moreover, if the substrate ID of the lead frame LF supplied from a new stacker 41 is determined to have the same type name (the same manufacturing lot), the processing of Step S108 and the subsequent steps in FIG. 27 are repeated.

Moreover, if the substrate ID (lead frame LF) that cannot be continuously worked is detected, or if the substrate ID without an instruction (scheduling) from the main server MS is detected, then it is determined as abnormal in Step S107 in FIG. 27, and the work is discontinued (Step S109) and the content of the error is displayed on the monitor 204.

Note that, the working history in the present die bonding process, as shown for example in the column B of FIG. 32, is recorded on a work-history database in the storage unit 103 of the main server MS together with the chip ID, the substrate ID, the material ID assigned to the material, such as the adhesive 9, the ID of a working station assigned to the die bonding apparatus 70, the ID of the working condition (working recipe) of the die bonding apparatus 70, the location information in the substrate (lead frame LF), and furthermore, a report on a working hour, and the like.

<Wire-Bonding Process>

Figure 10:
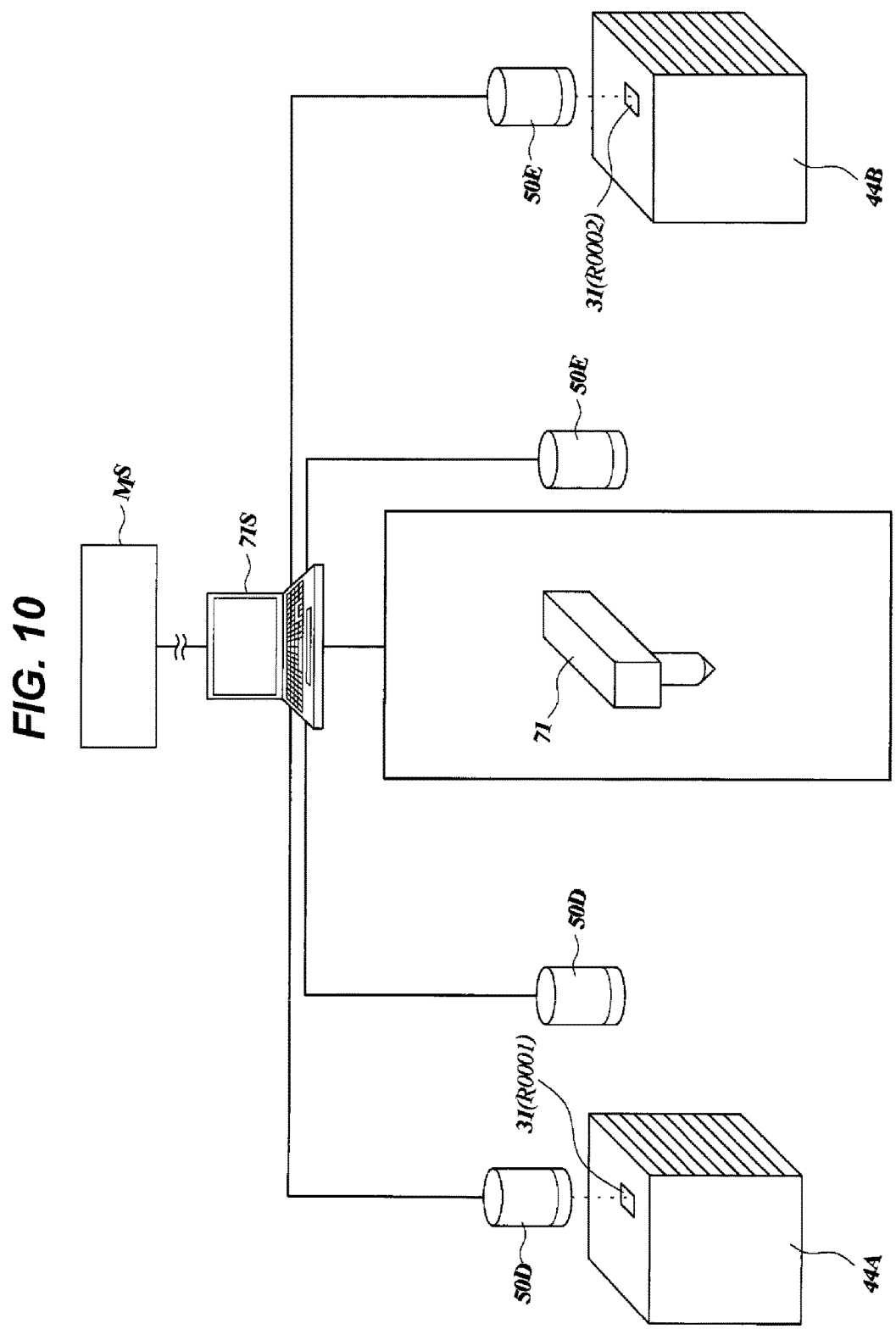
FIG. 10 is a conceptual diagram of a wire bonding process.

FIG. 10 is a conceptual diagram of the wire bonding process. In the loader unit of the wire bonding apparatus 71, there is installed an ID reader 50D coupled to the server (management server 71S) managing the wire bonding process. In the unloader unit of the wire bonding apparatus 71, there is installed an ID reader 50E coupled to the management server 71S.

Once the rack 44A transported to the wire bonding process is set to the loader unit of the wire bonding apparatus 71 (Step S101), the two-dimensional code 31 of the rack 44A is read by the ID reader 50D of the loader unit (Step S102), and its rack ID (R0001) is transferred to the management server 71S (Step S103).

Subsequently, the management server 71S requests the main server MS, which is its higher-level system, for the information regarding the rack 44A assigned with the rack ID of R0001. Then, the main server MS analyzes the request from the management server 71S to compare with a production plan imposed on this wire bonding apparatus 71, and determines that the reception of the present rack 44A is based on the production plan of this wire bonding apparatus 71.

Then, the main server MS transfers to the management server 71S the information indicative of the fact that the three lead frames LF assigned with the substrate IDs (K0001, K0002, K0003) are stored in the rack 44A. At this time, the main server MS determines that the rack 44A (R0001) is in a new process, and updates an in-process code of the rack 44A (R0001) from the die bonding process (S0002) to the wire bonding process (S0003).

Figure 11:
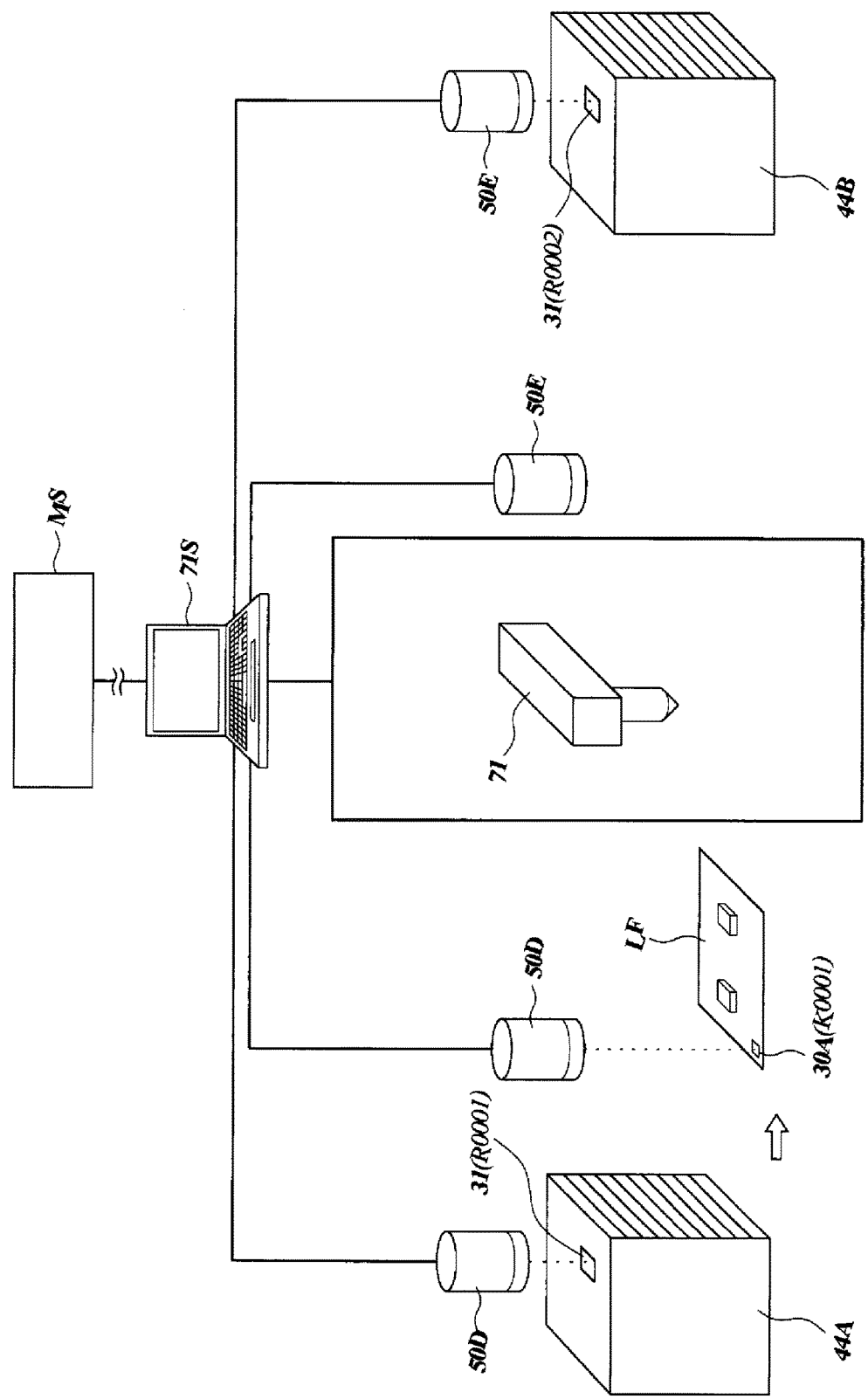
FIG. 11 is the conceptual diagram of the wire bonding process following FIG. 10.

Next, as shown in FIG. 11, the first lead frame LF is taken out from the inside of the rack 44A installed in the loader unit (Step S104). Subsequently, the two-dimensional code 30A of this lead frame LF is read by the ID reader 50D of the loader unit (Step S105), and its substrate ID (K0001) is transferred to the management server 71S (Step S106).

Next, the management server 71S checks the association between this substrate ID (K0001) and the rack ID (R0001) of the rack 44A, and verifies that this lead frame LF is the one taken out from the rack 44A (Step S107) and thereafter permits this lead frame LF to be supplied to the processing unit of the wire bonding apparatus 71.

Next, the first lead frame LF is supplied to the processing unit of the wire bonding apparatus 71 (Step S108). Note that, if the substrate ID (lead frame LF) that cannot be processed is detected, it is determined as abnormal and the work is discontinued (Step S109) and the content of the error is displayed on the monitor unit 204.

On the other hand, after the presence or absence (preparation status) of a rack in the unloader unit of the wire bonding apparatus 71 is verified (Step S201), if a rack has not been set yet, a rack 44B is set to the unloader unit of the wire bonding apparatus 71 (Step S202). Then, the two-dimensional code 31 of the rack 44B is read by the ID reader 50E of the unloader unit (Step S203), and this rack ID (R0002) is transferred to the management server 71S (Step S204).

Then, the management server 71S requests the main server MS, which is its higher-level system, for the information regarding the rack 44B assigned with the rack ID "R0002". At this time, if the rack 44B has not been used yet, the information indicating that the inside is empty (the state where the lead frame LF is not stored) is generated in the main server MS, and this information is transferred to the management server 71S from the main server MS.

Then, the main server MS associates the substrate IDs (K0001, K0002, K0003) of the three lead frames LF stored in the rack 44A of the loader unit with the rack ID (R0002) of the rack 44B of the unloader unit, and registers the rack 44B of the unloader unit as a rack for storing the three lead frames LF assigned with the substrate IDs (K0001, K0002, K0003), and transfers this information to the management server 71S.

The registration state of the rack management table at this point is shown in a column D of FIG. 33. That is, the following pieces of information are managed: the rack 44A (R0001) and the rack 44B (R0002) are in the wire bonding process (S0003); there are the lead frames LF (K0001, K0002, K0003) in the rack 44A (R0001); each lead frame LF in the rack 44A (R0001) is scheduled to be stored into the rack 44B (R0002); and the rack 44B (R0002) is empty.

Figure 12:
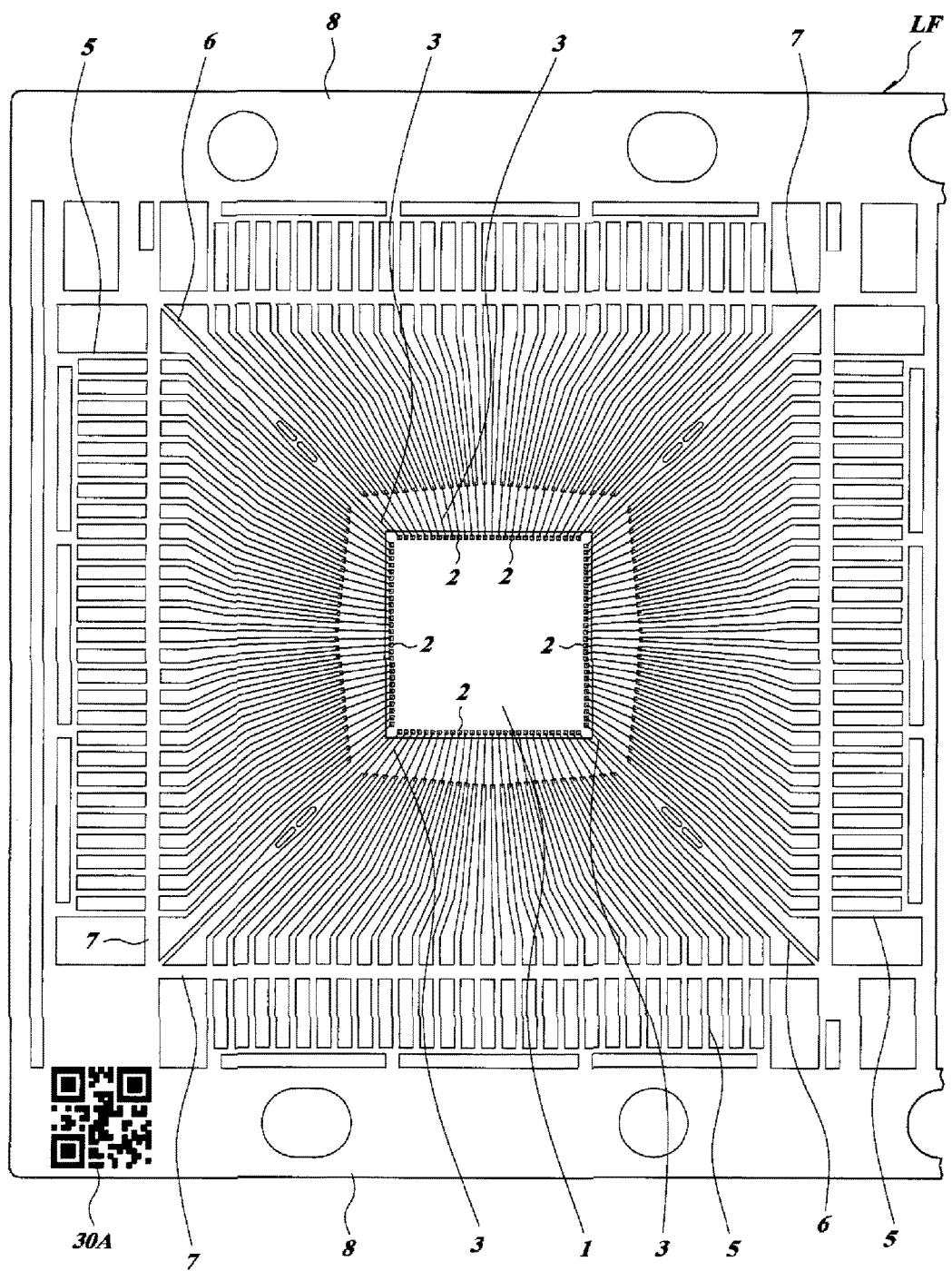
FIG. 12 is an enlarged plan view of a main part of the lead frame showing a state where a semiconductor chip and a lead are coupled with a wire.

As described above, once the allocation of management information constituted by correlation between the rack 44A and the rack 44B is completed, then as shown in FIG. 12 (a plan view showing an enlarged part of the lead frame LF), a bonding pad 2 of the semiconductor chip 1 mounted on this lead frame LF is electrically coupled to a lead 5 with a wire (conductive component) 3 formed by gold (Au) and the like, by ball-bonding using heat and ultrasonic vibration, for example.

At this time, when a defective semiconductor chip was mounted on the substrate in the previous process (die bonding process) and furthermore this information (information indicative of the fact that the defective semiconductor chip is mounted) was recorded on the main server MS in the previous process (die bonding process), only the device region having a nondefective semiconductor chip mounted thereon can be selected and the wire bonding process can be carried out. As a result, the amount of material (here, wire) used can be reduced and thus the manufacturing cost can be reduced.

Note that, as with a variation of the die bonding process, the verification of the presence or absence (preparation status) of a rack in the unloader unit of the wire bonding apparatus 71 may be made before a substrate (lead frame LF) is supplied to the processing unit.

Here, the detail of the wire bonding process in the present First Embodiment is described below. First, the working condition (working recipe) of the wire bonding apparatus 71 is verified and this working condition is downloaded to the storage unit in the wire bonding apparatus 71 (Step S301). Then, the position to be worked is set to an initial position in the substrate (lead frame LF) (Step S302). Next, after the wire and the like are prepared (Step S303), a wire bonding work is carried out (Step S304). Then, once the completion of the wire bonding work of the first semiconductor chip 1 is verified, the working result is registered with the main server MS via the management server 70S (Step S305).

The registration state of the working history DB to be registered with the main server MS at this point is shown in the column C of FIG. 32. That is, a fact that a chip with the chip ID of "K001X01Y01" has been wire-bonded at the position of Location "1" in a plurality of device regions provided in the lead frame LF with the substrate ID (K0001) by the wire bonding apparatus (ST003005) based on the working recipe (Re003031) is recorded (Step S306).

Subsequently, other wire bonding position in the lead frame LF is checked, and if it is determined that the wire bonding work is further required for the same lead frame LF (Step S307), the position to be worked in the lead frame LF for wire bonding is moved to the next position (Location "2" in the lead frame LF) (Step S308). Subsequently, the works (operations) in Step S303 and the subsequent steps in FIG. 29 are repeated.

Moreover, in the above-described Step S307, if it is determined that all the wire bonding works with respect to the lead frame LF have been finished, the wire bonding work is completed. Then, once a series of die-bonding works are complete, the processing in Step S206 and the subsequent steps in FIG. 28 are continued. That is, once it is verified that the wire bonding work with respect to the same lead frame LF is completed, the first lead frame LF, the wire bonding of which is complete, is transported to the unloader unit from the processing unit as shown in FIG. 14.

Figure 14:
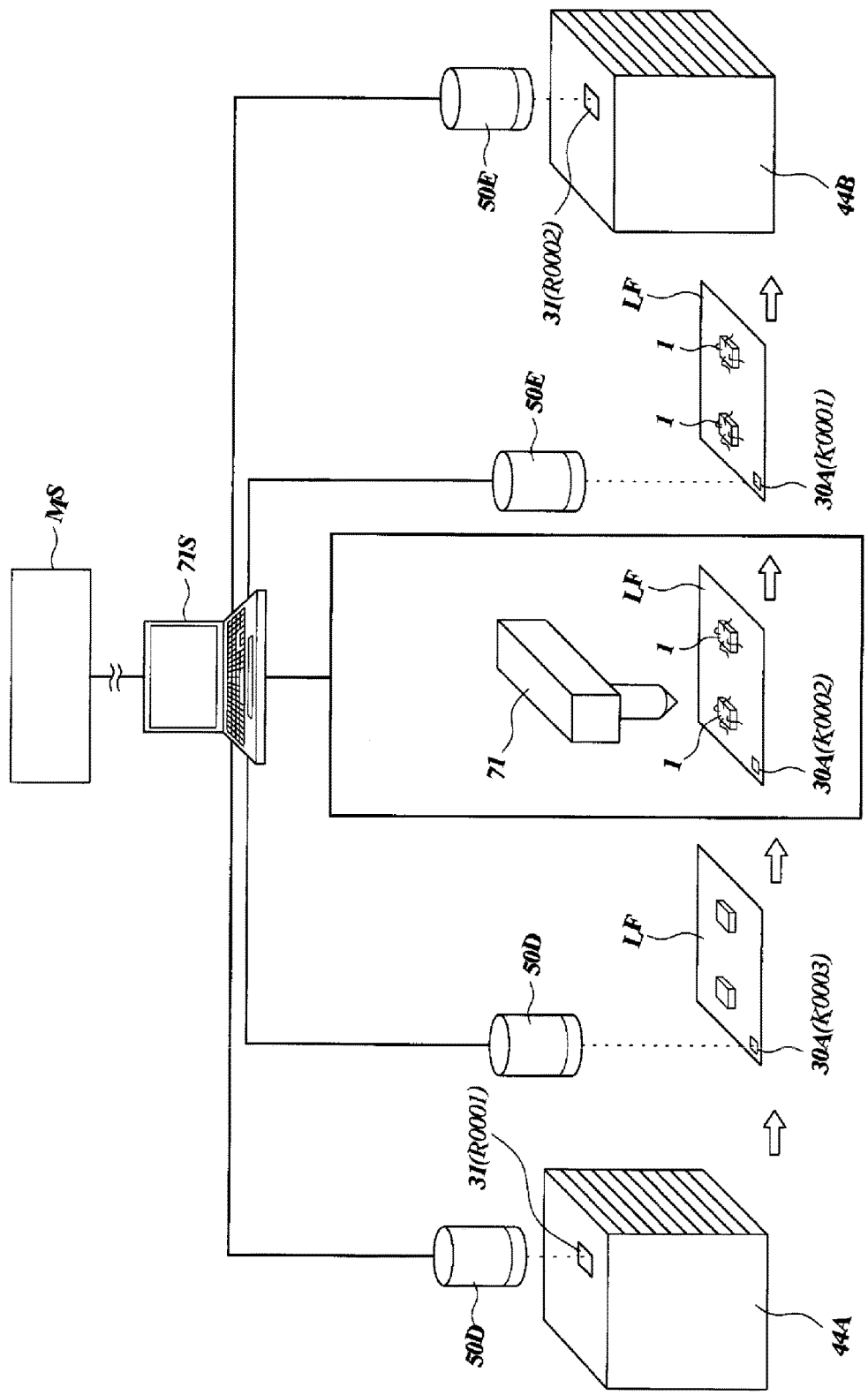
FIG. 14 is the conceptual diagram of the wire bonding process following FIG. 13.

Then, once the first lead frame LF is transported to the unloader unit from the processing unit, then as shown in FIG. 14, the two-dimensional code 30A is read by the ID reader 50E of the unloader unit (Step S208) and the substrate ID (K0001) is inquired about with the management server 71s (Step S209).

Then, as a result of the inquiry, if this substrate ID (K0001) is verified to match the substrate ID (K0001) of the first lead frame LF read by the ID reader 50D of the loader unit, the management server 71S permits this lead frame LF to be stored into the rack 44B (Step S210).

Here, if as a result of the inquiry in the above-described Step S209, this substrate ID is verified not to match the substrate ID read by the ID reader 50B of the loader unit, it is determined as an abnormal circumstance and the work is discontinued (Step S212). That is, the wire bonding work is discontinued and the content of the error is displayed on the monitor unit 204.

The lead frame LF permitted in the above-described Step S209 is subsequently stored into the rack 44B, as shown in FIG. 14 (Step S211).

Next, the management server 71S releases the association between the substrate ID (K0001) of the first lead frame LF and the rack ID (R0001) of the rack 44A, and associates the substrate ID (K0001) of the first lead frame LF with the rack ID (R0002) of the rack 44B, and transfers this information to the main server MS (Step S213).

Subsequently, it is determined whether or not the rack 44B is full (Step S214), and if it is not full, in other words if it is determined that this rack 44B still can store the lead frame LF, the processing of Step S110 and the subsequent steps shown in FIG. 27 are carried out. Note that, if it is determined that the rack 44B is full, the rack 44B is taken out from the unloader side and this result (status) is recorded on the main server MS via the management server 71S (Step S215).

If it is verified that the first lead frame LF, the wire bonding work of which is complete, has been transported to the unloader unit from the processing unit of the wire bonding apparatus 71 and that the rack 44B is not full, the storage status of the rack 44A on the loader side is checked (Step S110). If it is determined that there is any remaining lead frame LF in the rack 44A, Step S104 and the subsequent steps shown in FIG. 27 are carried out again and the second lead frame LF is supplied to the processing unit from the rack 44A. Then, the wire bonding work shown in FIG. 12 is carried out with respect to the second lead frame LF.

Figure 13:
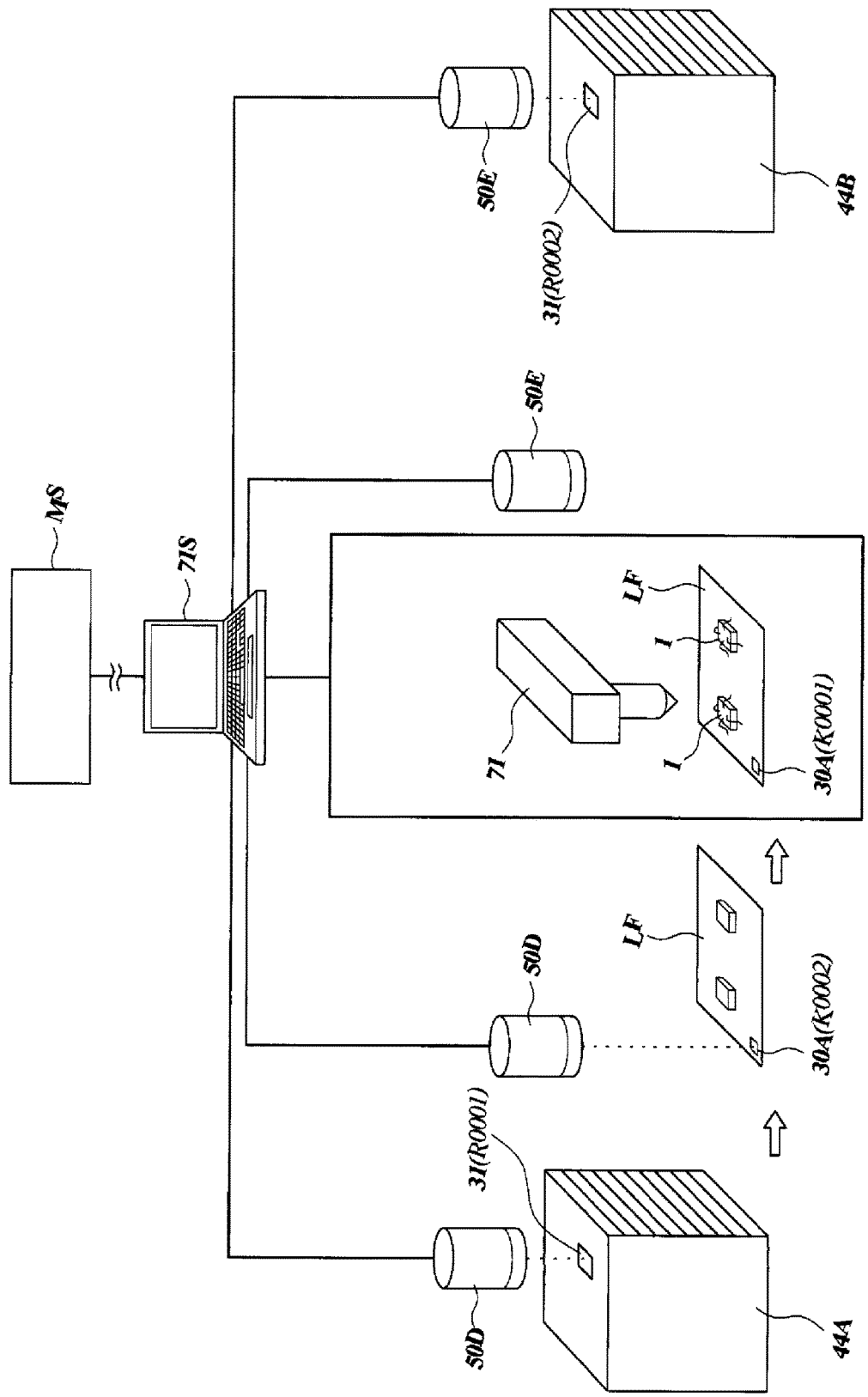
FIG. 13 is the conceptual diagram of the wire bonding process following FIG. 11.

To summarize the above description, once the first lead frame LF is supplied to the processing unit, the second lead frame LF is taken out from the inside of the rack 44A installed in the loader unit, as shown in FIG. 13. Then, the two-dimensional code 30A of the second lead frame LF is read by the ID reader 50D of the loader unit, and the substrate ID (K0002) is transferred to the management server 71S. Next, the management server 71S checks the association between this substrate ID (K0002) and the rack ID (R0001) of the rack 44A, and verifies that this lead frame LF is the one taken out from the rack 44A and then permits this lead frame LF to be supplied to the processing unit.

On the other hand, once the second lead frame LF is supplied to the processing unit, then as shown in FIG. 14, the third lead frame LF is taken out from the inside of the rack 44A installed in the loader unit. Subsequently, the two-dimensional code 30A of the third lead frame LF is read by the ID reader 50D of the loader unit, and the substrate ID (K0003) is transferred to the management server 71S.

Next, the management server 71S checks the association between this substrate ID (K0003) and the rack ID (R0001) of the rack 44A, and verifies that this lead frame LF is the one taken out from the rack 44A and thereafter permits this lead frame LF to be supplied to the processing unit.

Figure 15:
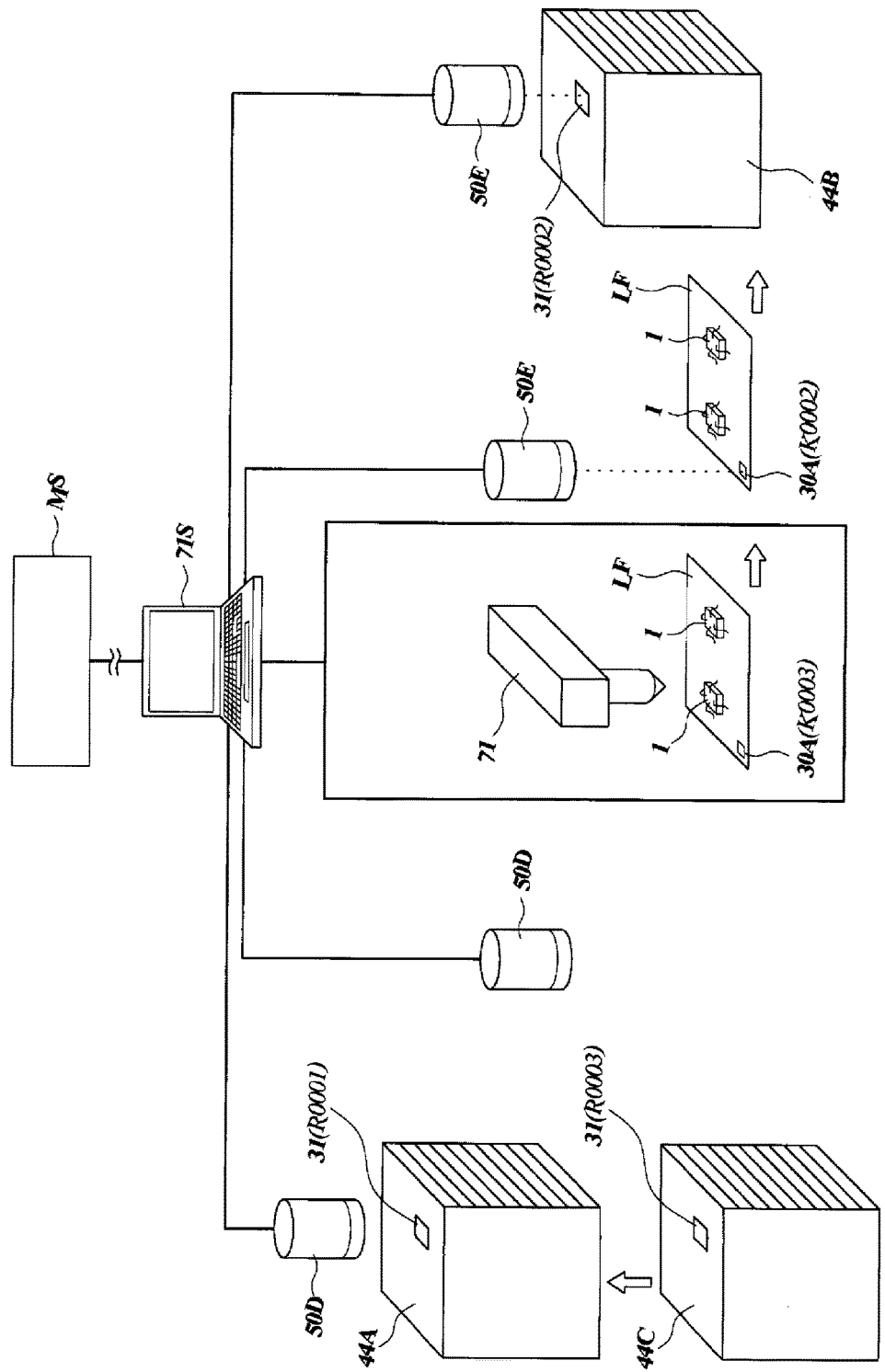
FIG. 15 is the conceptual diagram of the wire bonding process following FIG. 14.

Next, as shown in FIG. 15, once the second lead frame LF, the wire bonding of which is complete, is transported to the unloader unit from the processing unit, then in exchange therefor, the third lead frame LF is supplied to the processing unit. Then, the wire bonding shown in FIG. 12 is carried out with respect to the third lead frame LF.

Figure 16:
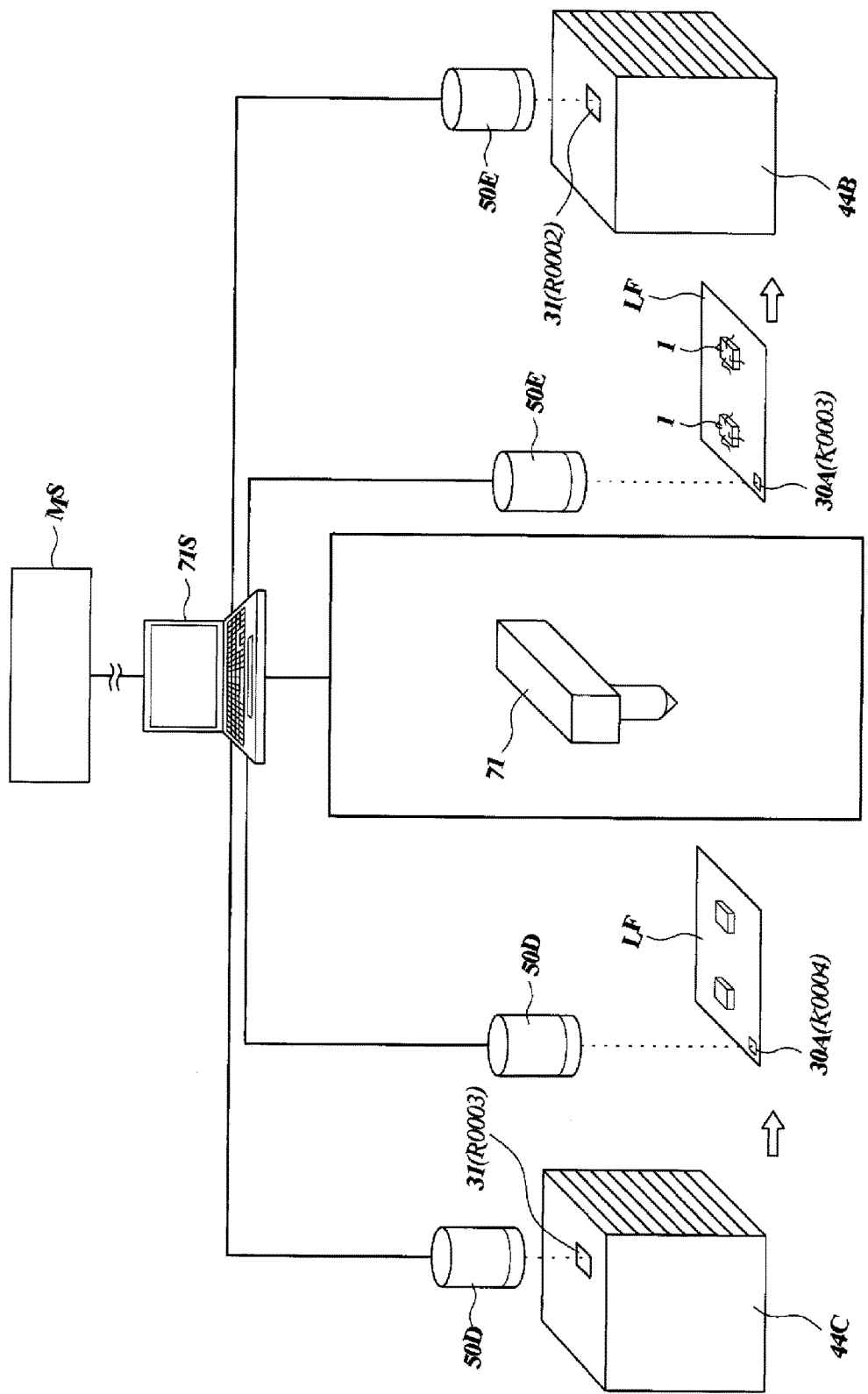
FIG. 16 is the conceptual diagram of the wire bonding process following FIG. 15.

Moreover, once the second lead frame LF is transported from the processing unit to the unloader unit, then as shown in FIG. 15, the two-dimensional code 30A is read by the ID reader 50E of the unloader unit, and the substrate ID (K0002) is transferred to the management server 71S. Then, once this substrate ID (K0002) is verified to match the substrate ID (K0002) of the second lead frame LF read by the ID reader 50D of the loader unit, the management server 71S permits this lead frame LF to be stored into the rack 44B. As a result, as shown in FIG. 16, the second lead frame LF is stored into the rack 44B.

Next, the management server 71S releases the association between the substrate ID (K0002) of the second lead frame LF and the rack ID (R0001) of the rack 44A, and associates the substrate ID (K0002) of the second lead frame LF with the rack ID (R0002) of the rack 44B, and transfers this information to the main server MS.

On the other hand, when the third lead frame LF taken out from the rack 44A is supplied to the processing unit and the inside of the rack 44A becomes empty, the rack 44A is removed from the loader unit of the wire bonding apparatus 71 and a new rack 44C is set to the loader unit.

Subsequently, the two-dimensional code 31 of this rack 44C is read by the ID reader 50D of the loader unit, and the rack ID (R0003) is transferred to the management server 71S.

Next, the management server 71S requests the main server MS, which is its higher-level system, for the information regarding the rack 44C assigned with the rack ID of R0003. Then, the information indicative of the fact that the three lead frames LF assigned with the substrate IDs (K0004, K0005, K0006) are stored in the rack 44C is transferred to the management server 71S from the main server MS.

Next, as shown in FIG. 16, the first lead frame LF (substrate ID is "K0004") is taken out from the rack 44C, and on the other hand, the third lead frame LF (substrate ID is "K0003"), the wire bonding of which is complete, is taken out from the processing unit.

Here, as with the present First Embodiment, in the case where identification information (here, two-dimensional code) has not been applied (employed), and before all the substrates ("K0001" to "K0003") discharged from the transport unit (here, the rack 44A) set to the loader unit are collected by the transport unit (here, the rack 44B) set to the unloader unit, if a new transport unit (here, the rack 44C) is set to the loader unit and furthermore a new substrate (here, "K0004") is discharged (supplied) from this transport unit, then even this new substrate (here, "K0004") might be stored (mixed) into the transport unit (here, the rack 44B) already set to the unloader unit.

When the substrate is managed in the unit of a rack, in other words, when the rack is associated (linked) with the substrate to be stored into this rack, it is necessary to prevent the substrate, which should be stored into other rack, from being mixed. For example, until it is verified that all the substrates ("K0001" to "K0003") discharged from the transport unit (here, the rack 44A) set to the loader unit have been collected by the transport unit (here, the rack 44B) set to the unloader unit, a new transport unit (here, the rack 44C) will not be set to the loader unit, or even if a new transport unit is set to the loader unit, the substrate is preferably not discharged (supplied) from this new transport unit.

However, with the countermeasure as described above, the throughput of the target process (here, the wire bonding process) will decrease.

In contrast, in the present First Embodiment, identification information (two-dimensional code) is assigned to each of the components and materials to use (here, at least the substrate and the rack), and with this identification information the progress status is managed (monitored). Therefore, before all the substrates ("K0001" to "K0003") are collected by the transport unit (here, the rack 44B), even if a new substrate (here, "K0004") is supplied to the inside of the apparatus, it is possible to prevent this supplied new substrate from mixing into other transport unit.

Note that, even if the substrate is not managed in the unit of a rack, in other words, as shown in FIG. 30B, even if the substrates are collected in different racks, and if a substrate is the one allocated to the same manufacturing lot, a substrate scheduled to be collected by other rack (here, a rack 44D) may be stored (collected, mixed) into a different rack (here, the rack 44B).

Next, once the third lead frame LF, the wire bonding of which is complete, is transported to the unloader unit from the processing unit, the two-dimensional code 30A is read by the ID reader 50E of the unloader unit, and if this substrate ID (K0003) is verified to match the substrate ID (K0003) of the third lead frame LF read by the ID reader 50D of the loader unit, the third lead frame LF is stored into the rack 44B.

Next, the management server 71S releases the association between the substrate ID (K0003) of the third lead frame LF and the rack ID (R0001) of the rack 44A, and associates the substrate ID (K0003) of the third lead frame LF with the rack ID (R0002) of the rack 44B, and transfers this information to the main server MS.

Then, the main server MS registers the rack ID (R0002) of the rack 44B and the substrate IDs (K0001, K0002, K0003) of the three lead frames LF stored in this rack 44B in association with each other. That is, as shown in a column E of FIG. 33, the information indicative of the fact that the three lead frames LF with the substrate IDs of K0001, K0002, and K0003 have been stored into the rack 44B with the rack ID of R0002 is registered with the main server MS.

Moreover, the management server 71S checks the storing status of the rack 44B, and if it is determined that the rack 44B is full, i.e., all the number of substrates to be stored into this rack 44B have been stored into the rack 44B, the number being registered in advance with the server, this rack 44B is taken out from the unloader unit and the resulting state is recorded on the main server MS via the management server 71S.

On the other hand, once the first lead frame LF is taken out from the inside of the rack 44C installed in the loader unit, the two-dimensional code 30A is read by the ID reader 50D of the loader unit, and the substrate ID (K0004) is transferred to the management server 71S. Next, the management server 71S checks the association between this substrate ID (K0004) and the rack ID (R0003) of the rack 44C, and verifies that this lead frame LF is the one taken out from the rack 44C and thereafter permits this lead frame LF to be supplied to the processing unit.

Figure 17:
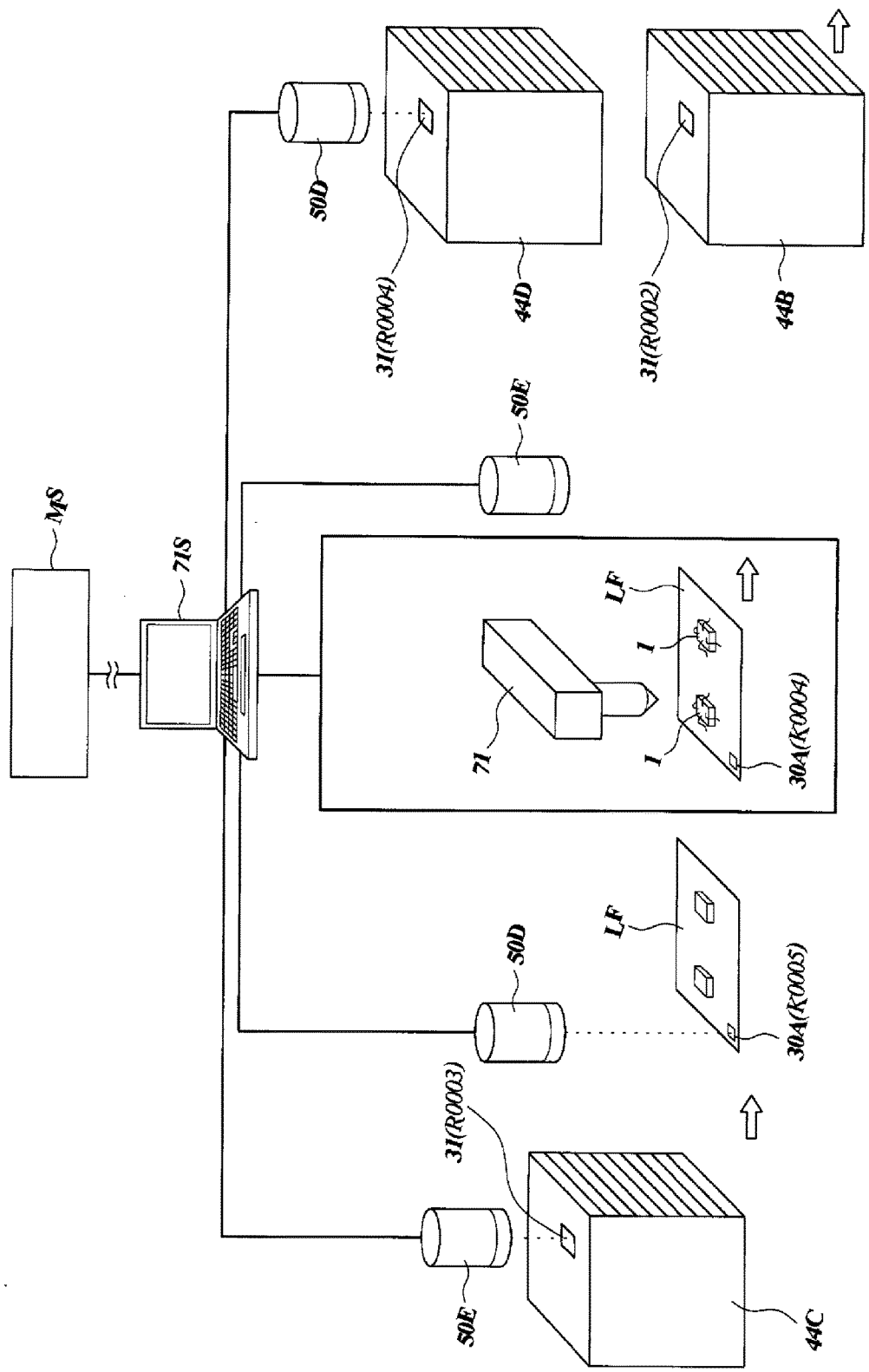
FIG. 17 is the conceptual diagram of the wire bonding process following FIG. 16.

Next, as shown in FIG. 17, once the rack 44B, in which three lead frames LF with the substrate IDs (K0001, K0002, K0003) are stored, is removed from the unloader unit of the wire bonding apparatus 71 and is transported to the molding process that is the next process, then a new empty rack 44D is set to the unloader unit.

Subsequently, the two-dimensional code 31 of the rack 44D is read by the ID reader 50E of the unloader unit, and this rack ID (R0004) is transferred to the management server 71S.

Next, the management server 71S requests the main server MS for the information regarding the rack 44D assigned with the rack ID of R0004. Then, the information indicative of the fact that the inside of the rack 44D is empty is transferred to the management server 71S from the main server MS.

Next, the main server MS associates the substrate IDs (K0004, K0005, K0006) of three lead frames LF stored in the rack 44C of the loader unit with the rack ID (R0004) of the rack 44D of the unloader unit, and registers the rack 44D of the unloader unit as a rack for storing the three lead frames LF assigned with the substrate IDs (K0004, K0005, K0006), and transfers this information to the management server 71S.

The registration state of the rack management table at this point is shown in the column E of FIG. 33. That is, the following pieces of information are managed: the rack 44A (R0001) is empty and reusable, the work for the rack 44B (R0002) in the wire bonding process is already finished; and furthermore, the rack 44C (R0003) and the rack 44D (R0004) are in the wire bonding process. At this time, in the rack 44C (R0003), the following pieces of information are also managed: there are the lead frames LF (K0004, K0005, K0006) in the rack 44C (R0003); the lead frame LF in the rack 44C (R0003) is scheduled to be stored into the rack 44D (R0004); and furthermore, the rack 44D (R0004) is empty.

Although illustration is omitted, subsequently, the same wire bonding carried out with respect to the three lead frames LF taken out from the rack 44A is sequentially carried out with respect to the three lead frames LF taken out from the rack 44C of the loader unit one by one. Then, the lead frames LF, the wire bonding of which is complete, are sequentially transported to the unloader unit, and if this substrate ID is verified to match the substrate ID of the relevant lead frame LF read by the loader unit, the relevant lead frame LF is stored into the rack 44D.

<Molding (Sealing) Process>

Although illustration is omitted, once the rack 44B, in which three lead frames LF with the substrate IDs (K0001, K0002, K0003) are stored, is set to the loader unit in the molding process, the two-dimensional code 31 of the rack 44B is read in the same manner as in the above-described wire bonding process. Then, once the substrate IDs (K0001, K0002, K0003) of three lead frames LF stored in the relevant rack 44B are confirmed, the first lead frame LF is taken out from the inside of the rack 44B.

Next, when the two-dimensional code 30A of this lead frame LF is read in the same manner as in the above-described wire bonding process and it is verified that this lead frame LF is the one taken out from the rack 44B, molding of this lead frame LF is carried out in the processing unit of a molding apparatus.

Moreover, although illustration is omitted, an empty rack 44E is newly set to the unloader unit in the molding process. Then, the two-dimensional code 31 of this rack 44E is read in the same manner as in the above-described wire bonding process, and the rack ID (R0005) is transferred to the management server of the molding apparatus.

Then, the main server MS associates the substrate IDs (K0001, K0002, K0003) of the three lead frames LF stored in the rack 44B of the loader unit with the rack ID (R0005) of the rack 44E of the unloader unit, and registers the rack 44E of the unloader unit as the rack for storing the three lead frames LF assigned with the substrate IDs (K0001, K0002, K0003).

Figure 18:
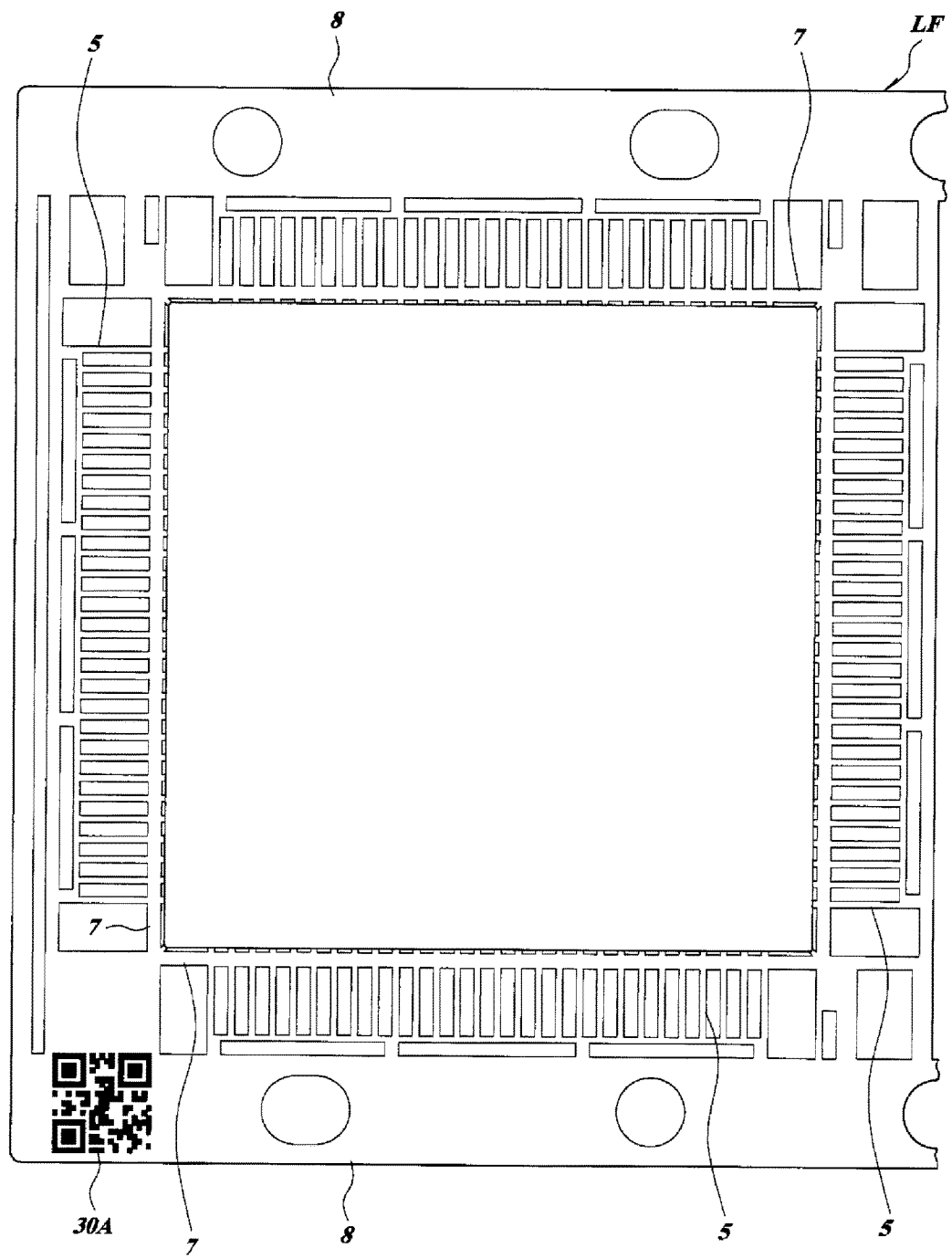
FIG. 18 is an enlarged plan view of the main part of the lead frame showing a state where a semiconductor chip, a wire, a chip mounting region, a part of each lead, and a part of each suspension lead are sealed with mold resin.

After the first lead frame LF is transported to the processing unit of the molding apparatus, as shown in FIG. 18, the semiconductor chip 1, the wire 3, the chip mounting region 4, each part of the lead 5 (inner lead), and each part of the suspension lead 6 are sealed with resin (molding resin) so as to form a sealing body (resin sealed body) 10. At this time, the two-dimensional code 30A formed in the outer frame portion 8 of the lead frame LF is exposed to an outside of the sealing body 10.

<Tie Bar Cutting Process>

Figure 19:
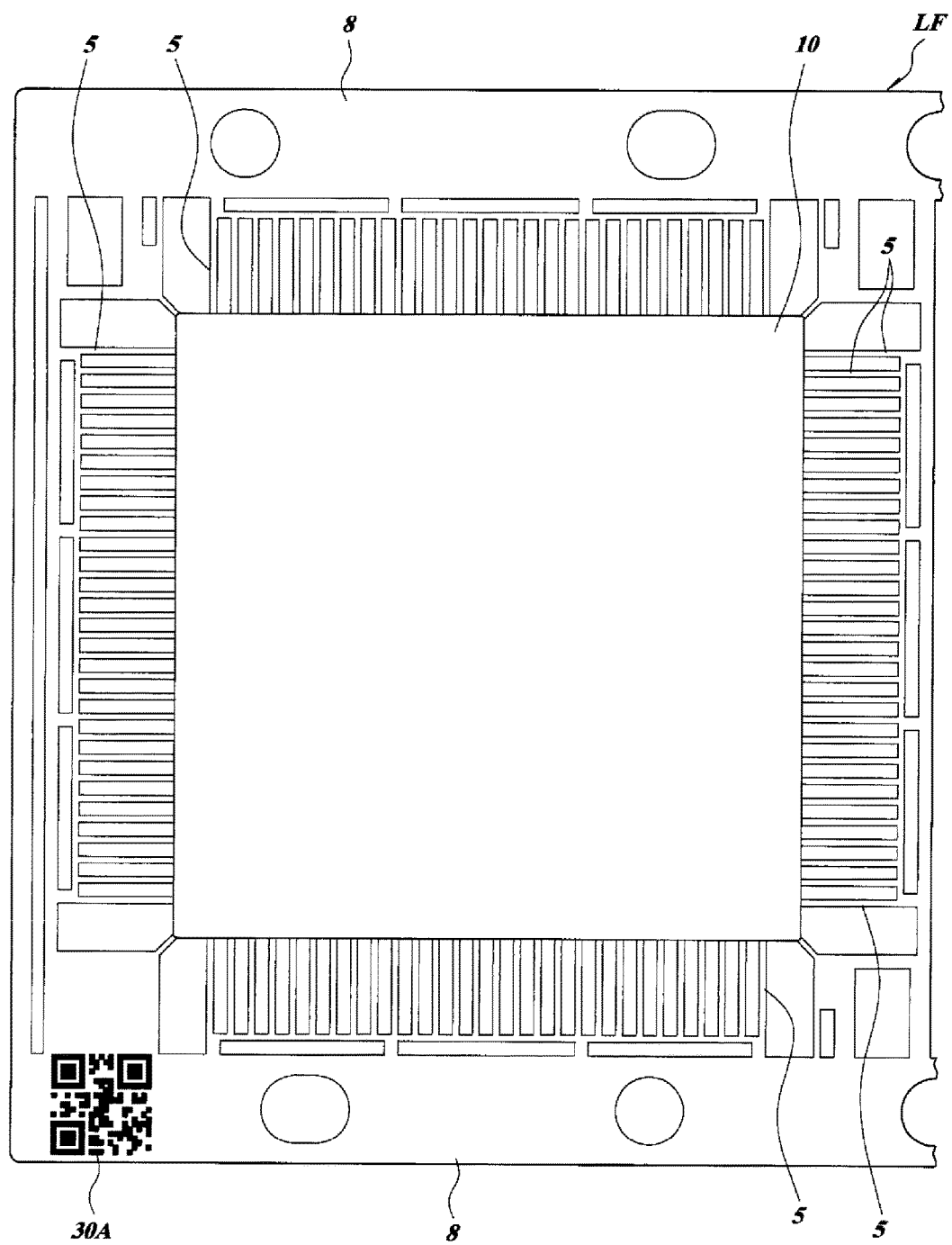
FIG. 19 is an enlarged plan view of a main part of the lead frame showing a state where a tie bar is cut.

Next, as shown in FIG. 19, the tie bar 7 of the lead frame LF exposed to the outside of the sealing body 10 is cut, and each lead (outer lead) 5 is electrically isolated from each other. Note that, the tie bar 7 is a portion for preventing the resin from leaking to an outside of the region, in which the sealing body 10 is formed, in the previous resin sealing process.

Next, the first lead frame LF is stored into a single-wafer type baking furnace and the curing of the resin constituting the sealing body 10 is carried out, and thereafter the first lead frame LF is stored into the rack 44E set to the unloader unit in the molding process.

When the first lead frame LF is stored into the rack 44E, the two-dimensional code 30A is read by the unloader unit as in the above-described wire bonding process, and the substrate ID (K0001) is checked with the substrate ID (K0001) of the relevant lead frame LF read in the loader unit.

Next, the management server in the molding process releases the association between the substrate ID (K0001) of the first lead frame LF and the rack ID (R0002) of the rack 44B, and associates the substrate ID (K0001) of the first lead frame LF with the rack ID (R0005) of the rack 44E, and transfers this information to the main server MS.

Subsequently, the second and third lead frames LF are sequentially taken out from the rack 44B of the loader unit and are subjected to the above-described molding and tie-bar cutting and thereafter are stored into the rack 44E of the unloader unit. Subsequently, the rack 44E, in which the three lead frames LF with the substrate IDs (K0001, K0002, K0003) are stored, is transported to the laser marking process that is the next process.

When the rack 44B set to the loader unit in the molding process becomes empty, the rack 44B is removed from the loader unit and a new rack 44C is set to the loader unit. Then, the above-described molding and tie-bar cutting are carried out with respect to the three lead frames LF with the substrate IDs (K0004, K0005, K0006) that are taken out from the rack 44C one by one.

<Laser Marking Process>

Figure 20:
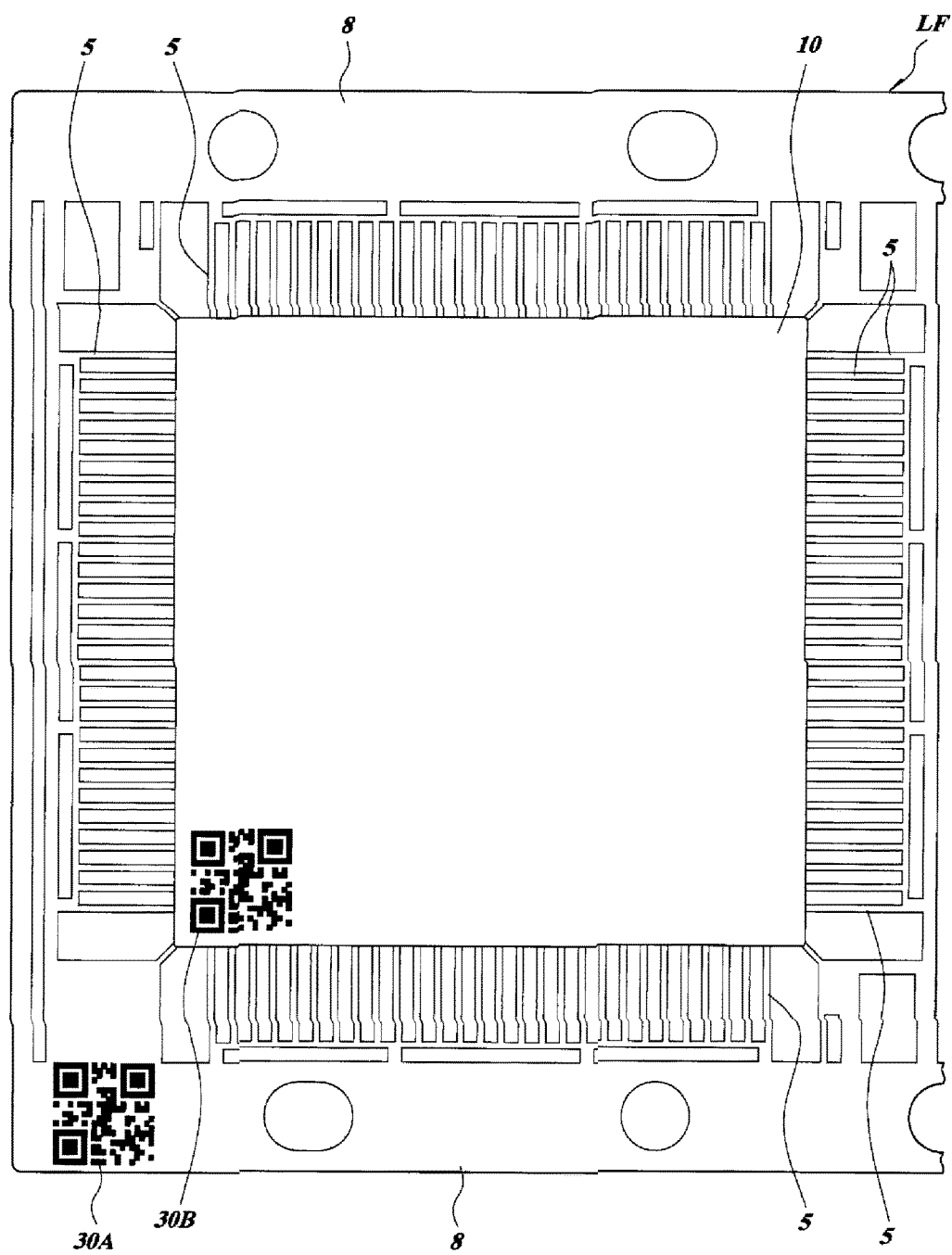
FIG. 20 is an enlarged plan view of the main part of the lead frame in which a two-dimensional code is marked on the surface of a sealing body.

As shown in FIG. 20, in a laser marking process, a unique substrate ID (identification information, identification code) for identifying an individual device region provided in the lead frame LF is marked on the surface of the sealing body 10 formed in each device region in the lead frame LF, in the form of a two-dimensional code 30B.

In a forming process of the two-dimensional code 30B, the two-dimensional code 30A marked on the outer frame portion 8 of the lead frame LF is first read by an ID reader, and the substrate ID of the lead frame LF is transferred to the management server in the laser marking process. Next, the management server obtains the information regarding the lead frame LF with the substrate ID from the main server MS that is its higher-level system, and based on this information assigns a unique substrate ID to the sealing body 10 formed in each device region of the lead frame LF.

That is, in the present First Embodiment, an example has been described, in which two semiconductor chips are arranged over one lead frame LF. Here, the arrangement position of a semiconductor chip in the lead frame LF is recorded as Location "1" or "2" on the working history DB registered with the main server 100, as shown in FIG. 32. Accordingly, by inquiring for the substrate ID (identification information, identification code) of the lead frame LF, the chip ID (identification information, identification code) of a semiconductor chip present at each location in the lead frame LF can be obtained and this chip ID may be also simply used as the substrate ID. Moreover, based on the information including these chip IDs, a further unique substrate ID may be assigned.

The substrate ID marked on the surface of the sealing body 10 of the lead frame LF in the form of the two-dimensional code 30B may be the same as the substrate ID of the two-dimensional code 30A marked on the outer frame portion 8 of the lead frame LF, or may be the one including this ID, or may differ. That is, a substrate ID in an appropriate form (level) is selected in advance taking into consideration the range (depth) in tracing an individual product after product shipment.

Because usually the surface area of the sealing body 10 is larger than the area of the outer frame portion 8, the substrate ID may be marked on the surface of the sealing body 10 in the form of a one-dimensional barcode. Other than this, the form of a code as shown in FIG. 56 or the form of a code as shown in FIG. 58 may be employed. Furthermore, the substrate ID may be marked on the back side of the sealing body 10.

FIGS. 21A and 21B are conceptual diagrams showing a method of marking the two-dimensional code 30B, in which FIG. 21A is a side view seen from a direction parallel to the transport direction of the lead frame LF and FIG. 21B is a side view seen from a direction perpendicular to a transport direction of the lead frame LF. The reference numeral 11 in the view represents a guide rail of a laser marking apparatus and 12 represents a transport claw.

In order to mark the two-dimensional code 30B on the surface of the sealing body 10 formed in the lead frame LF, the two-dimensional code 30A marked on the outer frame portion 8 of the lead frame LF is first read using an ID reader 50F and the substrate ID of the lead frame LF is identified.

Note that, as shown in the same view, in transporting the lead frame LF while holding it with the guide rail 11, only the lower surface of the lead frame LF is held, and therefore by disposing the ID reader 50F above the lead frame LF, the two-dimensional code 30A can be easily read. Moreover, in reading the two-dimensional code 30A using the ID reader 50F, it is preferable to stop the guide rail 11 or to move the lead frame LF at a low speed.

Next, the surface of each sealing body 10 formed in the lead frame LF is sequentially irradiated with a laser beam LB, and the two-dimensional code 30B is marked, corresponding to the substrate ID of the relevant lead frame LF. Although illustration is omitted, in marking the two-dimensional code 30B on the surface of the sealing body 10, a mark for displaying the product information (a product type name, a customer logo mark, a production code, and the like) of a QFP is additionally marked on the surface of each sealing body 10, so that a marking process can be finished at one time and therefore the manufacturing process can be simplified.

Next, it is verified using another ID reader 50G whether or not the two-dimensional code 30B (and mark) has been reliably marked, and its result is associated with the substrate ID of the relevant lead frame LF and stored into the main server MS.

Once the two-dimensional code 30B is marked in this manner on the three lead frames LF transported to the laser marking process, these lead frames LF are stored into a new rack and transported to the next process (outer plating process).

Note that, also in the laser marking process and in each process following the laser marking process, a rack ID of the above-described rack is associated with the substrate ID of the lead frame LF stored into the rack. Then, in taking out a lead frame LF from a rack set to the loader unit in each process or in storing a lead frame LF, the processing of which is complete, into another rack set to the unloader unit in the relevant process, the association between the rack ID of a rack and the substrate ID of a lead frame LF is checked, but since the content thereof has been described in detail in the previous process, the duplicated description is omitted below.

<Outer Plating Process>

In the outer plating process, the lead frame LF, the marking of the above-described two-dimensional code 30B (and mark) of which is complete, is immersed into an electrolytic plating tub, and a solder plated layer (not shown) formed by a tin (Sn) alloy or the like is formed on the surface of the lead frame LF exposed to the outside of the sealing body 10.

Figure 22:
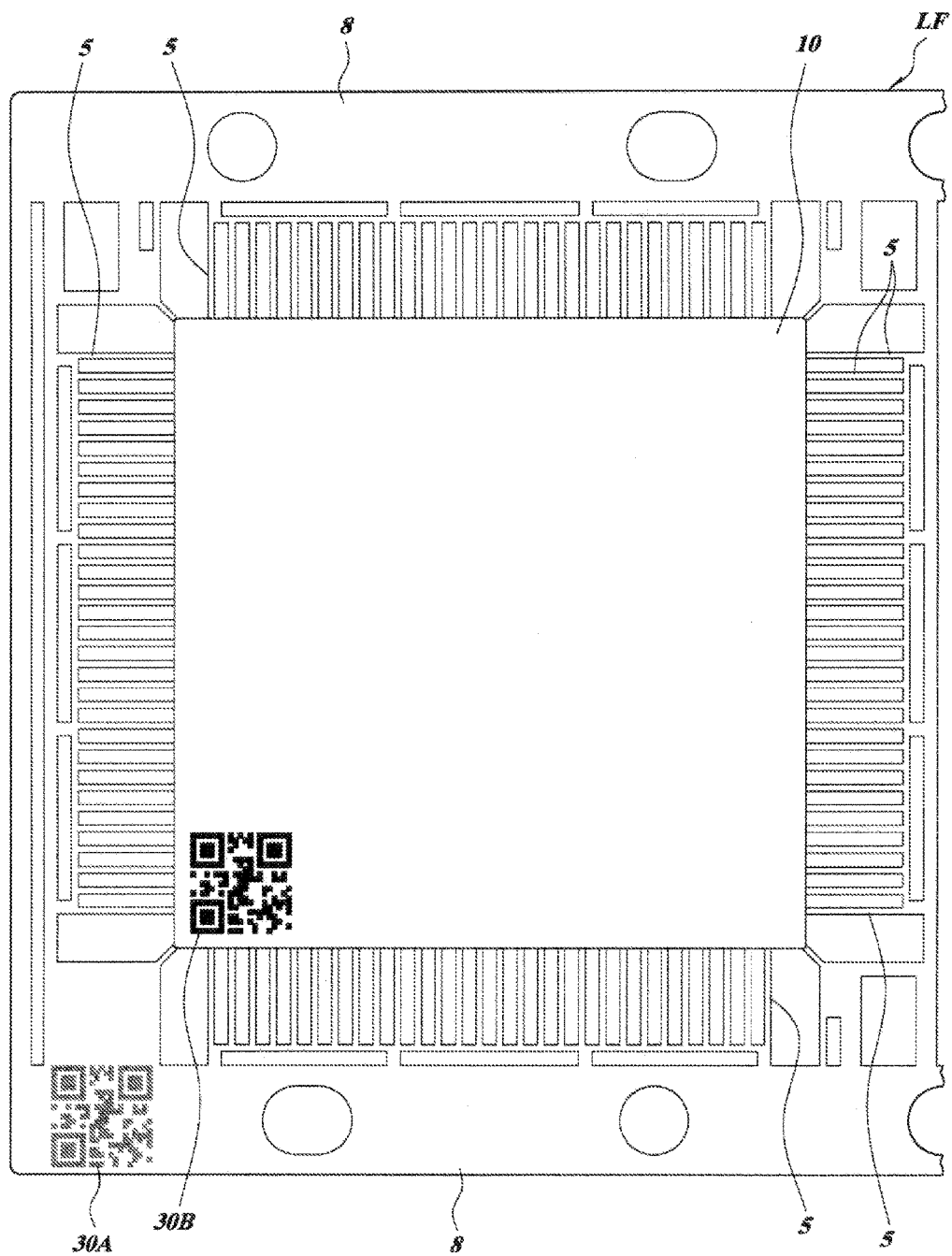
FIG. 22 is an enlarged plan view of the main part of the lead frame after an outer plating process.

Here, when the solder plated layer is formed on the surface of the lead frame LF exposed to the outside of the sealing body 10, the plated layer is also formed on the surface of the original two-dimensional code 30A marked on the outer frame portion 8 of the lead frame LF, and therefore it is difficult to read this two-dimensional code 30A with the ID reader, as shown in FIG. 22. However, in the laser marking process prior to the outer plating process, a new two-dimensional code 30B is marked on the surface of the sealing body 10 of the lead frame LF, and therefore in the processes after this outer plating process, the problem as described above can be avoided using the identification information (two-dimensional code 30B) attached to (formed on) the surface of this sealing body 10.

<Lead Frame Cutting Process>

Figure 23:
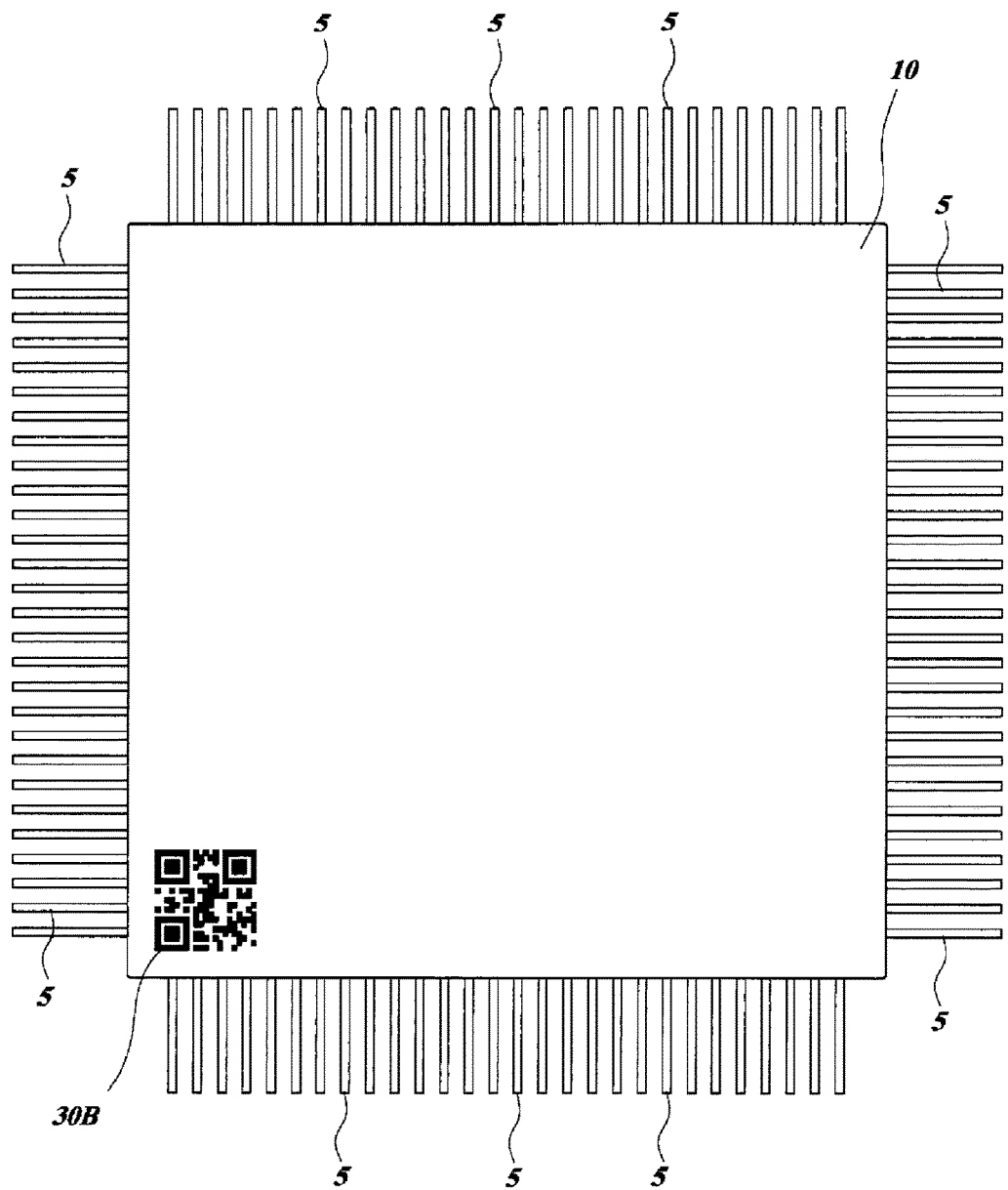
FIG. 23 is an enlarged plan view of the main part showing a lead frame cutting process.
Figure 24:
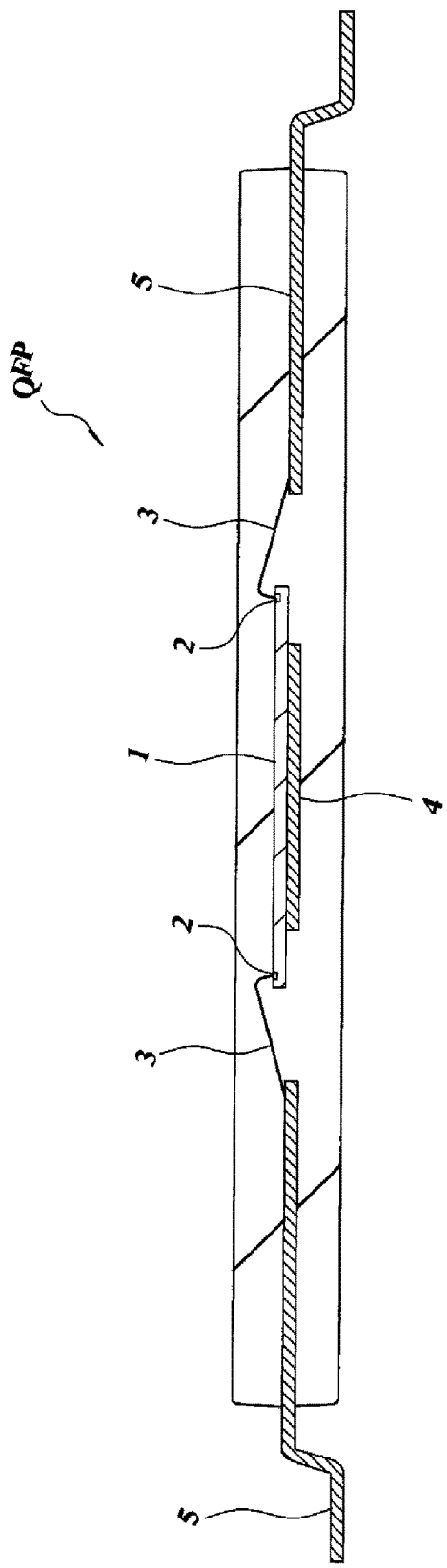
FIG. 24 is a cross sectional view showing the QFP after forming leads.

In a lead frame cutting process, the unnecessary portion (outer frame portion 8) of the lead frame LF exposed from the sealing body 10 is first cut and removed as shown in FIG. 23. Next, as shown in FIG. 24, the lead 5 (outer lead) exposed from the sealing body 10 is formed into a gull wing shape. Through the processes so far, the QFP is completed.

<Testing Process>

In a testing process, the above-described QFP is attached to a test socket (not shown), and the operation of the QFP is checked by a burn-in test and an electrical characteristic test.

<Final Visual Inspection Process>

In a final visual inspection process, the visual inspection of the QFP is carried out by image recognition check whether or not there is a defect, deformation, or the like of the lead 5 (outer lead).

The QFP manufactured through the above-described processes is shipped from a manufacturer to a customer's premise, and mounted on a predetermined wiring substrate and used. Moreover, the delivery status from a manufacturer to a customer's premise is managed by being associated with the two-dimensional code 30B marked on the surface of the sealing body 10 of the QFP.

Then, after shipment of a finished semiconductor device (QFP), if a defect occurs in the QFP at a customer's premise, the manufacturer identifies the substrate ID of this QFP by reading the two-dimensional code 30B marked on the sealing body 10 of the QFP in which the defect has occurred.

In the main server MS of the above-described manufacturer, there are stored wafer process information, such that the semiconductor chip 1 sealed with the QFP was obtained from the semiconductor wafer 1A of which manufacturing lot and that at which position of the semiconductor wafer 1A the semiconductor chip 1 was located, associated with the product information of this QFP (the product type name marked on the surface of the sealing body 10, the customer logo mark, marks such as the production code, and the two-dimensional code 30B). Moreover, there are also stored the assembly and testing process information, such that under what condition the QFP was manufactured in the above-described die bonding process, wire bonding process, molding process, tie-bar cutting process, laser marking process, outer plating process, lead frame cutting process, and the like, and the assembly and testing process information, such as the involved manufacturing apparatus, the corresponding operator information, and the materials used, associated with the product information of this QFP.

Accordingly, the manufacturing condition of the QFP stored in the main server MS can be instantaneously traced by reading the two-dimensional code 30B of the QFP and identifying the product information of the QFP. Because this allows promptly determining the cause of a defect in the QFP, the cause of the defect can be fed back to the manufacturing process whereby the countermeasure against the defect can be promptly made.

In detail, for example, in the case where a chip ID "K001X01Y02" is included in the identification information (substrate ID) assigned to a product that needs analysis after product shipment, the information regarding the semiconductor chip 1 mounted on this product can be confirmed by referring to (searching) the chip ID map table of FIG. 31A. That is, it is possible to confirm that in the semiconductor chip 1, the manufacturing lot and the wafer number of the semiconductor wafer 1A were "KAKUSAN001" and "001", respectively, and the X coordinate and the Y coordinate of the position of the chip in the semiconductor wafer 1A were "1" and "2", respectively and furthermore the quality condition was class "B".

Moreover, by referring to (searching) the working history DB (FIG. 32), it is possible to confirm that this semiconductor chip was die-bonded at the position of Location "2" in the lead frame LF with a substrate ID "K0001" by a working station "ST002004" according to a working recipe "Re002027", and that the die-bonding work was carried out at the position of Location "2" in the lead frame LF with the substrate ID "K0001" by a working station "ST003005" according to a working recipe "Re003031".

Hereinafter, similarly by referring to (searching) the same working history DB, the working conditions (working history) before shipment can be easily verified.

Moreover, the above-described manufacturing method can be applied not only to the countermeasure against a defect in a QFP shipped to a customer but to the countermeasure against a defect generated in the middle of the manufacturing process. That is, when a defect has been found in the middle of the manufacturing process of a QFP, the two-dimensional code 30A marked on the lead frame LF or the two-dimensional code 30B marked on the sealing body 10 is read, thereby the manufacturing condition in the previous process of a semi-finished product with the substrate ID corresponding to this two-dimensional code can be instantaneously traced, and the cause of the defect can be promptly determined in the middle of a manufacturing process.

Moreover, in the present First Embodiment, a unique ID (rack ID, substrate ID) is assigned to the lead frame LF and the rack for transporting the lead frame LF, respectively, and the rack ID of the rack and the substrate ID of the lead frame LF stored in this rack are associated with each other. Then, in taking out the lead frame LF from the rack set to the loader unit of each apparatus and supplying the same to the processing unit and storing the lead frame LF, the processing of which is complete, into the rack of the unloader unit, the association between the rack ID of the rack and the substrate ID of the lead frame LF is checked.

Thus, in each apparatus in the assembly and testing process, even when a lead frame LF stored in the previous rack and a lead frame LF stored in the next rack are consecutively supplied to the processing unit of the apparatus, the problem that a lead frame LF to be collected by a predetermined rack is mixed into another rack can be prevented. Moreover, even if a lead frame LF is mixed into another rack, the fact of mixing becomes evident in the loader unit of the apparatus in the next process and therefore the association between the rack and the lead frame LF is not lost. Accordingly, the product management and/or prompt defect analysis of a QFP can be carried out without reducing the throughput of the assembly and testing process processing.

Second Embodiment

In the present Second Embodiment, an example using an assembly lot as the transport unit is described as a variation of the semiconductor device manufacturing flow described in the above-described First Embodiment. Note that, in the present Second Embodiment, in addition to the method of manufacturing a semiconductor device described in the above-described First Embodiment, for the wire bonding process and the subsequent processes, an example is described in which the semiconductor chips are reorganized into the unit of production (aggregate unit) and processed.

Moreover, in the present Second Embodiment, a difference from the method of manufacturing a semiconductor device described in the above-described First Embodiment is mainly described and the description of the common portions is omitted. Moreover, also for the drawings, the drawings required for illustrating the difference from the First Embodiment will be shown, and as required the drawings illustrated in the First Embodiment will be referred to and described.

First, in detail, the assembly and testing process in the present Second Embodiment includes: a process (die bonding process) of singulating a semiconductor wafer into semiconductor chips and mounting the same on a substrate: a process (wire bonding process) of electrically coupling the semiconductor chip and the substrate with a wire or the like; a process (molding process) of sealing the semiconductor chip with a sealing body; a process (marking process) of marking semiconductor device information on the surface of the sealing body: a process (solder plating process) of (Sn, Sn—Pb)-plating for preventing rusting of an external terminal of the semiconductor device and for improving reliability in packaging; a process (cutting and forming process) of cutting and forming for the purpose of singulating the semiconductor device and forming a terminal for external connection; a process (testing process) of carrying out a test for screening a characteristic defect: and a process (final visual inspection process) of carrying out visual inspection for the purpose of screening a visual defect.

Next, each unit (apparatus, components and materials) used in the present Second Embodiment (see FIG. 34 to FIG. 36, and FIG. 38) is described below.

<Wafer Map Data Server>

A wafer map data server WAMS is an ordinary server including a mother board having a non-illustrated microprocessor (CPU) mounted thereon, a storage unit, a housing constituted by a power supply and an expansion bus, a display, and a keyboard.

In the wafer map data server WAMS of the above-described Second Embodiment, there are stored a wafer number of the semiconductor wafer 1A that is the wafer process information regarding the semiconductor chip 1, a diffusion lot number (number for identifying a diffusion process), positional information regarding the semiconductor chip 1 in the semiconductor wafer 1A, and a unique chip ID including nondefective product/defective product information regarding the semiconductor chip 1, and these pieces of information are inquired or output to other terminal.

<Assembly Lot>

The wafer process of a semiconductor device includes a diffusion process of simultaneously fabricating a plurality of semiconductor chips 1 on the semiconductor wafer 1A, and a G/W (Good Chip/Wafer) process of determining whether the semiconductor chip 1 is non-defective or defective.

In the arbitrary diffusion process, a plurality of semiconductor wafers 1A is simultaneously processed, and a plurality of semiconductor wafers 1A processed in the same diffusion process is assigned with the same diffusion lot number. Moreover, because an arbitrary diffusion lot is constituted by a plurality of semiconductor wafers 1A, a huge number of (thousands of) semiconductor chips 1 can be obtained.

However, in the assembly and testing process, from the view point of convenience in the management and processing of the semiconductor chip 1, the collective management of diffusion lots is difficult. Therefore, in the assembly and testing process, it is necessary to reorganize a plurality of semiconductor chips 1, which can be obtained from an arbitrary one diffusion lot, into an appropriate number of semiconductor chips 1. An aggregate of the semiconductor chips 1 reorganized in this manner is referred to as an assembly lot, and the reorganization is carried out immediately after the wire bonding process.

<LF Map Data Server>

An LF map data server LFMS, as with the wafer map data server WAMS, is an ordinary server including a mother board having a non-illustrated microprocessor (CPU) mounted thereon, a storage unit, a housing constituted by a power supply and an expansion bus, a display, and a keyboard.

The LF map data server LFMS has a function of automatically generating unique substrate IDs for identifying the lead frames LF by using a serial numbering method so that the substrate IDs are not duplicated. Moreover, the LF map data server LFMS can store therein unique LF map IDs, which are generated in the ID marking process described later, for identifying a plurality of device regions of the lead frame LF, and logically link and manage the LF map ID and the substrate ID. Thus, by referring to the LF map data server LFMS, all the lead frames LF processed in the assembly and testing process are individually identified, and the same applies to their device regions.

Furthermore, by managing the substrate ID and LF map ID in the LF map data server LFMS and the processing information in each assembly and testing process in association with each other, it is possible for the LF map data server LFMS to manage all the lead frames LF as well as the processing results in the assembly and testing process in the device regions.

For example, if the chip ID of the semiconductor chip 1 mounted on an arbitrary device region of the lead frame LF and the substrate ID and the LF map ID are stored into the LF map data server LFMS in association with each other, then by referring to the LF map data server LFMS, it is possible to easily obtain (trace) the information, such that in which diffusion lot each semiconductor chip 1 was manufactured and that at which position in which semiconductor wafer 1A each semiconductor chip 1 was located.

<Performance Collecting Server>

A performance collecting server JSS, as with the LF map data server LFMS, is an ordinary server including a mother board having a non-illustrated microprocessor (CPU)

mounted thereon, a storage unit, a housing constituted by a power supply and an expansion bus, a display, and a keyboard.

The performance collecting server JSS has a function of managing master data (data serving as the reference for processing) of the manufacturing condition with respect to a product type name assigned for each arbitrary diffusion lot, and can verify (check) the master data of the manufacturing condition from a product type name.

Moreover, the performance collecting server JSS has a function of managing performances (hereinafter, referred to as process performance information KJJ), such as the manufacturing condition, processing date and time, the number of processed products, the number of defective products, the number of nondefective products, and an operator identification ID, in the assembly and testing process for each semiconductor device (substrate ID), and can obtain (trace) the process performance information KJJ from the substrate ID.

<Rack>

A container for storing and transporting the lead frame LF in the assembly and testing process and also for setting the lead frame LF to the apparatus, is called a rack (an assembly rack 300, an integrated rack 301), and the material thereof is metal, such as aluminum, from the view point of durability and convenience. A unique ID is assigned to the rack in order to identify each rack, and is marked on an arbitrary location of the rack together with the information of the number of stored lead frames according to a two-dimensional code system.

Note that, in the present Second Embodiment, in order to improve the processing throughput, the processing is carried out in an aggregate unit (e.g., a diffusion lot unit, an assembly lot unit, and the like to be described later) of a plurality of semiconductor devices whose material (including the semiconductor chip 1), process flow, processing apparatus, apparatus configuration, and container (hereinafter, these selection and setting are referred to as manufacturing condition) are common.

Because the unique manufacturing conditions of a diffusion lot and an assembly lot are manually set (including preparation) prior to processing in each process in the assembly and testing process, a difference in the manufacturing condition due to a work error may occur. Moreover, because a plurality of semiconductor devices is consecutively processed for the purpose of improving the throughput, the mixing of semiconductor devices may occur between diffusion lots or between assembly lots. However, in the current production system, there are no measures for reliably preventing a difference in the manufacturing condition due to a work error. For this reason, a large number of defective products are manufactured, a large loss in the assembly and work cost in the wafer process and in the assembly and testing process are generated, and the delivery of products to customers is delayed, and thus the reliability as a manufacturer significantly decreases.

Moreover, when a defective product was manufactured, in order to prevent the defective product from being shipped to the outside of a company and to prevent the recurrence, there is a need to promptly investigate the cause of occurrence of the defect and a target (influencing) range of the defect. However, in the current production system, because there is no method of systematically tracing the manufacturing condition of an arbitrary semiconductor device from the unit of a semiconductor device after completion of assembling of the semiconductor device, neither prompt defect analysis nor investigation on a target range of the defect can be carried out.

Furthermore, when a recognizable defective product was manufactured due to a trouble in an apparatus, a work error, or the like, this defective product is preferably excluded from the processing target in terms of TAT (Turn Around Time) and cost. However, in the current production system, the position of a defective product cannot be systematically recognized and treated as a defective product. For this reason, even if a defective product was manufactured, for example, in the die bonding process, the same processing as that of a nondefective product was carried out with respect to the defective product in all the subsequent processes. Therefore, in the present Second Embodiment, a semiconductor device is manufactured in the order of processes as follows.

<ID Marking Process>

Figure 36:
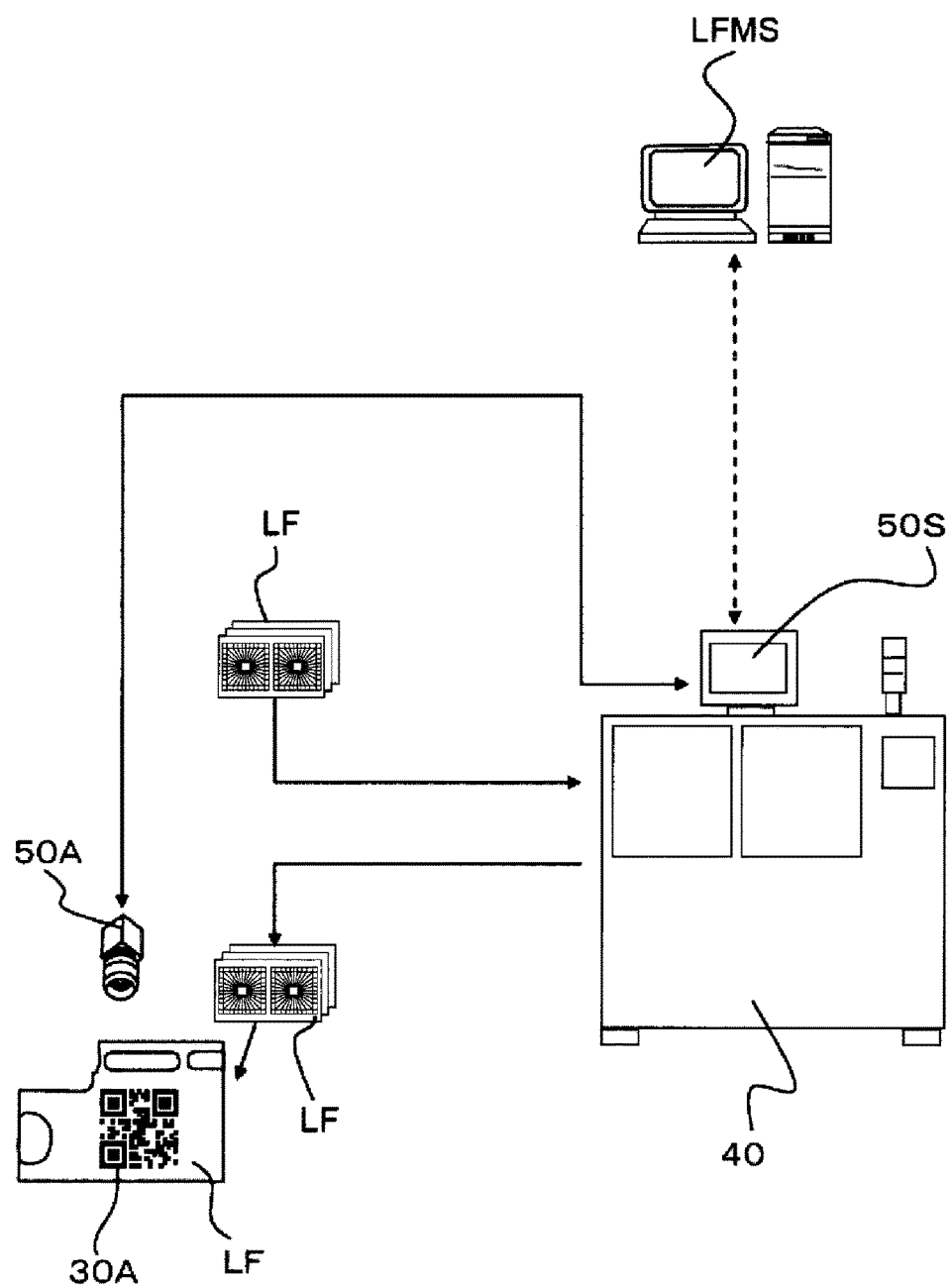
FIG. 36 is the conceptual diagram of the ID marking process following FIG. 4.
Figure 37:
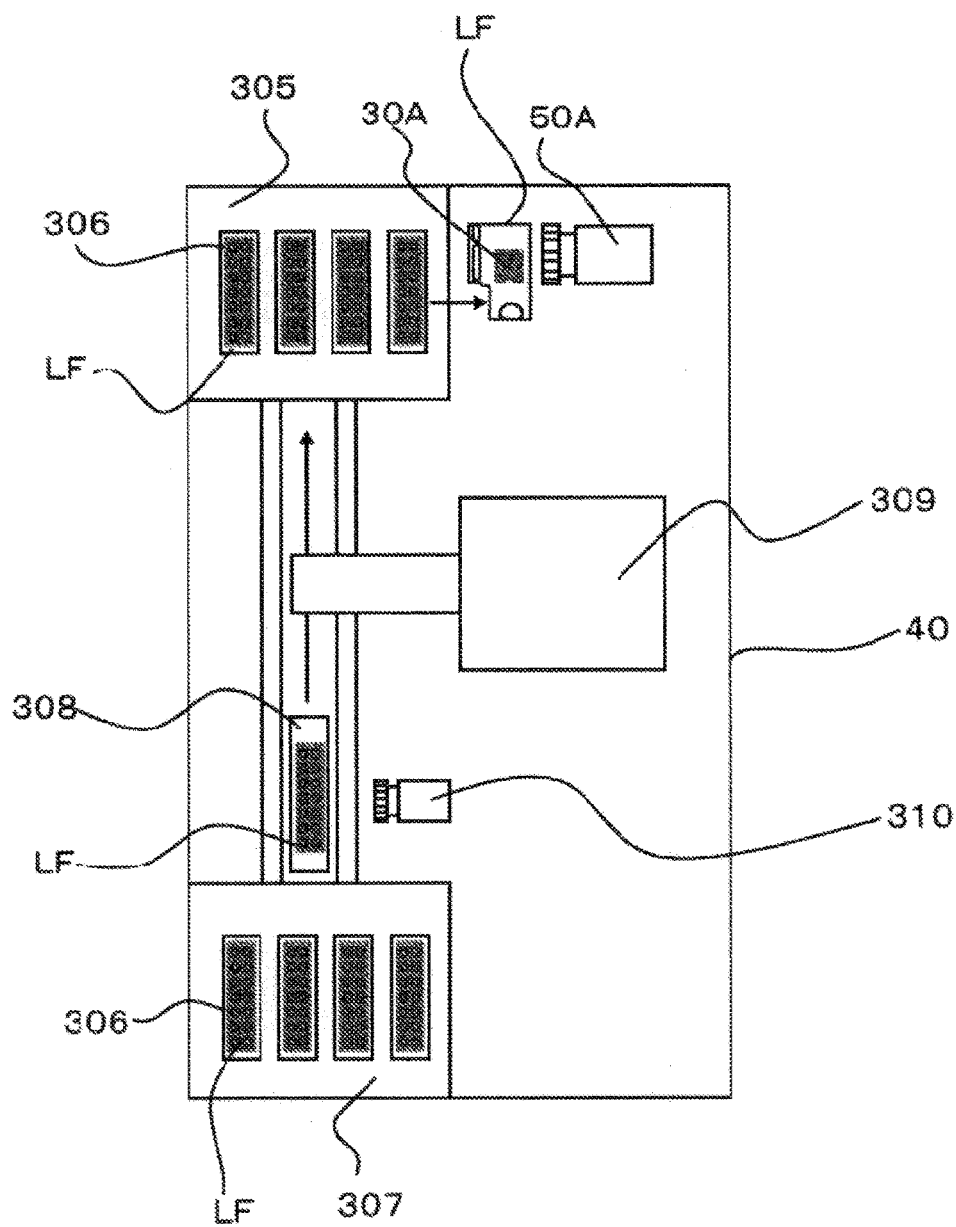
FIG. 37 is the conceptual diagram of the ID marking process following FIG. 36.

FIG. 36 and FIG. 37 are the conceptual diagrams of the ID marking process following FIG. 4. In an unloader unit 305 of the marking apparatus 40, there is installed an ID reader 50A coupled to the server (management server 50S) managing the ID marking process.

The lead frame LF transported to the ID marking process is installed in the loader unit 307 while being stored in a case 306, and an empty case 306 is installed in the unloader unit 305.

Next, an LF model number for identifying the basic specification of the lead frame LF to process is registered with the management server 50S. Subsequently, the lead frame LF is taken out from the inside of the case 306 of the loader unit 307, and a plurality of device regions of the lead frame LF is recognized by an image recognition camera 310 in the ID marking apparatus 40. Next, a unique LF map ID is generated for each of the device regions and stored into the management server 50S.

Next, the management server 50S reads from the LF map data server LFMS the unique substrate ID for identifying the lead frame LF generated by the LF map data server LFMS, links the same with the LF model number and the LF map ID and transfers this information to the LF map data server LFMS.

Subsequently, the lead frame LF is transported to a laser irradiation unit 309 by a transport unit 308, and as shown in FIG. 5, in each of the lead frames LF, the substrate ID is marked on the surface of the outer frame portion 8 positioned outside of the device region in the form of the two-dimensional code 30A.

Next, the two-dimensional code 30A of each lead frame LF is read by the ID reader 50A of the unloader unit 305, the lead frame LF with a legible substrate ID is piled in the case 306 installed in the unloader unit 305, and an illegible lead frame LF is removed (rejected) as a defective product.

Next, the management server 50S generates an ID marking apparatus ID for identifying the ID marking apparatus with the two-dimensional code 30A marked thereon, associates the same with the substrate ID, the LF type number, and the LF map ID, and transfers this information (hereinafter, the information associating the substrate ID and the assembly and testing process processing information is referred to as LF information LFI) to the LF map data server LFMS.

Thus, by referring to the LF map data server LFMS, the marking apparatus 40 with the two-dimensional code 30A marked thereon can be easily identified from the substrate ID of any lead frame LF or from the LF map ID.

Subsequently, the lead frame LF is piled in the stacker 41 installable in the loader unit 307 in the die bonding process that is the next process, and is transported to the die bonding process, which is the first process of the assembly and testing process, together with the semiconductor wafer 1A (a plurality of singulated semiconductor chips 1) shown in FIG. 3.

<Die Bonding Process>

Figure 38:
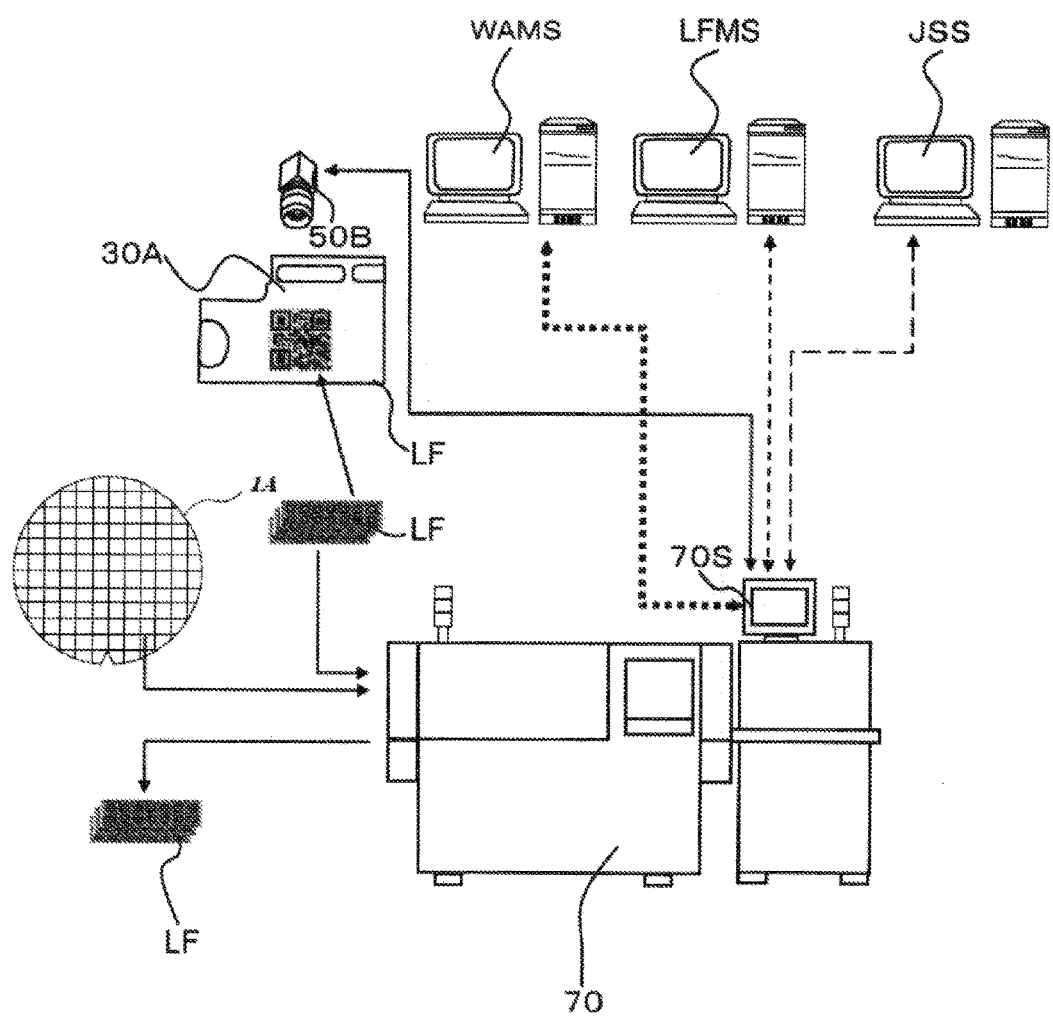
FIG. 38 is the conceptual diagram of the die bonding process following FIG. 7.
Figure 39:
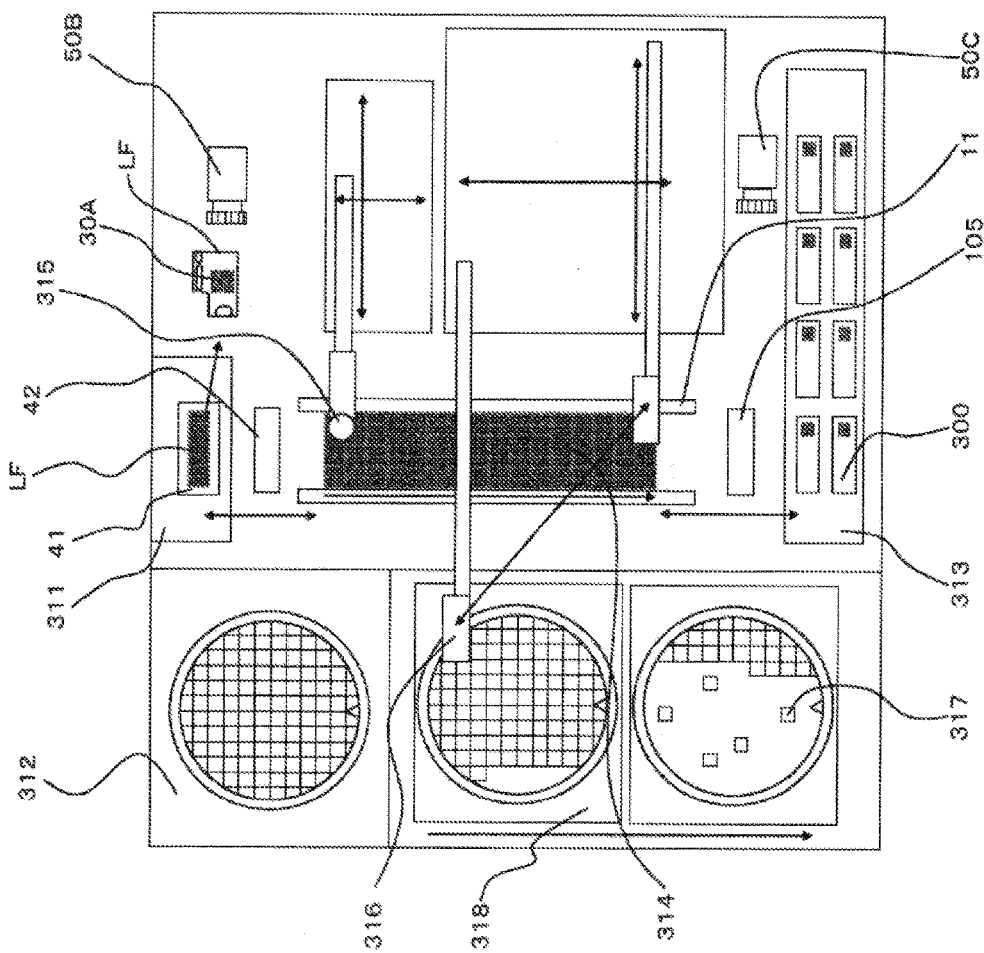
FIG. 39 is the conceptual diagram of the die bonding process following FIG. 38.

FIG. 38 and FIG. 39 are the conceptual diagrams of the die bonding process following FIG. 7. In the die bonding apparatus 70, the ID reader 50B coupled to the server (management server 70S) managing the stacker 41 and the die bonding apparatus is installed in a loader unit 311, a plurality of semiconductor wafers 1A having the same diffusion lot number is prepared in a wafer supplying unit 312 (up to 25 wafers can be set), and a plurality of empty assembly racks 300 is installed in an unloader unit 313 in order to store the lead frame LF processed by the processing unit 314.

Next, the product type name and diffusion lot number of the semiconductor wafer A1 to be processed, and the number of lead frames LF to be stored into the assembly rack 300 installed in the unloader unit 313 are input to the management server 70S.

Next, the manufacturing condition (the preparation of the lead frame LF, the mounting on the stacker, the selection of the process flow, the selection of a processing apparatus, the apparatus condition setting, and the setting of materials, such as adhesive) specified for each product type name are manually set.

Next, the lead frame LF is taken out one by one from the stacker 41 with a suction hand 42, the two-dimensional code 30A of each lead frame LF is read by the ID reader 50B, and the substrate ID is stored into the management server 70S. Then, the management server 70S obtains the LF information LFI related to the substrate ID from the LF map data server LFMS, and stores the input product type name and diffusion lot number of the semiconductor wafer A1 in association with each other.

Next, the management server 70S reads the master data of the manufacturing condition corresponding to the input product type name from the performance collecting server JSS, and checks the same with the manufacturing condition that was manually set for example, and if the both conditions can be verified to match (the manufacturing condition is OK), the lead frame LF is supplied to the processing unit 314 (the region between the loader unit 311 and the unloader unit 313) of the die bonding apparatus 70.

On the other hand, if the set manufacturing condition differs from the master data (the manufacturing condition is NG), an alarm is generated and the apparatus is forcibly stopped. Note that, regardless of the manufacturing condition (OK or NG), the check result by the management server 70S is associated with the substrate ID and transferred to the performance collecting server JSS.

In this manner, according to the die bonding method of the present Second Embodiment, because the manufacturing condition set prior to the processing is checked with its master data, the fabrication of a defective product due to a difference in the manufacturing condition can be systematically and reliably prevented.

Next, once an arbitrary number of lead frames LF are supplied to the processing unit 314 of the die bonding apparatus 70, and then as shown in FIG. 8 and FIG. 39, the adhesive 9 is supplied to the surface of each chip mounting region 4 of the lead frame LF by an adhesive applicator 315.

Next, the semiconductor chips 1 singulated from the semiconductor wafer 1A over a transporting table 318 are picked up one by one by a chip mounter 316, and as shown in FIG. 9 and FIG. 39 are arranged over the chip mounting region 4 of the lead frame LF.

Then, the management server 70S generates a die bonding apparatus ID for identifying the die bonding apparatus that carried out die bonding, and stores the same and the LF information LFI together with a die-bonding nondefective product/defective product ID (trouble information) in association with each other.

Note that, in mounting the semiconductor chip 1 on the chip mounter 316 of the lead frame LF, the management server 70S reads the chip ID of the semiconductor chip 1 from the wafer map data server WAMS, skips a defective chip 317 based on an electrical characteristic inspection result in the wafer process which the chip ID includes, and mounts only the semiconductor chip 1 determined as a nondefective product on the chip mounter 316.

Upon completion of the die bonding, the lead frame LF is transported to the unloader unit 313 of the die bonding apparatus 70, and stored into the assembly rack 300.

Subsequently, the management server 70S transfers the LF information LFI (the product type name, the diffusion lot number, the LF number, the substrate ID, the LF map ID, the ID of a mounted chip, the die-bonding nondefective product/defective product ID, the die bonding apparatus ID) to the LF map data server LFMS. The process performance information KJJ (the manufacturing condition, the die-bonding date and time, the processed quantity, the number of defective products, the number of nondefective products, the operator identification ID) is associated with the LF information LFI by the management server 70S and is transferred to the performance collecting server JSS.

In this manner, according to the die bonding method of the present Second Embodiment, by referring to the LF map data server LFMS from any ID (the substrate ID, the LF map ID, or the like), and by referring to the LF information LFI and also to the performance collecting server JSS, the process performance information KJJ can be promptly and easily traced (obtained).

Subsequently, the assembly rack 300 having a set number of lead frames LF stored therein is transported, as required, to the wire bonding process that is the next process, and is consecutively processed until the processing of the semiconductor wafer 1A of the same diffusion lot number is completed.

<Wire Bonding Process (Including Assembly Rack Organizing Process and Assembly Lot Organizing Process)>

Figure 40:
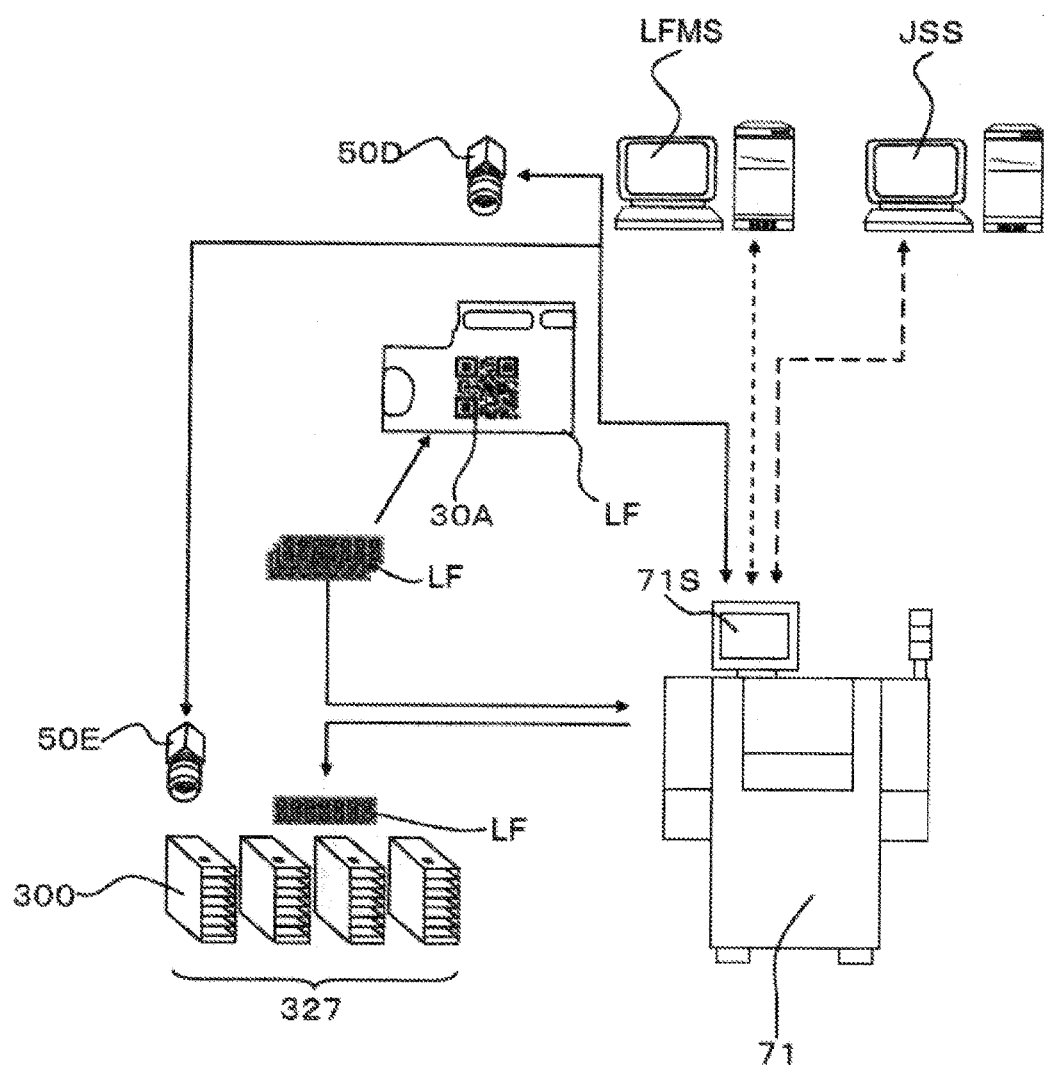
FIG. 40 is the conceptual diagram of the wire bonding process following FIG. 10.
Figure 41:
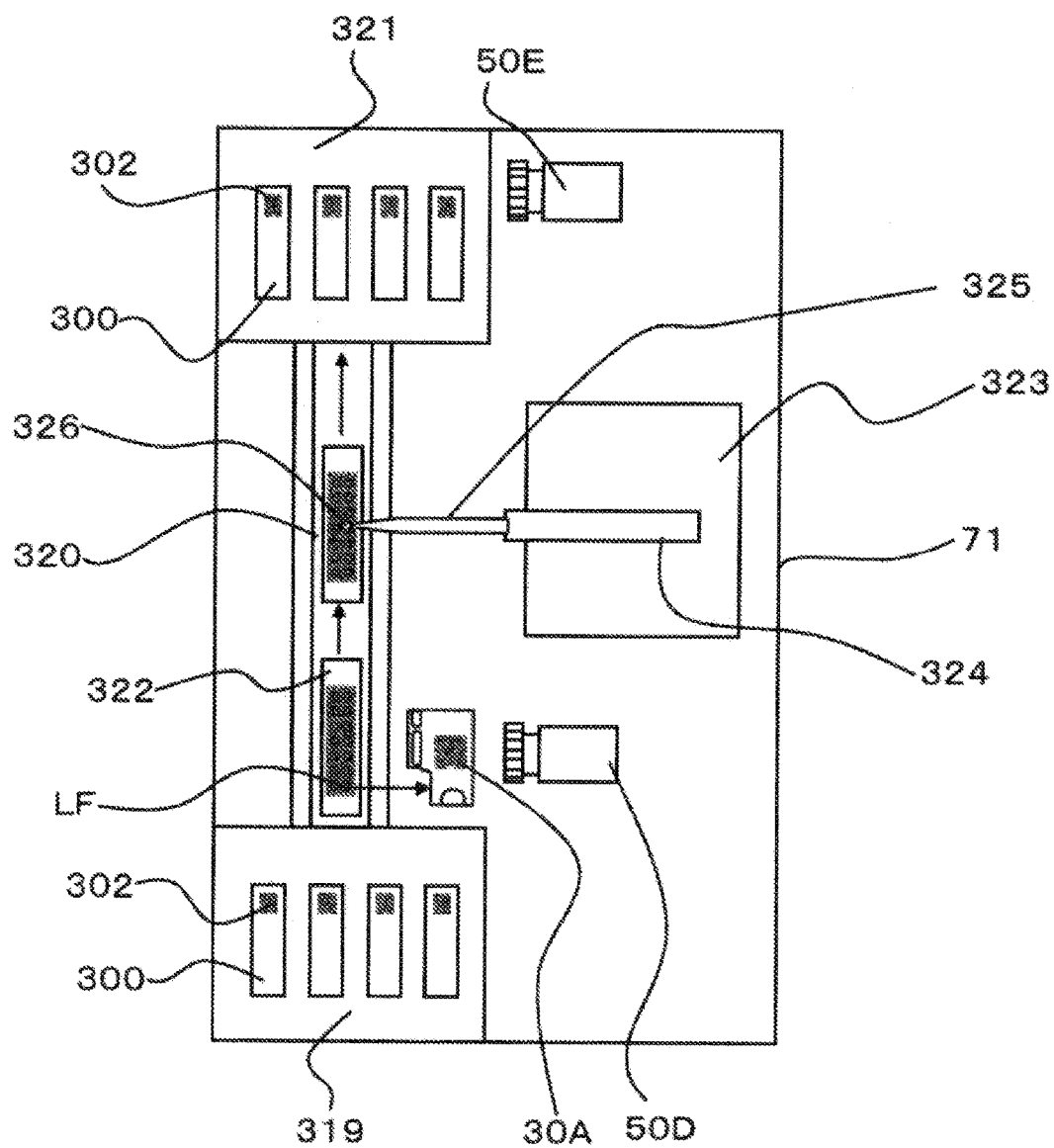
FIG. 41 is the conceptual diagram of the wire bonding process following FIG. 40.

FIG. 40 and FIG. 41 are the conceptual diagrams of the wire bonding process. In a loader unit 319 of the wire bonding apparatus 71, there are installed a plurality of lead frames LF stored in the assembly rack 300 and the ID reader 50D coupled to the server (management server 71S) managing the wire bonding apparatus 71. On the other hand, in an unloader unit 321, there are installed a plurality of empty assembly racks 300 for storing the lead frame LF to be processed by the processing unit 320 and the ID reader 50E coupled to the management server 71S.

Hereinafter, the wire bonding method is described, but because the method of checking the manufacturing condition and the effect thereof are the same as those in the die bonding process, the description thereof is omitted here.

First, the two-dimensional code 302 of the assembly rack 300 installed in the unloader unit 321 is read by the ID reader 50E, and the rack ID and the number of stored lead frames LF are stored into the management server 71S.

Next, the two-dimensional code 30A (substrate ID) of the lead frame LF taken out from the assembly rack 300 is read by the ID reader 50D, and is stored into the management server 71S. Then, the management server 71S obtains the LF information LFI related to the substrate ID from the LF map data server LFMS.

Subsequently, if the product type name and the diffusion lot number of the LF information LFI match, the management server 71S consecutively carries out wire bonding under the same manufacturing condition. On the other hand, if not, an alarm indicating product type name NG/diffusion lot NG is generated, and the wire bonding apparatus 71 is set so as to be forcibly stopped.

In this manner, in the wire bonding method of the present Second Embodiment, the management server 71S reads the two-dimensional code 30A (substrate ID) of the lead frame LF so as to identify the product type name and the diffusion lot number of the mounted semiconductor chip 1 and determine whether or not the lead frame LF is the one to be processed (whether or not the product type name and the diffusion lot number are the same, respectively). Thus, the mixing of the lead frames LF each having a different product type name or the lead frames LF each having a different diffusion lot number can be reliably prevented.

Next, the lead frame LF verified as the one to be processed is sequentially supplied to a heat stage 322 that is the processing unit of the wire bonding apparatus 71. Once the first lead frame LF is supplied to the heat stage 322, then first the management server 71S reads the LF information LFI from the LF map data server LFMS, and recognizes the chip mounting region 4 with a die-bonding nondefective product ID based on the die-bonding nondefective product/defective product ID of the LF information LFI.

Then, as shown in FIG. 12, for example, by a ball-bonding method using heat and ultrasonic vibration, the bonding pad 2 of the semiconductor chip 1 in the chip mounting region 4 with the die-bonding nondefective product ID, the semiconductor chip 1 being mounted on this lead frame LF, and the lead 5 are electrically coupled via a gold (Au) wire (conductive component) 3 using an ultrasonic thermocompression bonding unit constituted by a bonding tool 326, an ultrasonic horn 325, a support arm 324, and a support 323.

Next, the lead frame LF, the wire bonding of which is complete, is transported to the unloader unit 321 from the processing unit 320, and is stored into an arbitrary assembly rack 300. The management server 71S associates the assembly rack ID with the LF information LFI of the stored lead frame LF, and transfers this information to the LF map data server LFMS. Hereinafter, the storing and associating work is referred to as assembly rack organization.

Subsequently, once a predetermined number of lead frames LF, the predetermined number being set in advance in the management server 71S, are stored into the assembly rack 300, an empty next assembly rack 300 is automatically prepared and the lead frame LF is stored into this new assembly rack 300.

Subsequently, the management server 71S transfers the LF information LFI (the product type name, the LF number, the substrate ID, the LF map ID, the chip ID, a wire bonding nondefective product/defective product ID, a wire bonding apparatus ID) to the LF map data server LFMS. Moreover, the process performance information KJJ (the manufacturing condition, the wire bonding date and time, the processed quantity, the number of defective products, the number of nondefective products, the operator identification ID) is associated with the LF information LFI and then transferred to the performance collecting server JSS.

In this manner, according to the wire bonding method of the present Second Embodiment, by referring to the LF map data server LFMS from any ID (the substrate ID, the LF map ID, or the like), the LF information LFI, and also by referring to the performance collecting server JSS, the process performance information KJJ can be promptly and easily traced (obtained).

Next, a method of organizing an assembly lot 327 is described. First, the two-dimensional code 302 (assembly rack ID) of each of a plurality of assembly racks 300 (e.g., four assembly racks) after organizing the assembly racks is read by the ID reader 50E, and stored into the management server 71S. Then, the management server 71S, in order to set a plurality of assembly racks 300 as the assembly lot 327, associates these assembly rack IDs with each other and assigns a unique assembly lot ID thereto.

Next, the management server 71S reads the information regarding the assembly racks 300 constituting the assembly lot 327 (the LF information LFI on each lead frame LF stored in the assembly rack) from the LF map data server LFMS, and associates the same with the assembly lot ID and transfers this information to the LF map data server LFMS. Note that, unless otherwise specifically stated, the assembly lot 327 means an aggregate of a plurality of associated semiconductor chips 1, and is managed, from the subsequent assembly and testing process, basically in the unit of the assembly lot 327.

Subsequently, the wire bonding and the assembly rack organizing are consecutively carried out until the processing of all the lead frames FL, on each of which the semiconductor chips 1 of the same diffusion lot number are mounted, is completed.

<Molding (Sealing) Process>

Figure 42:
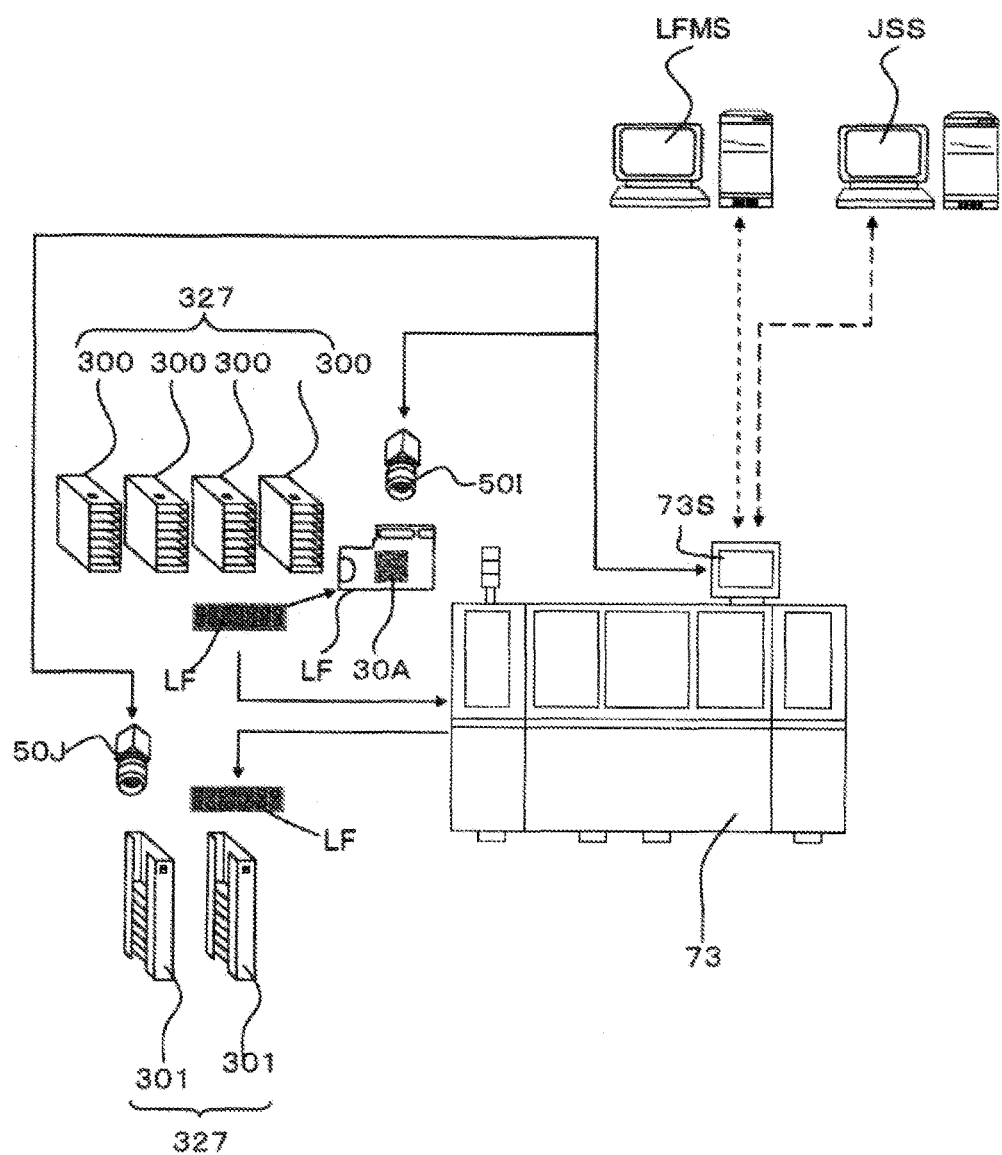
FIG. 42 is a conceptual diagram of a molding (sealing) process.
Figure 43:
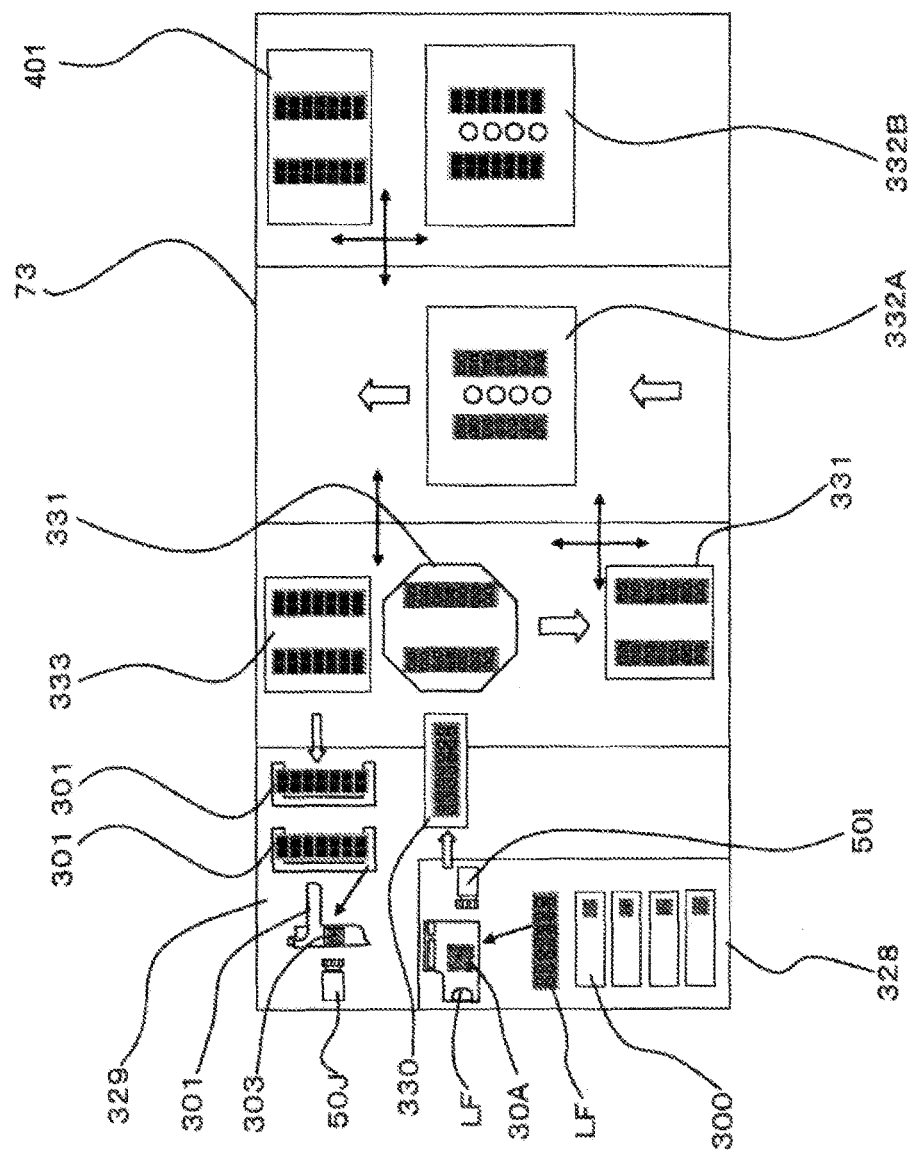
FIG. 43 is the conceptual diagram of the molding (sealing) process following FIG. 42.

FIG. 42 and FIG. 43 are the conceptual diagrams of the molding (sealing) process. In a loader unit 328 of a sealing apparatus 73, there are installed a plurality of lead frames LF stored in the assembly rack 300 and an ID reader 50I coupled to a server (management server 73S) managing the sealing apparatus 73. Moreover, in an unloader unit 329, there are installed a plurality of empty integrated racks 301 for storing the lead frame LF processed by press units 332A and 332B and an ID reader 50J coupled to the management server 73S. Note that, in the present embodiment, the sealing apparatus 73 including a plurality of (here, two) press units is described, but the number of press units is not limited thereto, and may be one for example.

Hereinafter, the molding (sealing) method is described, but because the method of checking the manufacturing conditions and the effect thereof are the same as those in the die bonding process and moreover the method of preventing mixing of the lead frames LF and the effect thereof are the same as those in the wire bonding process, the description thereof is omitted here.

First, in the sealing apparatus 73, the manufacturing condition specified for each product type name is set. Then, for the ID of an integrated rack installed in the unloader unit 329, the two-dimensional code 303 is read by the ID reader 50J, and the rack ID and the number of stored lead frames LF are stored into the management server 73S.

Next, as shown in FIG. 43, the lead frame LF is taken out from the inside of the assembly rack 300 installed in the loader unit 328. The two-dimensional code 30A (substrate ID) of the taken-out lead frame LF is read by the ID reader 50I and stored into the management server 73S. Then, the management server 73S obtains the LF information LFI related to the substrate ID from the LF map data server LFMS.

Subsequently, the lead frame LF is transported to an aligning unit 331 by a transporter 330, where the lead frames LF in the number that can be processed at once are aligned. Subsequently, a plurality of lead frames LF placed in the aligning unit 331 is sequentially supplied to the press units 332A and 332B that are processing units of the sealing apparatus 73.

Next, in the press units 332A and 332B, the sealing of this lead frame LF is carried out. The lead frame LF, the sealing of which is complete, is moved to a gate breaking unit from the press units 332A and 332B by a carrier 401, where after unnecessary resin (non-illustrated gate part, runner, cull, and the like) is removed, the lead frame LF is transported to the unloader unit 329 and stored into an arbitrary integrated rack 301. Subsequently, once a predetermined number of lead frames, the predetermined number being set in the management server 73S, are stored into the integrated rack 301, an empty next integrated rack 301 is automatically prepared and the lead frame LF is stored into this new integrated rack 301.

Subsequently, the management server 73S transfers the LF information LFI (the assembly lot ID, the product type name, the LF number, the substrate ID, the LF map ID, the chip ID, a sealing nondefective product/defective product ID, a molding apparatus ID) to the LF map data server LFMS. Moreover, the process performance information KJJ (the manufacturing condition, the sealing date and time, the processed quantity, the number of defective products, the number of nondefective products, the operator identification ID) is associated with the LF information LFI and transferred to the performance collecting server JSS.

In this manner, according to the sealing method of the present Second Embodiment, by referring to the LF map data server LFMS from any ID (the substrate ID, the LF map ID, or the like), the LF information LFI, and also by referring to the performance collecting server JSS, the process performance information KJJ can be promptly and easily traced (obtained).

<Laser Marking Process>

As shown in FIG. 20, in the laser marking process, arbitrary information related to the manufacturing process of the semiconductor device is marked on the surface of the sealing body 10 in the form of the two-dimensional code 30B. The arbitrary information can be selected taking into consideration TPO (Time, Place, Occasion), and in the present Second Embodiment, a method will be described, a method in which an ID necessary to obtain (trace) the information related to the manufacturing process of a semiconductor device is marked in the form of the two-dimensional code 30B in advance, and various pieces of information are obtained from each server (the LF information LFI and the performance collecting server JSS) based on the ID.

Figure 44:
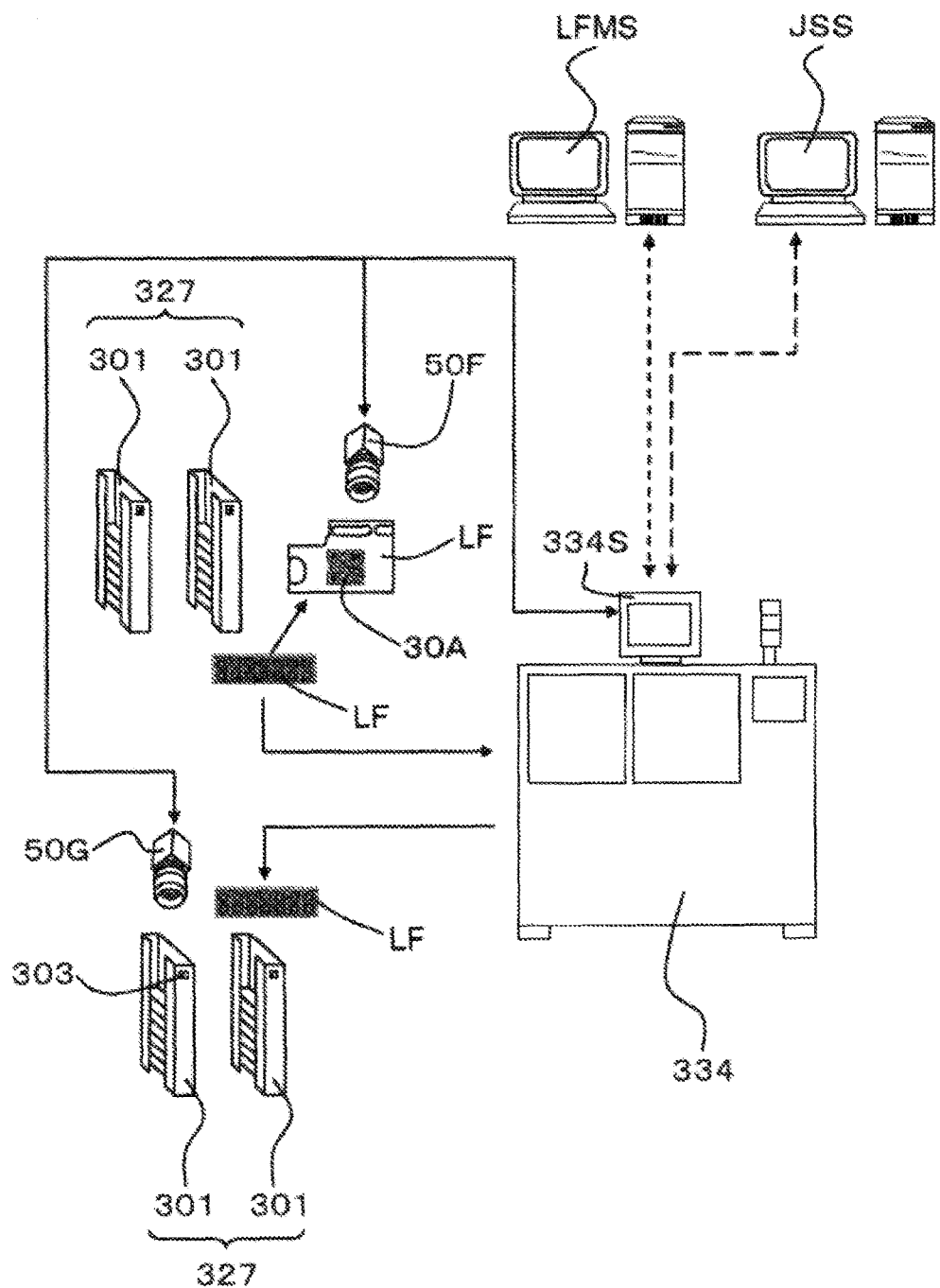
FIG. 44 is a conceptual diagram of a laser marking process.
Figure 45:
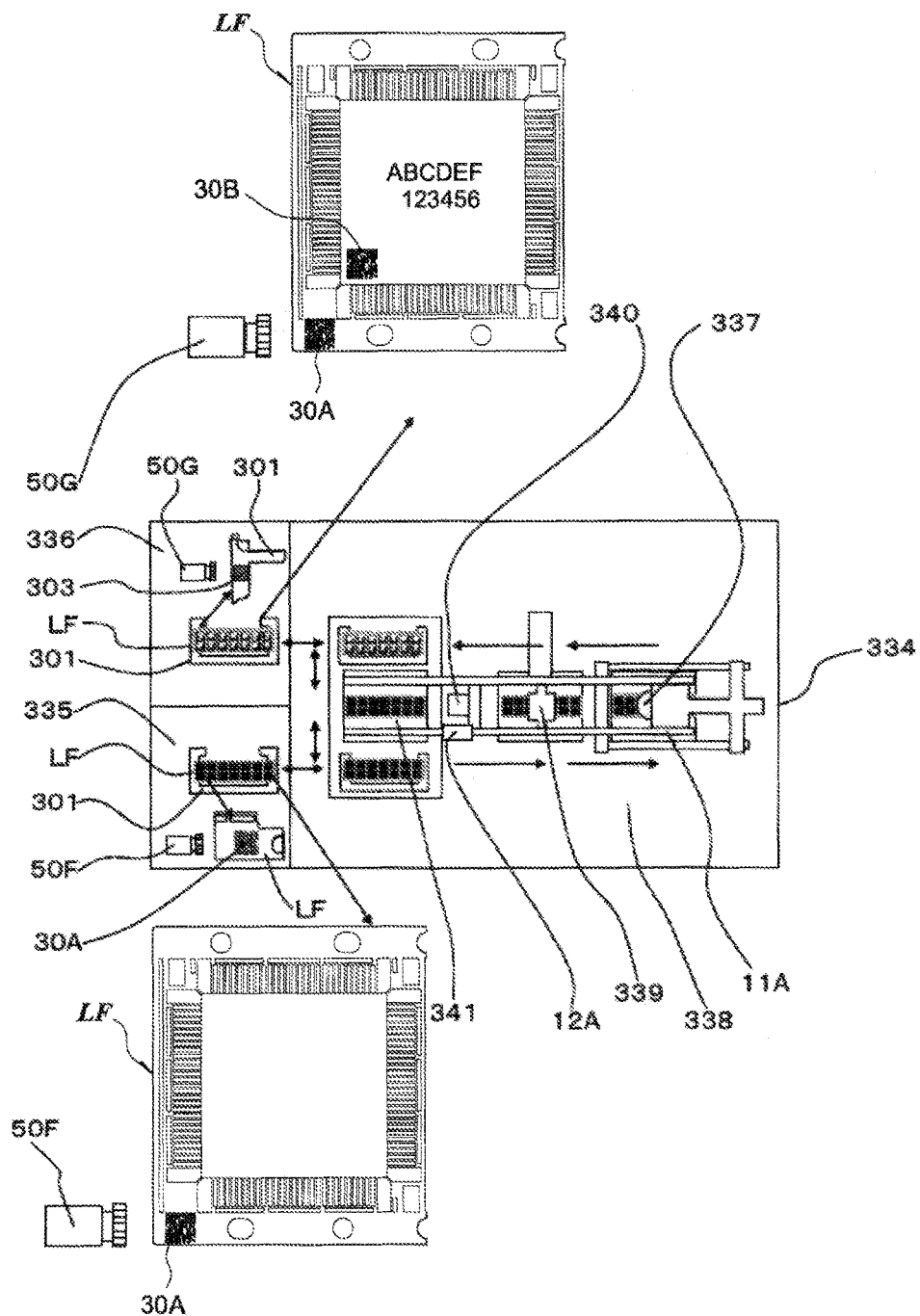
FIG. 45 is the conceptual diagram of the laser marking process following FIG. 44.

FIG. 44 and FIG. 45 are the conceptual diagrams of the laser marking process. In a loader unit 335 of a laser marking apparatus 334, there are installed a plurality of lead frames LF stored in the integrated rack 301 and an ID reader 50F coupled to a server (management server 334S) managing the laser marking apparatus 334. Moreover, in an unloader unit 336, there are installed an empty integrated rack 301 for storing the lead frame LF to be processed by a processing unit 338 and an ID reader 50G coupled to the management server 334S. Furthermore, in the processing unit 338, there are installed an XY stage 341 held by a guide rail 11A and operated by a transporting claw 12A, a cleaning unit 339 for cleaning the surface of the sealing body 10 before and after laser irradiation, and a visual inspection unit 340 inspecting the condition of the two-dimensional code 30B and a character mark indicative of product information that are marked by a laser irradiation unit 337.

Hereinafter, a laser marking method is described, but because the method of checking the manufacturing conditions and the effect thereof and also the method of preventing mixing of the lead frames LF and the effect thereof are as described above, the description thereof is omitted here. Note that, the laser marking process is a process of marking characters indicative of product information and the two-dimensional code 30B with a laser, but here a method of marking the two-dimensional code 30B is mainly described.

First, in the laser marking apparatus 334, a manufacturing condition specified for each product type name is set, and for the rack ID of the integrated rack installed in the unloader unit 336, the two-dimensional code 303 is read by the ID reader 50G, and the integrated rack ID and the number of stored lead frames LF are stored into the management server 334S.

Subsequently, the two-dimensional code 30A marked in the outer frame portion 8 of the lead frame LF is read by the ID reader 50F, and the substrate ID of the lead frame LF is identified and is stored into the management server 334S. Next, the management server 334S obtains the LF information LFI related to the substrate ID from the LF map data server LFMS.

Next, a foreign matter over the surface of the sealing body 10 is removed with the cleaning unit 339 so that the laser beam LB is reliably applied to the surface of the sealing body 10.

Subsequently, based on the nondefective product/defective product ID in each process included in the LF information LFI, the laser beam LB is sequentially applied to the surface of the sealing body 10 with the nondefective ID, thereby simultaneously marking the two-dimensional code 30B including the substrate ID of the lead frame LF, the LF map ID, and the chip ID information, and a character mark indicative of product information.

Next, a part of the sealing body 10, which the laser beam LB is applied to and is carbonized, is removed from the surface of the sealing body 10 with the cleaning unit 339.

Next, it is verified whether or not the character mark indicative of product information marked by the laser irradiation unit 337 in the visual inspection unit 340 has been reliably marked, and the result is associated with the LF information LFI on the lead frame LF and stored into the management server 334S.

Subsequently, once a predetermined number of lead frames LF, the predetermined number being set in the management server 334S, are stored into the integrated rack 301, an empty next integrated rack 301 is automatically prepared, and the lead frame LF is stored into this new integrated rack 301.

Subsequently, the management server 334S transfers the LF information LFI (the assembly lot ID, the product type name, the LF number, the substrate ID, the LF map ID, the chip ID, a laser mark nondefective product/defective product ID, a laser marking apparatus ID) to the LF map data server LFMS. Moreover, the process performance information KJJ (the manufacturing condition, the laser-marking date and time, the processed quantity, the number of defective products, the number of nondefective products, the operator identification ID) is associated with the LF information LFI and transferred to the performance collecting server JSS.

In this manner, according to the laser marking method of the present Second Embodiment, the two-dimensional code 30B including the substrate ID, the LF map ID, and the chip ID information marked to the sealing body 10 is read by the ID reader, and by referring to the LF map data server LFMS, the LF information LFI, and also by referring to the performance collecting server JSS, the process performance information KJJ can be promptly and easily obtained (traced). In other words, just by referring to the two-dimensional code 30B attached to the surface of the sealing body 10, each information cannot be read.

On the other hand, the information included in the two-dimensional code 30B can be selected taking into consideration TPO (Time, Place, Occasion). For example, if the two-dimensional code 30B including all the information of the chip ID of the wafer process information, the LF information LFI and the process performance information KJJ of the assembly and testing process information or including some information of them, then all or some of the chip ID, the LF information LFI, and the process performance information KJJ can be obtained by reading the two-dimensional code 30B with the reader of the two-dimensional code 30B even in an environment in which neither the wafer map data server WAMS, the LF map data server LFMS, nor the performance collecting server JSS can be referred to.

<Outer Plating Process>

Figure 46:
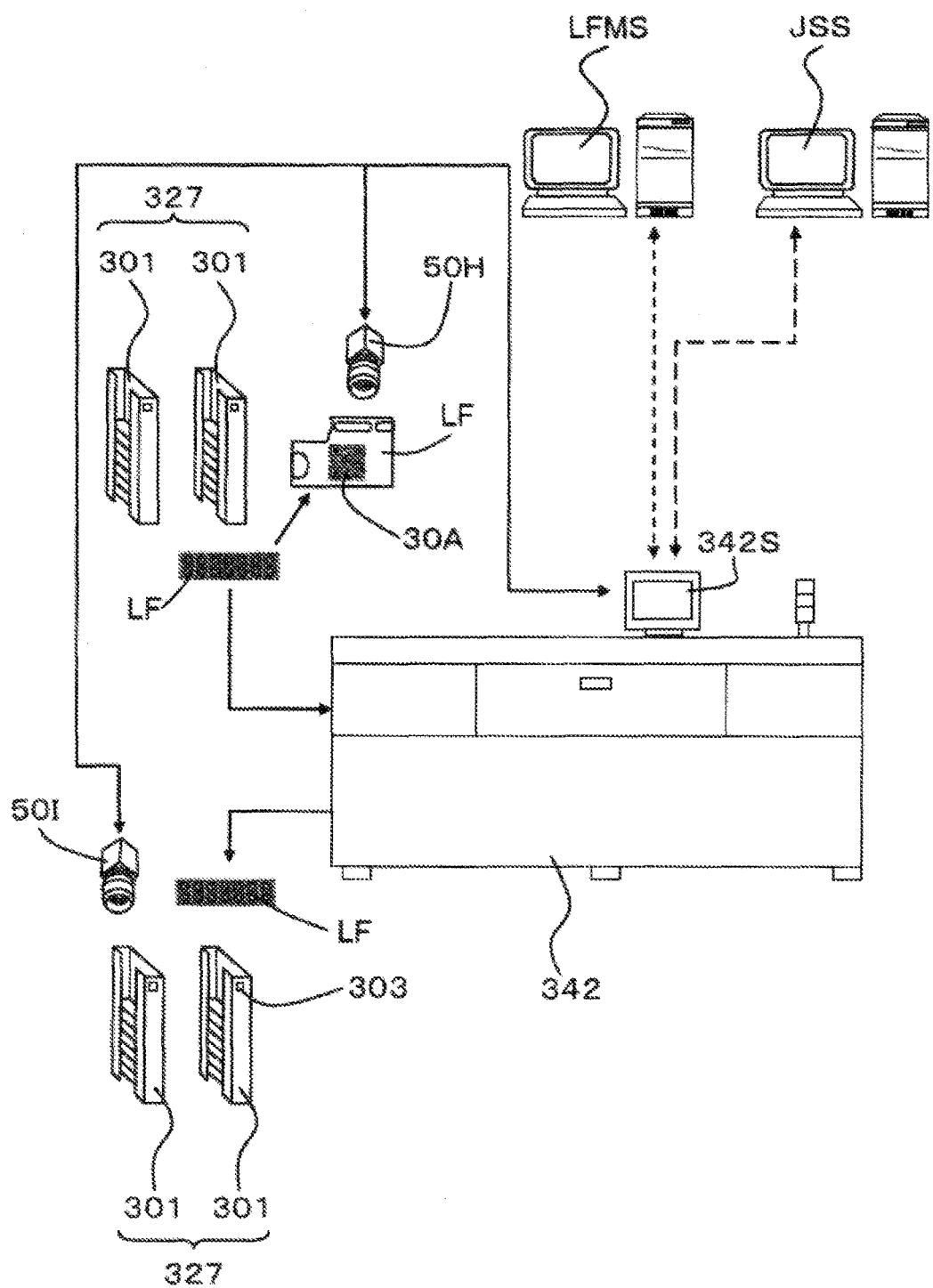
FIG. 46 is a conceptual diagram of an outer plating process.
Figure 47:
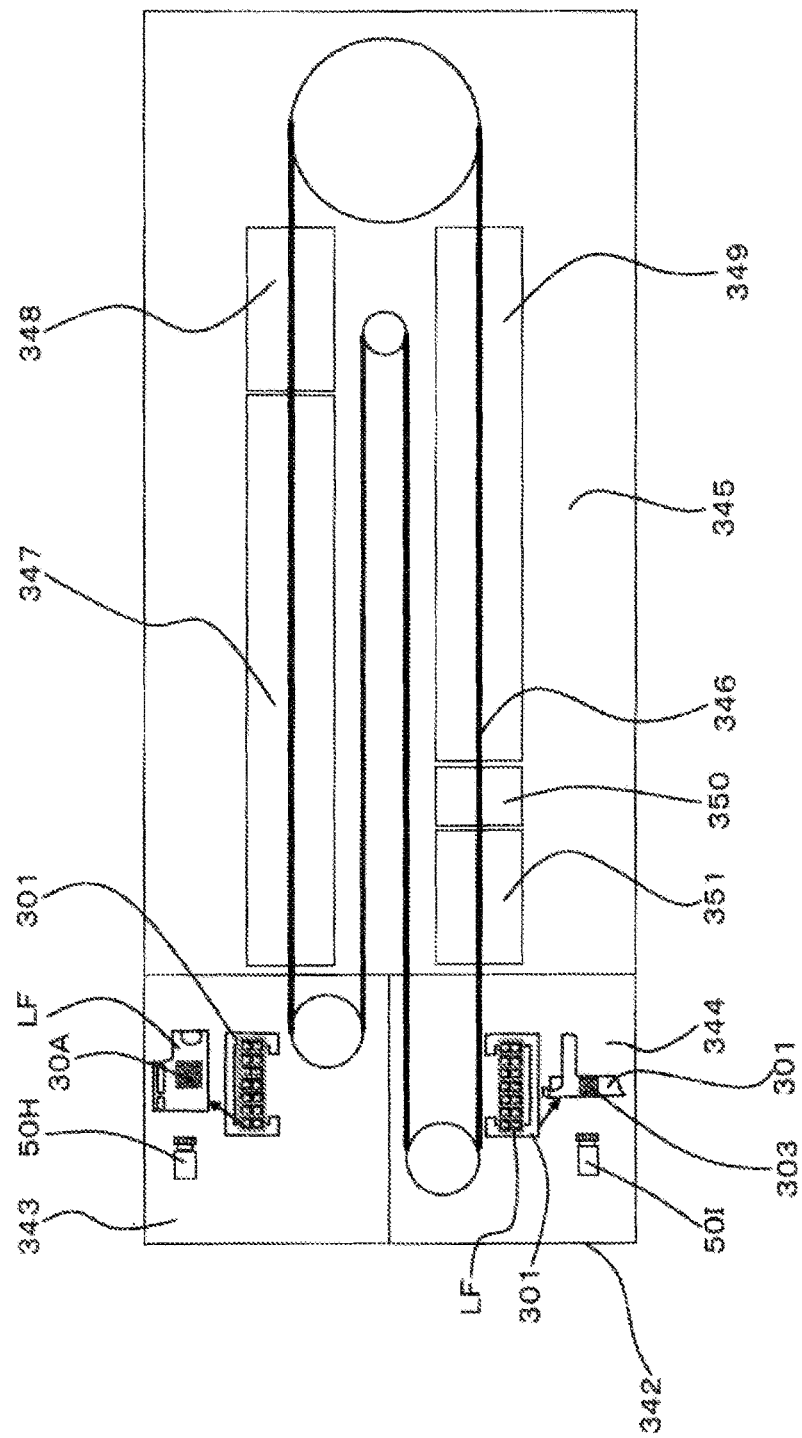
FIG. 47 is the conceptual diagram of the outer plating process following FIG. 46.

FIG. 46 and FIG. 47 are the conceptual diagrams of the outer plating process. In a loader unit 343 of an outer plating apparatus 342, there are installed a plurality of lead frames LF stored in the integrated rack 301 and an ID reader 50H coupled to server (management server 342S) managing the outer plating apparatus. Moreover, in an unloader unit 344, there are installed a plurality of empty integrated racks 301 for storing the lead frame LF processed by a processing unit 345 and an ID reader 50I coupled to the management server 342S. Furthermore, a processing unit 345 is installed between the loader unit 343 and the unloader unit 344.

Hereinafter, an outer plating method is described, but because the method of checking the manufacturing conditions and the effect thereof and also the method of preventing mixing of the lead frames LF and the effect thereof are as described above, the description thereof here is omitted.

First, in the outer plating apparatus 342, the manufacturing condition specified for each product type name is set. Then, in the integrated rack 301 installed in the unloader unit 344, the two-dimensional code 303 is read by the ID reader 50I, and the integrated rack ID and the number of stored lead frames LF are stored into the management server 342S.

Next, for the lead frame LF, as shown in FIG. 47, the lead frame LF is taken out from the inside of the integrated rack 301 installed in the loader unit 343.

Subsequently, the two-dimensional code 30A marked in the outer frame portion 8 of the lead frame LF is read by the ID reader 50H, and the substrate ID of the lead frame LF is identified and stored into the management server 342S. Next, the management server 342S obtains the LF information LFI related to the substrate ID from the LF map data server LFMS.

Subsequently, the lead frame LF is set to a transporting belt 346 with a non-illustrated fixture and is supplied to a processing unit 345. In the processing unit 345, the lead frames LF are processed sequentially by a cleaning unit 347, a chemical polishing unit 348, a plating unit 349, a belt cleaning unit 350, and a drying unit 351. The lead frame LF, the outer plating of which is complete, is transported to the unloader unit 344 from the processing unit 345, and is stored into an arbitrary integrated rack 301.

Subsequently, once a predetermined number of lead frames, the predetermined number being set in the management server 342S, are stored into the integrated rack 301, an empty next integrated rack 301 is automatically prepared and the lead frame LF is stored into this new integrated rack 301.

Subsequently, the management server 342S transfers the LF information LFI (a tray ID, a tray map ID, the assembly lot ID, the product type name, the LF number, the substrate ID, the LF map ID, the chip ID, an outer plating nondefective product/defective product ID, an outer plating apparatus ID) to the LF map data server LFMS. Moreover, the process performance information KJJ (the manufacturing condition, the outer plating date and time, the processed quantity, the number of defective products, the number of nondefective products, the operator identification ID) is associated with the LF information LFI and transferred to the performance collecting server JSS. Thus, although the detailed description is omitted, also in the plating process, as with the above-mentioned process, the process performance information KJJ can be promptly and easily traced (obtained) from any ID (substrate ID, LF map ID, or the like).

<Lead Frame Cutting Process>

FIG. 48, FIG. 49, FIG. 50A, and FIG. 50B are the conceptual diagrams of the cutting and forming process. In a loader unit 353 of a cutting and forming apparatus 352, there are installed a plurality of lead frames LF stored in the integrated rack 301 and an ID reader 50J coupled to a server (management server 352S) managing the cutting and forming apparatus. Moreover, in an unloader unit 354, there are installed a plurality of nondefective product trays 357A and a plurality of defective product trays 357B for storing a semiconductor device (QFP) 356 cut and formed by a processing unit 355 and an ID reader 50K coupled to the management server 352S. Furthermore, the processing unit 355 is installed between the loader unit 353 and the unloader unit 354.

Moreover, a unique tray ID for identifying each tray and a tray map ID for identifying the position of a pocket of the tray are assigned to the nondefective product tray 357A and the defective product tray 357B, respectively, and the two-dimensional code 358 is marked on arbitrary positions of the trays 357A and 357B together with the information of the number of stored semiconductor devices (QFP) 356.

Hereinafter, a cutting and forming method is described, but because the method of checking the manufacturing conditions and the effect thereof and also the method of preventing mixing of the lead frames LF and the effect thereof are as described above, the description thereof is omitted here.

First, in the cutting and forming apparatus 352, a manufacturing condition specified for each product type name is set, and for the nondefective product tray 357A and the defective product tray 357B installed in the unloader unit 354, the two-dimensional code 358 is read by the ID reader 50K, and the tray ID and the number of stored semiconductor devices 356 are stored into the management server 352S.

Figure 48:
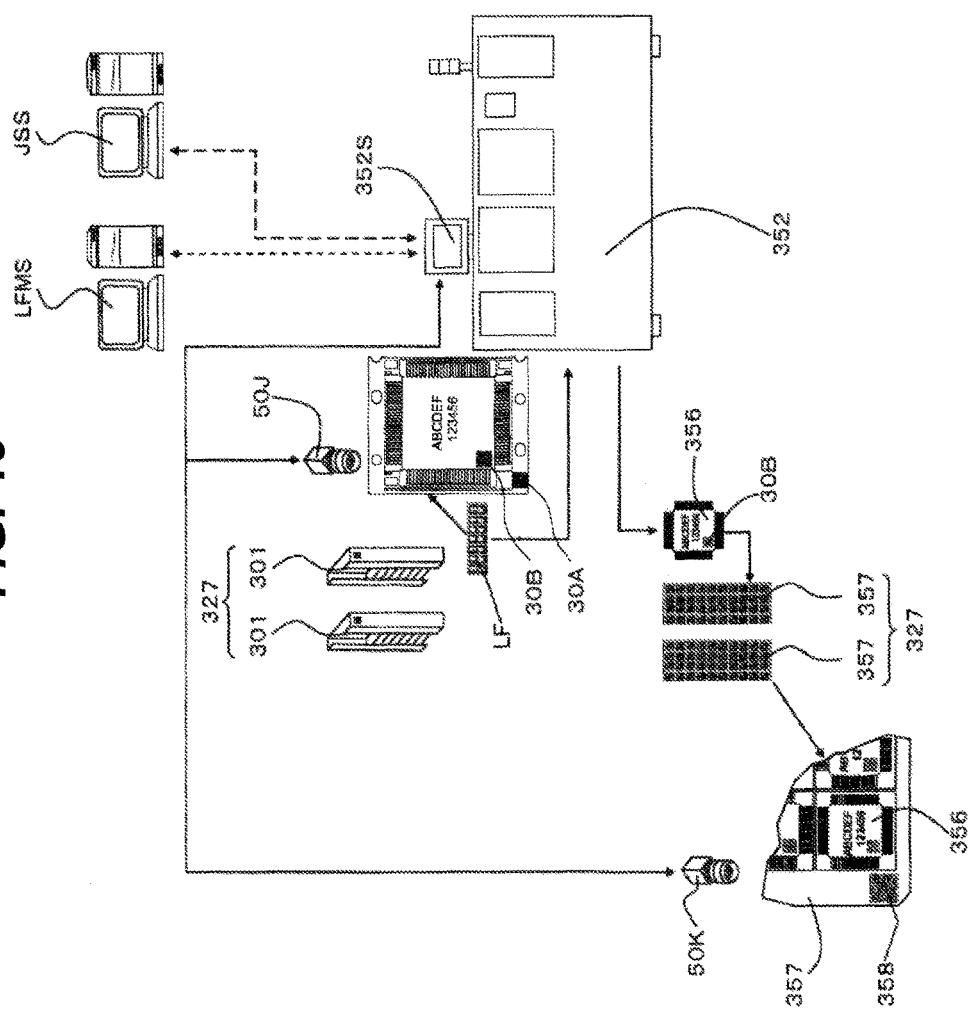
FIG. 48 is a conceptual diagram of a cutting and forming process.
Figure 49:
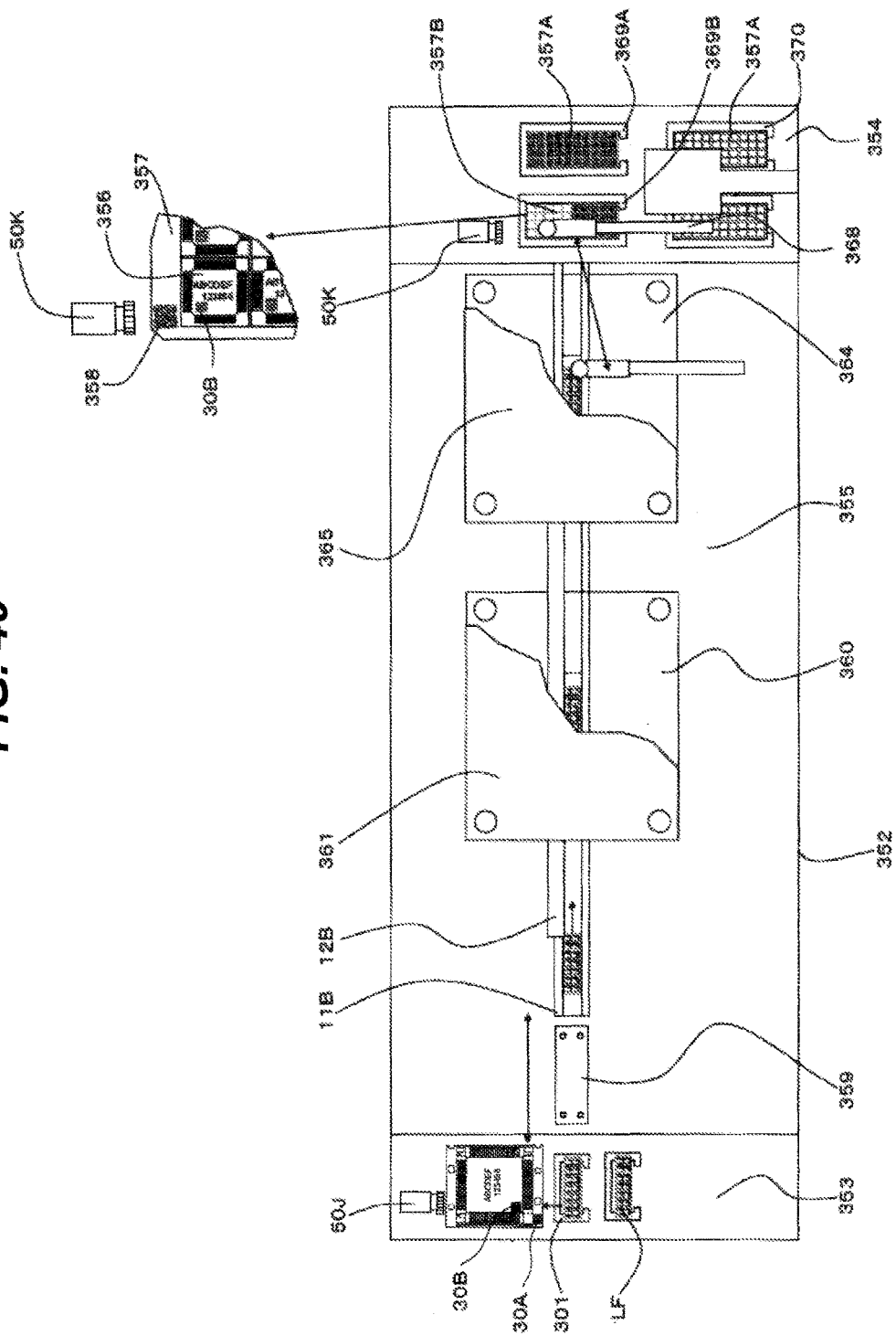
FIG. 49 is the conceptual diagram of the cutting and forming process following FIG. 48.

Next, as shown in FIG. 48 and FIG. 49, the lead frame LF is taken out from the inside of the integrated rack 301 installed in the loader unit 353.

Subsequently, in place of the two-dimensional code 30A of the lead frame LF that cannot be read by the ID reader due to the outer plating, the two-dimensional code 30B marked to the sealing body 10 is read by the ID reader 50J, and the substrate ID of the lead frame LF and the LF map ID of the sealing body 10 are identified and stored into the management server 352S. Next, the management server 352S obtains the LF information LFI related to the lead frame LF and the sealing body 10 from the LF map data server LFMS.

Figure 50A:
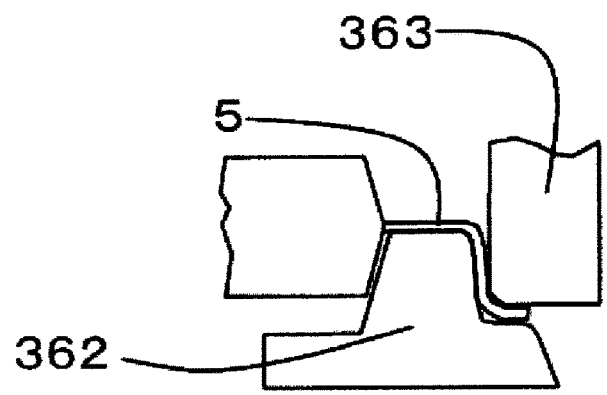
FIG. 50A is a conceptual diagram of a lead forming process.

Subsequently, as shown in FIG. 49 and FIG. 50A, the lead frame LF is mounted on a guide rail 11B with a transporting jig 359. Subsequently, the lead frame LF is transported to a lower forming die 360 with a transporting claw 12B while being supported by the guide rail 11B. Then, a stress is applied to a forming place of the lead 5 (outer lead) with a punch 363 of an upper forming die 361 while being supported by a die 362 of the lower forming die 360, and as shown in FIG. 24, the lead 5 (outer lead) exposed from the sealing body 10 is formed into a gull wing shape.

Figure 50B:
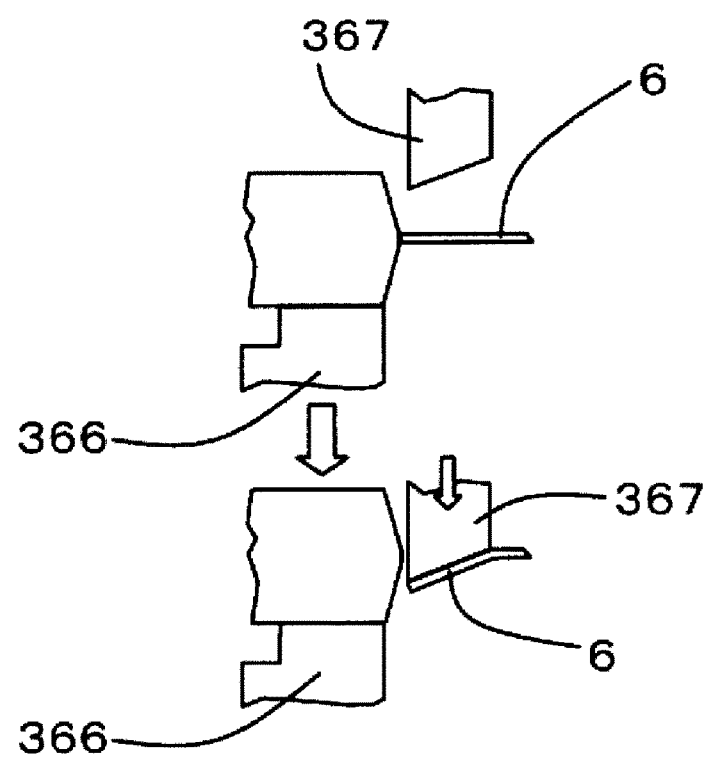
FIG. 50B is a conceptual diagram illustrating a process after forming leads.

Next, as shown in FIG. 49 and FIG. 50B, the lead frame LF, the forming of which is complete, is transported to a lower cutting die 364 by the transporting claw 12B. Then, while being supported by a die 366 of the lower cutting die, a stress is applied to the suspension lead 6 and the outer frame portion 8 of the lead frame LF with a punch 367 of the upper cutting die 365, and as shown in FIG. 23, unnecessary portions (the suspension lead 6, the outer frame portion 8, and the like) of the lead frame LF exposed from the sealing body 10 are cut and removed, and thereby the semiconductor device (QFP) 356 is complete.

Subsequently, based on the nondefective product/defective product ID of the LF information LFI stored in the management server 352S in the die bonding process to the outer plating process, the semiconductor device (QFP) 356 with the nondefective product ID is stored into a nondefective product tray 357A of a nondefective product tray unloader unit 369A from the lower cutting die 364 with a suction jig 368. On the other hand, the semiconductor device (QFP) 356 with the defective product ID is stored into a defective product tray 357B of a defective product tray unloader unit 369B. Note that the semiconductor device (QFP) 356 stored in the defective product tray 357B is treated (rejected) as a defective product. Hereinafter, this treatment is referred to as disposition treatment.

Next, the management server 352S associates the tray ID and the tray map ID for identifying the position of a pocket of the tray with the LF information LFI on the stored semiconductor device (QFP) 356, and transfers this information to the LF map data server LFMS.

Subsequently, once a predetermined number of semiconductor devices (QFP) 356, the predetermined number being set in advance in the management server 352S, are stored into the nondefective product tray 357A, an empty nondefective product tray 357A prepared in a supplying tray loader unit 370 is automatically set to the nondefective product tray unloader unit 369A, and the semiconductor device (QFP) 356 is stored into this new nondefective product tray 357A set to the nondefective product tray unloader unit 369A.

In this manner, according to the present Second Embodiment, the management server 352S can obtain the nondefective product/defective product ID (in the die bonding process to the outer plating process) of the LF information LFI from the LF map data server LFMS, and systematically recognize a defective product position (the lead frame LF and the device region of a lead frame) and reliably perform the disposition treatment. For this reason, the unnecessary works (the test and the visual inspection) with respect to the semiconductor device (QFP) 356, which is a defective product fabricated in the die bonding process to the outer plating process, can be eliminated. Thus, an improvement in TAT (Turn Around Time) and a reduction in the cost can be achieved.

Subsequently, the management server 352S transfers the LF information LFI (the tray ID, the tray map ID, the assembly lot ID, the product type name, the LF number, the substrate ID, the LF map ID, the chip ID, a cutting and forming nondefective product/defective product ID, a cutting and forming apparatus ID) to the LF map data server LFMS. Moreover, the process performance information KJJ (the manufacturing condition, the cutting and forming date and time, the processed quantity, the number of defective products, the number of nondefective products, the operator identification ID) is associated with the LF information LFI and transferred to the performance collecting server JSS.

In this manner, according to the cutting and forming method of the present Second Embodiment, by referring to the LF map data server LFMS from any ID (the tray ID, the tray map ID, or the like), the LF information LFI, and also by referring to the performance collecting server JSS, the process performance information KJJ can be promptly and easily traced (obtained).

<Testing Process>

Figure 51:
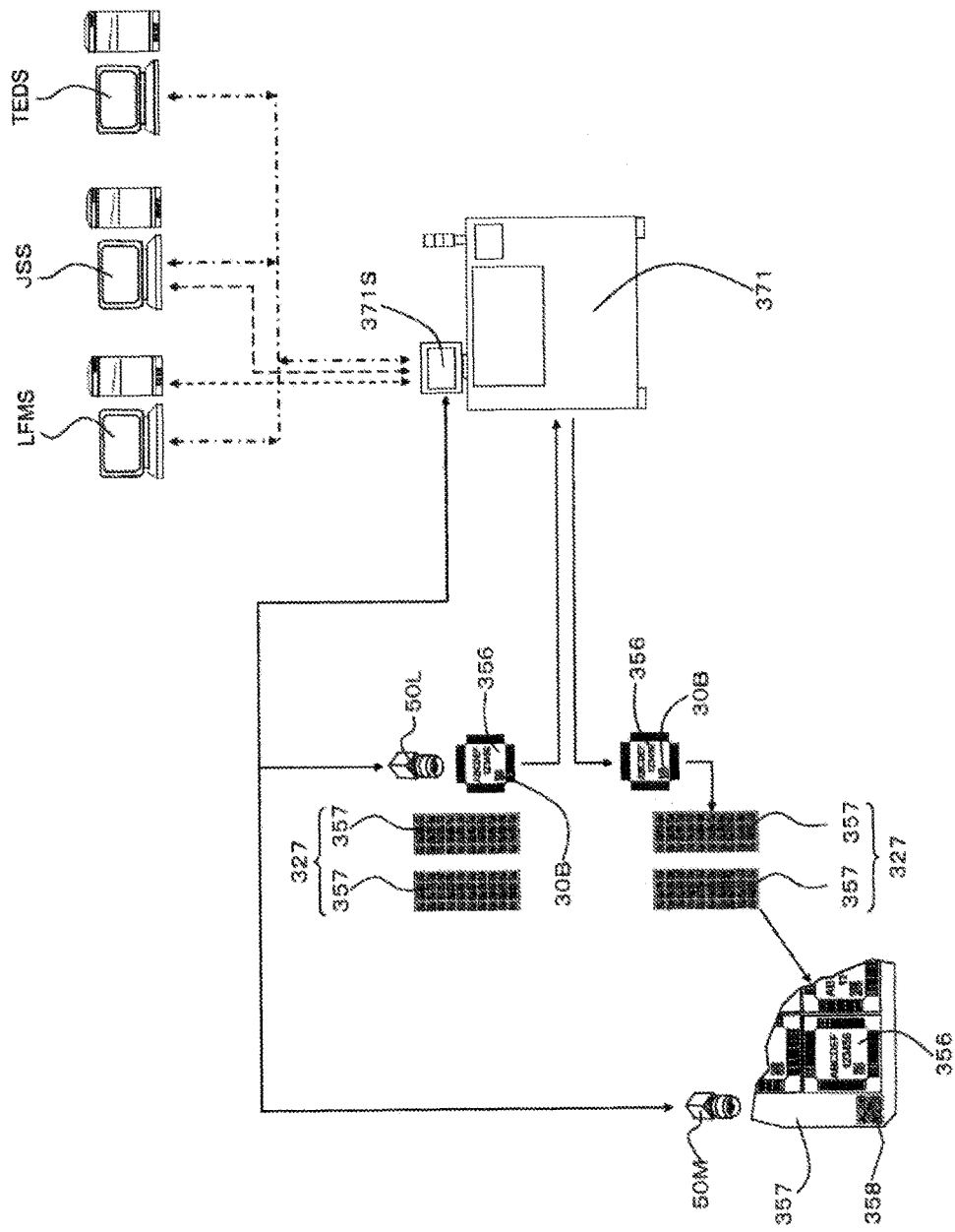
FIG. 51 is a conceptual diagram of a testing process.
Figure 52:
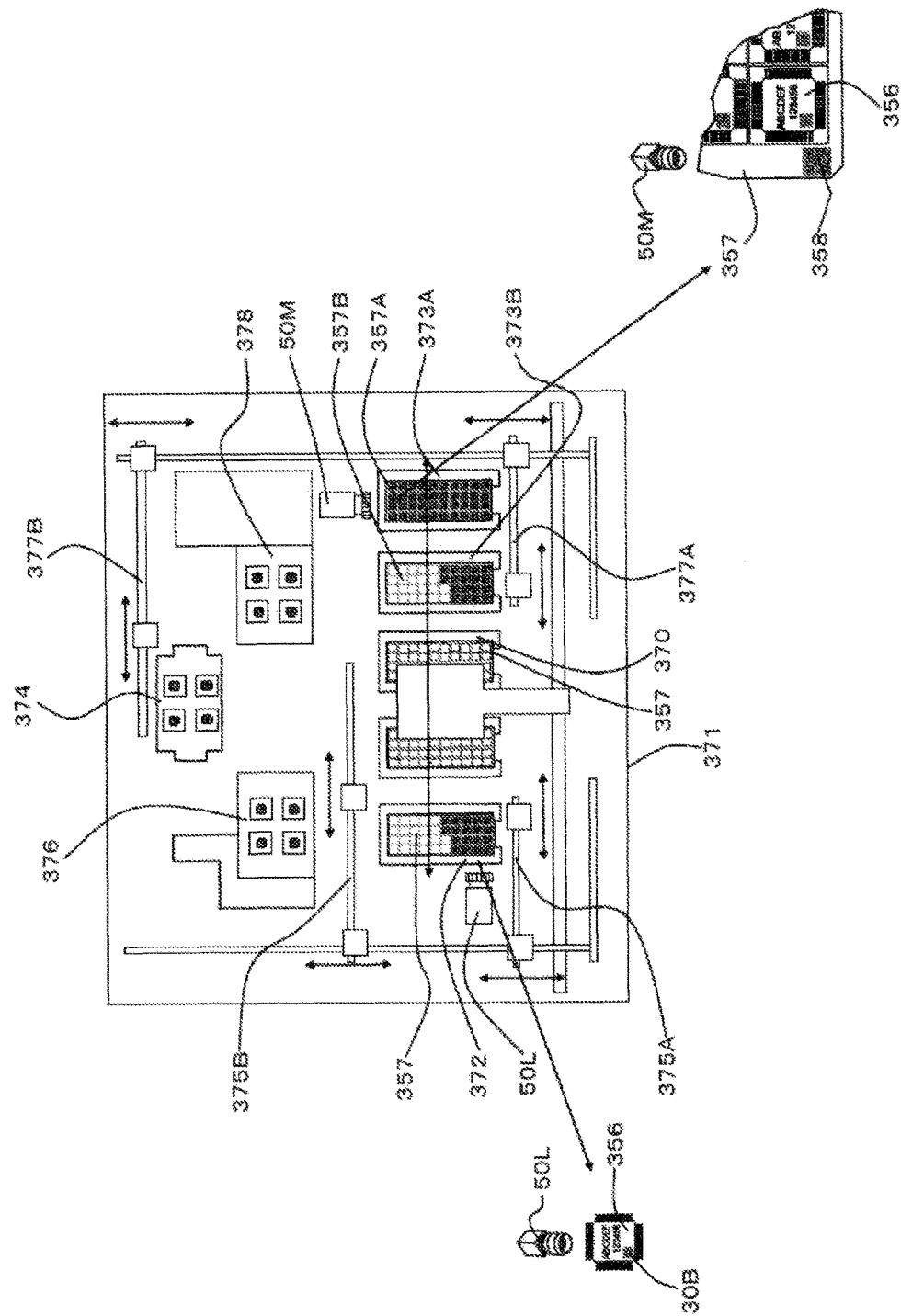
FIG. 52 is the conceptual diagram of the testing process following FIG. 51.

FIG. 51 and FIG. 52 are the conceptual diagrams of the testing process. In a loader unit 372 of a test apparatus 371, there are installed a plurality of semiconductor devices (QFP) 356 stored in the tray 357 and an ID reader 50L coupled to a server (management server 371S) managing the test apparatus 371. Moreover, in unloader units 373A and 373B, there are installed a plurality of empty trays 357A and 357B for storing the semiconductor device (QFP) 356 measured by a measurement unit 374 and an ID reader 50M coupled to the management server 371S.

Note that, the unloader unit 373 includes a nondefective product unloader unit 373A by which the non-defective semiconductor device (QFP) 356 is transported and a defective product unloader unit 373B by which the defective semiconductor device (QFP) 356 is transported. Then, a nondefective product tray 357A is prepared in the nondefective product unloader unit 373A and a defective product tray 357B is prepared in the defective product unloader unit 373B.

First, in the test apparatus 371, a test pattern, a test program, test temperature, and the like (hereinafter, referred to test conditions) based on the manufacturing condition and test condition specified for each product type name are set.

Next, the two-dimensional code 358 of each of the tray 357A and the tray 357B installed in the unloader units 354A and 354B is read by the ID reader 50K, and the tray ID and the number of stored semiconductor devices (QFP) 356 are stored into the management server 371S.

Next, as shown in FIG. 51 and FIG. 52, the two-dimensional code 30B marked to the sealing body 10 of the semiconductor device (QFP) 356 stored in the tray 357 installed in the loader unit 372 is read by the ID reader 50L, and the chip ID and the assembly lot ID of the semiconductor device (QFP) 356 are identified and stored into the management server 371S.

Next, the management server 371S obtains the LF information LFI related to the chip ID and the assembly lot ID from the LF map data server LFMS and furthermore obtains the test condition related to the chip ID and the assembly lot ID from a test data server TEDS.

Next, the management server 371S reads the master data of the manufacturing condition corresponding to an input product type name from the performance collecting server JSS, and checks the same with the manually set manufacturing condition and test condition. Then, if the both conditions can be verified to match (the manufacturing condition is OK, the test condition is OK), the semiconductor device (QFP) 356 is supplied to the measurement unit 374. On the other hand, if the set manufacturing condition or test condition differs from the master data (the manufacturing condition is NG or the test condition is NG), an alarm is generated and the test apparatus 371 is forcibly stopped.

Note that, regardless of the manufacturing condition (OK or NG), the check result of the manufacturing condition by the management server 371S is associated with the LF information LFI, the assembly lot, the product type name, and the chip ID, and is transferred to the performance collecting server JSS. Moreover, regardless of the test condition (OK or NG), the check result of the test condition is associated with the LF information LFI, the assembly lot, the product type name, and the chip ID, and is transferred to the test data server TEDS.

Next, a plurality of semiconductor devices (QFP) 356, as shown in FIG. 51 and FIG. 52, is transported from the tray 357 installed in the loader unit 372 to a loader shuttle 376 by a first loader robot 375A. Note that, the loader shuttle 376 has, for example, a function of applying high temperature to the semiconductor devices (QFP) 356 during a high temperature test.

Subsequently, the semiconductor devices (QFP) 356 are transported from the loader shuttle 376 to the measurement unit 374 and set there by a second loader robot 375B, and then according to the set test condition, an electrical characteristic inspection, such as a DC test and an AC test, of the semiconductor device (QFP) 356 is carried out.

Note that, the DC test is for confirming the static characteristic of the semiconductor chip 1 and mainly for guaranteeing the voltage/current characteristic of an input/output buffer. In contrast, the AC test is for confirming the dynamic characteristic of the semiconductor chip 1 and mainly for guaranteeing a function incorporated into an integrated circuit of the semiconductor chip 1. Hereinafter, the results of these tests are collectively referred to as characteristic inspection information TKJ.

Subsequently, the semiconductor device (QFP) 356 is transported to an unloader shuttle unit 378 by a second unloader robot 377B, and then is stored into the tray 357 of the unloader unit 373 from the unloader shuttle unit 378 by a first unloader robot 377A. Note that, the semiconductor device (QFP) 356 is stored into the nondefective product tray 357A of the nondefective product unloader unit 373A if the result of the characteristic inspection in the measurement unit 374 is determined to be nondefective. On the other hand, if the result is determined to be defective, the semiconductor device (QFP) 356 is stored into the defective product tray 357B of a defective product unloader unit 373B.

Next, the management server 371S associates the tray ID with the LF information LFI on the stored semiconductor device (QFP) 356 and transfers the result to the LF map data server LFMS. Moreover, the management server 371S associates the characteristic inspection information TKJ on the semiconductor device (QFP) 356 with the LF information LFI, the assembly lot, the product type name, and the chip ID and transfers the result to the test data server TEDS.

Subsequently, once a predetermined number of semiconductor devices (QFP) 356, the predetermined number being set in advance in the management server 371S, are stored into the nondefective product tray 357A, an empty nondefective product tray 357A prepared in the supplying tray loader unit 370 is automatically set to the nondefective product tray unloader unit 373A, and the semiconductor device (QFP) 356 is stored into this new tray 357A set to the nondefective product unloader unit 373A.

Subsequently, the management server 371S transfers the LF information LFI (the tray ID, the tray map ID, the assembly lot ID, the product type name, the LF number, the substrate ID, the LF map ID, the chip ID, a test nondefective product/defective product ID, a test apparatus ID) to the LF map data server LFMS. Moreover, the process performance information KJJ (the manufacturing condition, the tested date and time, the processed quantity, the number of defective products, the number of nondefective products, the operator identification ID) is associated with the LF information LFI, and is transferred to the performance collecting server JSS, and the characteristic inspection information TKJ (the DC test result, the AC test result) is transferred to the test data server TEDS.

<Final Visual Inspection Process>

In the final visual inspection process, the visual inspection of the QFP is carried out by image recognition with a non-illustrated final visual inspection apparatus 379 to check whether or not there is missing portion, deformation, or the like of the lead 5 (outer lead).

Figure 53:
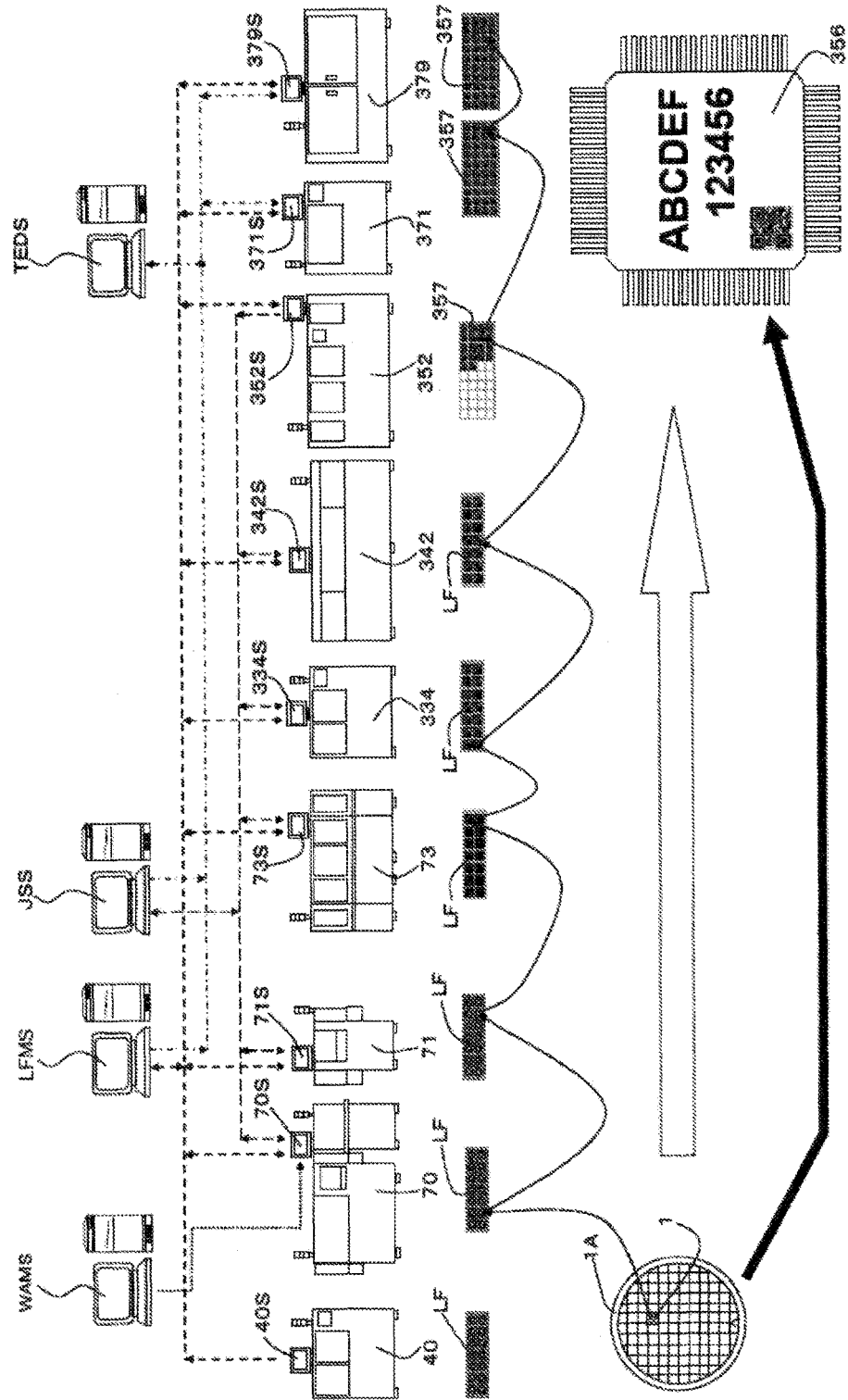
FIG. 53 is a view illustrating an effect of a Second Embodiment.

According to the present Second Embodiment, as shown in FIG. 53, in the manufacturing process (the wafer process and the assembly and testing process) of a semiconductor device, the chip ID is stored into the wafer map data server WAMS, and the LF information LFI is stored into the LF map data server LFMS. Moreover, the process performance information KJJ is stored into the performance collecting server JSS, and the characteristic inspection information TKJ is stored into the test data server TEDS. Then, the wafer process information regarding the individual semiconductor chip 1, the manufacturing history of the assembly and testing process of the semiconductor chip 1, and the characteristic inspection result of the semiconductor device 1 are associated with each other on a one-for-one basis between the semiconductor chip 1 and the semiconductor device (QFP) 356. This enables the chip traceability management in the manufacturing process of a semiconductor device.

Moreover, according to the present Second Embodiment, by analyzing the information of the LF map data server LFMS and the test data server TEDS each including the chip ID information, the individual characteristic and manufacturing history of the semiconductor chip 1 can be obtained (traced). Thus, when a defect occurs, the manufacturing history on a one-to-one basis between the semiconductor chip 1 and the semiconductor device (QFP) 356 can be analyzed, thus enabling the speeding up of the investigation of the cause of the defect and the comprehensive countermeasure.

Moreover, by identifying a semiconductor device having an excellent characteristic based on the characteristic inspection information TKJ stored in the test data server TEDS, and analyzing the manufacturing history and manufacturing condition of the semiconductor device from the process performance information KJJ stored in the performance collecting server JSS, the best manufacturing condition can be fed back to the manufacturing process. Moreover, in contrast, by analyzing the manufacturing history of a semiconductor device having a poor characteristic and feeding back the result to the manufacturing process, the possibility that a defect occurs can be reduced.

Figure 54:
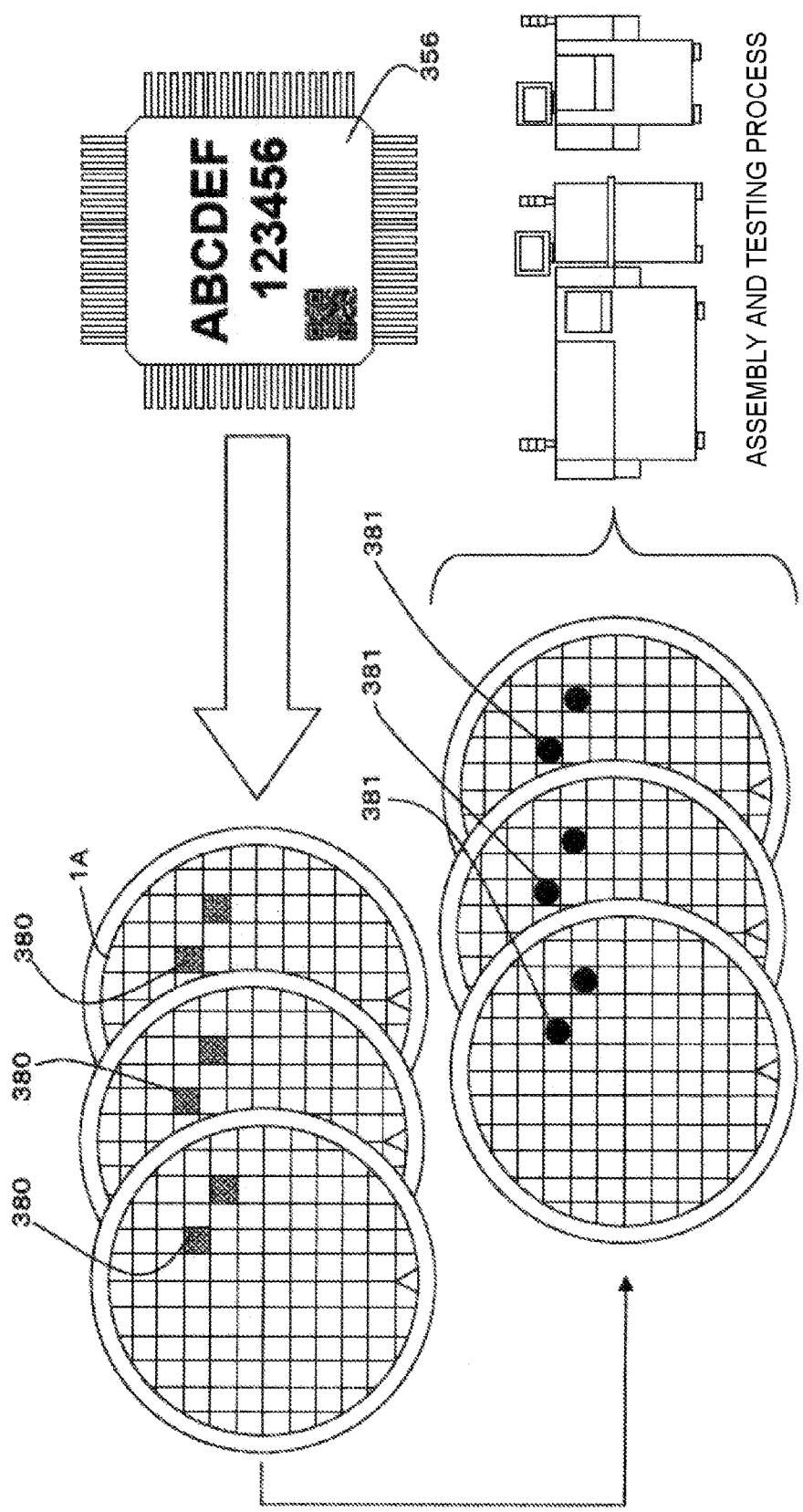
FIG. 54 is a view illustrating an effect of the Second Embodiment.

Furthermore, according to the study of the present inventors, as shown in FIG. 54, the results of the analysis on the semiconductor wafer number, the diffusion lot number (the number for identifying the diffusion process), and the positional information regarding the semiconductor chip 1 in the semiconductor wafer 1A that are the wafer process information regarding the semiconductor chip 1 and of the analysis on the characteristic inspection result of the testing process in the assembly and testing process reveal that any characteristic defect 380 concentrates on a specific portion of the semiconductor wafer 1A.

However, according to the present Second Embodiment, because the characteristic inspection result of the semiconductor device (QFP) 356 and the chip ID are associated with each other, the investigation of the cause of a characteristic defect in the wafer process and the extraction of a nondefective product condition can be easily carried out by feeding back the characteristic inspection result of the semiconductor chip 1 to the wafer manufacturing process. Furthermore, because the semiconductor wafer 1, in which any characteristic defect 380 may concentrate on the specific portion of the wafer, can be identified from the diffusion lot number of the semiconductor chip 1, in the assembly and testing process any characteristic defect 380 can be reliably subjected to the disposition treatment (defect treatment) as a wafer process characteristic defective product 381.

Note that, the method of manufacturing a semiconductor device of the present Second Embodiment is the same as that of the method of manufacturing a semiconductor device described in the First Embodiment except the above-described differences. Accordingly, although the duplicated description is omitted, the invention described in the First Embodiment except the above-described differences can be applicable.

Moreover, in the present Second Embodiment, the method has been described as a variation of the method of manufacturing a semiconductor device described in the First Embodiment, but the First Embodiment and the present Second Embodiment may be applied in combination.

In the foregoing, the present invention made by the present inventors have been described specifically based on the embodiments, but it is obvious that the present invention is not limited to the First Embodiment and the Second Embodiment, and for example like variations to be shown below various modifications may be made without departing from the scope thereof.

(Variation 1)

In the embodiments, an example applied to the manufacturing of a QFP has been described, but it is needless to say that the present invention can be applied to, for example, a QFN (Quad Flat Non-Leaded Package), a TSSOP (Thin Shrink Small Outline Package), and the like as other semiconductor devices (semiconductor package) using a lead frame as the substrate. Moreover, the present invention can be also applied to a BGA (Ball Grid Array), for example, as a semiconductor device (semiconductor package) using a substrate other than the lead frame.

Note that, in manufacturing a BGA, a wiring substrate is used as a chip mounting part (substrate). In the manufacturing process of the BGA, first, a semiconductor chip is mounted on a wiring substrate and subsequently an electrode pad of the wiring substrate and the semiconductor chip are electrically coupled with a conductive component, such a gold (Au) wire or a solder ball, and then the semiconductor chip is sealed with resin.

Next, marks, such as a product type name, a customer logo mark, and a production code, indicative of the product information regarding the BGA are marked on the surface of a resin sealing body sealing the semiconductor chip, and then a solder ball is coupled to the rear surface of the wiring substrate. Subsequently, through the testing processes, such as a burn-in test and an electrical characteristic test, and a final visual inspection process, the BGA becomes a finished product.

Therefore, in manufacturing the BGA, a different substrate ID is formed on the surface of each of a plurality of wiring substrates used in manufacturing the BGA and different identification information (rack ID) is formed also on the surface of each transport unit (an assembly rack, an assembly lot, a stacker, and the like) for storing the wiring-substrates used in each process described above. Then, the identification information of the transport unit and the identification information (substrate ID) of the wiring substrate stored in the transport unit are associated with each other, and in taking out the wiring substrate from the transport unit set to a loader unit of each apparatus and supplying the same to the processing unit, and in storing the wiring substrate, the processing of which is complete, into a transport unit of an unloader unit, the association between the identification information of the transport unit and the identification information of the wiring substrate is checked.

Thus, in each apparatus in the assembly and testing process, even when a plurality of wiring substrates stored in the previous transport unit and a plurality of wiring substrates stored in the next transport unit are consecutively supplied to the processing unit of the apparatus, a problem that a wiring substrate to be collected by a predetermined transport unit mixes into other transport unit can be prevented.

Moreover, even if a wiring substrate is mixed into other transport unit, this mixing can be promptly found in the loader unit of the apparatus in the next process, and therefore the association between a transport unit and a wiring substrate will not be lost. Thus, as with the embodiments, the product management and/or prompt defect analysis of the BGA can be carried out without reducing the throughput of the assembly and testing process processing.

(Variation 2)

Moreover, in the embodiments, in the die bonding process, a defective semiconductor chip will not be mounted on a substrate. However, for example, in the case of a semiconductor device (substrate product) having as the substrate a wiring substrate as described above, and in the case where a plurality of semiconductor chips is sealed with resin while being covered with one cavity, i.e., in the case of a semiconductor device (collective molding product) formed by the so-called collective molding method, the manufacturing may be carried out as follows.

That is, in the case where there is a defective device region in a wiring substrate, a defective semiconductor chip is mounted in this defective device region, so that a semiconductor chip is mounted on all the device regions of the wiring substrate. Thus, in sealing a plurality of device regions of the wiring substrate with resin, the fluidity of the resin can be stabilized.

(Variation 3)

Moreover, in the embodiments, as an example of the transport unit, to which identification information (identification code) is attached (formed), an assembly rack, an assembly lot, a stacker, and the like have been described as an example, but this identification information may be attached also to a tray or a board (burn-in board) used in carrying out the burn-in process as with the above-described substrate product, or to a tray (chip tray) used in transporting a semiconductor chip obtained from a semiconductor wafer. Thus, information indicating that at which location in a tray the work was carried out can be also managed.

(Variation 4)

Moreover, in the embodiments, an example in which a semiconductor chip is mounted in a chip mounting region of a substrate with a wire bonding method has been described, but the present invention can be applied also to a semiconductor device in which a semiconductor chip is mounted in a chip mounting region of a substrate with a flip chip method using a bump electrode as the conductive component. Moreover, a lead frame and a wiring substrate have been illustrated as the substrate on which a semiconductor chip is mounted, but the present invention can be applied also to the cases where a TAB tape or a flexible wiring board is used as the substrate.

(Variation 5)

Moreover, in the embodiments, a two-dimensional code is marked on the surface of a substrate (lead frame) or a rack using a marking apparatus utilizing a laser beam, but the two-dimensional code may be formed on the surface of a substrate or a rack, for example, by inking or painting or by applying a seal having a two-dimensional code printed thereon.

(Variation 6)

Moreover, if a rack (assembly rack), which is the transport unit, is formed by a material formed by metal (e.g., aluminum (Al)) and furthermore identification information (identification code) is attached (formed, marked) using a laser beam, a projection-like foreign matter (burr) formed by a part of the rack melted by irradiation of the laser beam tends to be formed in the formed identification information. The reason for this is that a fine dot (unevenness) is formed in the marked portion in marking by a laser beam.

For this reason, if the surface of a rack is cleaned with a texture (cleaning sheet) of cotton, cloth, or the like in reusing the rack or cleaning a soiled rack, the texture may get caught in this foreign matter and another foreign matter may occur. Accordingly, in the case where a metallic rack is used, an ion marking method of chemically reacting a metal ion by electrolysis and changing the color to black is preferably employed rather than a laser marking method of radiating a laser beam to thereby melt (burn, separate, oxidize or scrape) the surface of a working object. Note that, the ion marking apparatus to use, an apparatus that marks by electrically connecting the metal of an object to print using an electrolytic solution and thereby causing a chemical change on the surface, is common.

(Variation 7)

Moreover, as described above, in the case where a rack made of aluminum is used and also a camera is employed as the ID readers 50A to 50G such as a camera and furthermore identification information (identification code) is read while being irradiated with light, the radiated light tends to diffusely reflect and as a result the identification information may not be read.

In detail, the reading of the two-dimensional code is carried out by the radiated light being reflected by an unevenness of the two-dimensional code and this reflected light being detected by a reader. The reflection of light includes diffuse reflection and mirror reflection. The diffuse reflection implies that incident light is reflected in all directions by a reflective surface, while the mirror reflection implies that the reflected light is totally reflected at an angle equal to the incident angle. Then, a two-dimensional code is read utilizing a difference between the diffuse reflection in the marked two-dimensional code and the total reflection in the other metallic surface.

However, the rack is formed by metal (e.g., aluminum) that tends to reflect light, and therefore on the surface of the two-dimensional code, particularly when the irradiation light is strong, as in a laser scanner, strong reflected light may return to the ID reader and saturate a photodetector and in this case the read rate will significantly decrease.

Then, in the case where the unit as described above is employed, as shown in FIG. 34 and FIG. 35, identification information is preferably read through an optically transparent film 304 (from one side, the other side opposite thereto is visible). Note that, the film 304 is formed by a resin material capable of reducing the transmittance of light to around 40% to 60%, for example.

(Variation 8)

Moreover, in the embodiments, a rack is illustrated as the transport container for storing the substrate, such as a lead frame, but the present invention can be applied also to the case where a tray or the like is used as the transport container for storing a plurality of substrates. Furthermore, identification information (ID) is attached not only to the transport container for storing a substrate but to a jig for fixing the substrate, a working apparatus, and the like, respectively, and these pieces of identification information (IDs) are associated with the identification information (ID) of the substrate whereby product management and defect analysis can be also carried out.

(Variation 9)

Moreover, in the embodiments, the embodiments have been described in which various management tables are prepared on the main server side, and for each manufacturing process of each manufacturing apparatus, the processing condition is fully inquired about of the main server via a management server and the processing result is registered with the management server. Other than this, for example, for the contents of the various management tables, only those related to the immediate production of an individual manufacturing apparatus are downloaded in advance on the side of a management server managing the manufacturing apparatus, and at the time when certain working processes are completed, the contents may be registered with the main server. If such a configuration is employed, the communication load between the main server and the management server can be lightened and the manufacturing apparatus can be autonomously controlled.

(Variation 10)

Figure 55A:
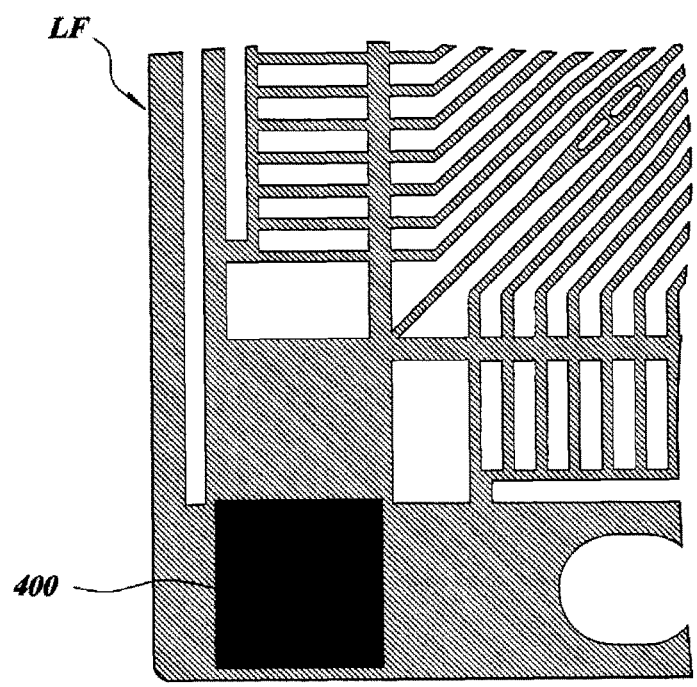
FIGS. 55A and 55B are partial enlarged plan views of a lead frame showing a two-dimensional code marking method that is a variation of the one used in FIG. 5.
Figure 55B:
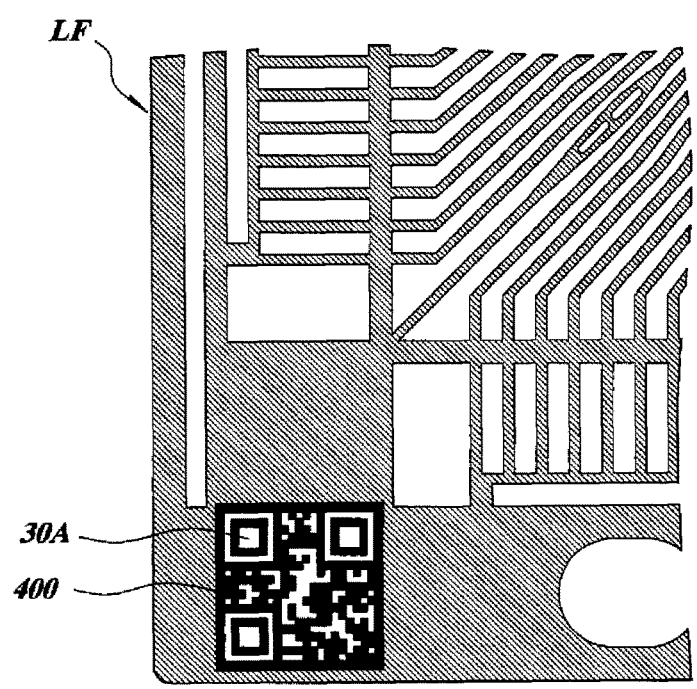

Furthermore, in the ID marking process in the embodiments, as shown in FIG. 5, an example has been described in which the substrate ID (two-dimensional code 30A) is formed (marked) by radiating a laser beam on the surface of the substrate (lead frame LF). Other than this, for example, as shown in FIG. 55A, the laser beam may be radiated on the surface of the substrate (lead frame LF) at a certain power (a first power) to form a decomposition region 400, and next, as shown in FIG. 55B, a laser beam of a power (a second power) higher than the power of the laser beam used in forming the decomposition region 400 may be radiated to the inside of the decomposition region 400, thereby forming (marking) the substrate ID (two-dimensional code 30A).

Thus, the color of the periphery (the region where the decomposition region 400 is formed) of the substrate ID (two-dimensional code 30A) can be made a color (e.g., black) different from the color (brown) of the substrate (lead frame LF), and therefore the contrast ratio of the substrate and the substrate ID (two-dimensional code 30A) can be increased. As a result, as compared with the case where the decomposition region 400 is not formed (see FIG. 5), the visibility (reading accuracy) of the substrate ID (two-dimensional code 30A) can be improved.

What is claimed is:
1. A method of manufacturing a semiconductor device comprising the steps of:
  (a) providing a plurality of substrates each including a plurality of chip mounting portions and external terminal forming portions;

(b) in each of the substrates, mounting a semiconductor chip on each of the chip mounting portions;

(c) after the step (b), in each of the substrates, electrically coupling a bonding pad of the semiconductor chip and the external terminal forming portion with a conductive component;

(d) after the step (c), in each of the substrates, sealing the semiconductor chip and the conductive component with a resin sealing body;

(e) after the step (d), in each of the substrates, forming a mark including product information on a surface of the resin sealing body;

(f) after the step (e), in each of the substrates, forming a plated layer on a surface of the external terminal forming portion exposed to an outside of the resin sealing body;

(g) after the step (f), in each of the substrates, singulating the substrate into a plurality of semiconductor devices by cutting the resin sealing body and the external terminal forming portion;

(h) after the step (g), in each of the semiconductor devices, carrying out a testing for screening a characteristic defect of the semiconductor chip sealed with the resin sealing body;

(i) after the step (h), in each of the semiconductor devices, carrying out a visual inspection for screening a visual defect; and (j) among the semiconductor devices, shipping the semiconductor device determined to be nondefective in the step (i), wherein unique identification information is attached to each of the substrate, the chip mounting portion of the substrate, the semiconductor chip, and a rack for storing and transporting the substrate, wherein in each of the step (b) and the subsequent steps, a manufacturing history of each of the steps and the identification information are associated with each other via a server, thereby process control of the semiconductor devices is performed, and wherein the process control is performed in a unit of rack up to the step (c), while on and after the step (d), the process control is performed in a unit of lot.

2. The method of manufacturing a semiconductor device according to claim 1, wherein the identification information attached to the semiconductor chip includes a semiconductor wafer number, a diffusion lot number, positional information regarding the semiconductor chip in a semiconductor wafer, and nondefective product/defective product information regarding the semiconductor chip that are wafer process information regarding the semiconductor chip.

3. The method of manufacturing a semiconductor device according to claim 1, wherein a same diffusion lot number is attached to a plurality of the semiconductor chips manufactured in a same diffusion process, the diffusion lot number and identification information of the rack are associated with each other, and thereby process control of the semiconductor devices is performed.

4. The method of manufacturing a semiconductor device according to claim 1, wherein each piece of the identification information is formed in a form of a two-dimensional code.

5. The method of manufacturing a semiconductor device according to claim 4, wherein the two-dimensional codes are marked by a laser beam, respectively.

* * * * *